(12) United States Patent
Shimomura et al.

(10) Patent No.: US 9,806,200 B2
(45) Date of Patent: Oct. 31, 2017

(54) SEMICONDUCTOR DEVICE

(71) Applicant: Semiconductor Energy Laboratory Co., Ltd., Atsugi-shi, Kanagawa-ken (JP)

(72) Inventors: Akihisa Shimomura, Atsugi (JP); Tetsuhiro Tanaka, Kiyose (JP); Masayuki Kimura, Atsugi (JP); Ryo Tokumaru, Isehara (JP); Daisuke Matsubayashi, Ebina (JP); Yasumasa Yamane, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 36 days.

(21) Appl. No.: 15/077,029

(22) Filed: Mar. 22, 2016

(65) Prior Publication Data
US 2016/0284856 A1 Sep. 29, 2016

(30) Foreign Application Priority Data
Mar. 27, 2015 (JP) ................. 2015-067235

(51) Int. Cl.
*H01L 29/786* (2006.01)
*H01L 29/772* (2006.01)
(Continued)

(52) U.S. Cl.
CPC ........ *H01L 29/7869* (2013.01); *G02F 1/1368* (2013.01); *H01L 27/1225* (2013.01);
(Continued)

(58) Field of Classification Search
CPC ........ H01L 27/3262; H01L 27/1222–27/1233; H01L 29/7869; H01L 29/24; H01L 29/78603
See application file for complete search history.

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

US 9,263,514, 02/2016, Tanaka et al. (withdrawn)
(Continued)

*Primary Examiner* — Mariceli Santiago
(74) *Attorney, Agent, or Firm* — Robinson Intellectual Property Law Office; Eric J. Robinson

(57) ABSTRACT

A semiconductor device including a miniaturized transistor is provided. The semiconductor device includes a first insulator, a second insulator, a semiconductor, and a conductor. The semiconductor is over the first insulator. The second insulator is over the semiconductor. The conductor is over the second insulator. The semiconductor includes a first region, a second region, and a third region. The first region is a region where the semiconductor overlaps with the conductor. Each of the second region and the third region is a region where the semiconductor does not overlap with the conductor. The second region and the third region each have a region with a spinel crystal structure.

29 Claims, 51 Drawing Sheets

(51) Int. Cl.
  *H01L 29/24* (2006.01)
  *H01L 27/32* (2006.01)
  *H01L 27/12* (2006.01)
  *G02F 1/1368* (2006.01)

(52) U.S. Cl.
  CPC .......... *H01L 27/3262* (2013.01); *H01L 29/24* (2013.01); *H01L 29/78603* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,421,083 B2 | 4/2013 | Yamazaki et al. |
| 8,546,182 B2 | 10/2013 | Akimoto et al. |
| 8,552,434 B2 | 10/2013 | Akimoto et al. |
| 8,629,434 B2 | 1/2014 | Arai |
| 8,633,492 B2 | 1/2014 | Akimoto et al. |
| 8,686,425 B2 | 4/2014 | Yamazaki et al. |
| 8,723,176 B2 | 5/2014 | Yamazaki |
| 8,748,886 B2 | 6/2014 | Yamazaki et al. |
| 8,759,167 B2 | 6/2014 | Akimoto et al. |
| 8,785,928 B2 | 7/2014 | Yamazaki et al. |
| 8,796,683 B2 | 8/2014 | Yamazaki |
| 8,890,159 B2 | 11/2014 | Yamazaki et al. |
| 8,901,557 B2 | 12/2014 | Yamazaki |
| 8,921,853 B2 | 12/2014 | Yamazaki |
| 8,937,306 B2 | 1/2015 | Yamazaki et al. |
| 8,946,702 B2 | 2/2015 | Yamazaki et al. |
| 8,946,704 B2 | 2/2015 | Yamazaki |
| 8,952,377 B2 | 2/2015 | Yamazaki et al. |
| 8,952,381 B2 | 2/2015 | Yamazaki |
| 8,963,148 B2 | 2/2015 | Matsubayashi et al. |
| 8,981,372 B2 | 3/2015 | Yamazaki |
| 8,987,731 B2 | 3/2015 | Yamazaki |
| 9,018,624 B2 | 4/2015 | Yamazaki |
| 9,054,134 B2 | 6/2015 | Yamazaki et al. |
| 9,059,219 B2 | 6/2015 | Sasagawa et al. |
| 9,064,966 B2 | 6/2015 | Yamazaki et al. |
| 9,082,863 B2 | 7/2015 | Yamazaki |
| 9,112,043 B2 | 8/2015 | Arai |
| 9,123,573 B2 | 9/2015 | Yamazaki et al. |
| 9,130,047 B2 | 9/2015 | Sakakura et al. |
| 9,153,436 B2 | 10/2015 | Yamazaki et al. |
| 9,153,649 B2 | 10/2015 | Sasaki et al. |
| 9,153,699 B2 | 10/2015 | Yamazaki |
| 9,166,021 B2 | 10/2015 | Tezuka et al. |
| 9,166,060 B2 | 10/2015 | Yamazaki et al. |
| 9,166,061 B2 | 10/2015 | Yamazaki |
| 9,184,245 B2 | 11/2015 | Yamazaki |
| 9,190,525 B2 | 11/2015 | Yamazaki |
| 9,190,527 B2 | 11/2015 | Tezuka et al. |
| 9,196,745 B2 | 11/2015 | Yamazaki |
| 9,209,256 B2 | 12/2015 | Tokunaga et al. |
| 9,209,307 B2 | 12/2015 | Yamazaki et al. |
| 9,214,474 B2 | 12/2015 | Yamazaki |
| 9,214,566 B2 | 12/2015 | Yamazaki |
| 9,219,161 B2 | 12/2015 | Yamazaki |
| 9,224,758 B2 | 12/2015 | Yamazaki et al. |
| 9,231,111 B2 | 1/2016 | Yamazaki et al. |
| 9,240,492 B2 | 1/2016 | Yamazaki |
| 9,245,958 B2 | 1/2016 | Yamazaki |
| 9,246,011 B2 | 1/2016 | Yamazaki et al. |
| 9,252,283 B2 | 2/2016 | Matsubayashi et al. |
| 9,252,287 B2 | 2/2016 | Yamazaki |
| 9,257,569 B2 | 2/2016 | Yamazaki et al. |
| 9,269,821 B2 | 2/2016 | Yamazaki |
| 9,281,408 B2 | 3/2016 | Yamazaki et al. |
| 9,281,409 B2 | 3/2016 | Yamazaki et al. |
| 9,281,412 B2 | 3/2016 | Takemura |
| 9,287,117 B2 | 3/2016 | Yamazaki et al. |
| 9,287,410 B2 | 3/2016 | Sasagawa et al. |
| 9,287,411 B2 | 3/2016 | Koezuka et al. |
| 9,293,541 B2 | 3/2016 | Yamazaki et al. |
| 9,293,592 B2 | 3/2016 | Yamazaki |
| 9,293,602 B2 | 3/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |

(56) References Cited

U.S. PATENT DOCUMENTS

| | | |
|---|---|---|
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0006299 A1* | 1/2011 | Abe ............... H01L 21/02565 257/43 |
| 2011/0062436 A1 | 3/2011 | Yamazaki et al. |
| 2012/0193620 A1 | 8/2012 | Godo et al. |
| 2012/0256179 A1 | 10/2012 | Yamazaki et al. |
| 2013/0161611 A1 | 6/2013 | Yamazaki et al. |
| 2013/0294481 A1 | 11/2013 | Koyama et al. |
| 2013/0320334 A1 | 12/2013 | Yamazaki et al. |
| 2014/0014947 A1 | 1/2014 | Yamazaki |
| 2014/0022479 A1 | 1/2014 | Hosaka et al. |
| 2014/0027762 A1 | 1/2014 | Tsurume et al. |
| 2014/0030846 A1 | 1/2014 | Akimoto et al. |
| 2014/0042434 A1 | 2/2014 | Yamazaki |
| 2014/0077205 A1 | 3/2014 | Yamazaki et al. |
| 2014/0091301 A1 | 4/2014 | Yamazaki |
| 2014/0099752 A1 | 4/2014 | Yamazaki et al. |
| 2014/0103346 A1 | 4/2014 | Yamazaki |
| 2014/0103960 A1 | 4/2014 | Yamazaki et al. |
| 2014/0108836 A1 | 4/2014 | Nishijima et al. |
| 2014/0110703 A1 | 4/2014 | Yamazaki |
| 2014/0110705 A1 | 4/2014 | Koezuka et al. |
| 2014/0110708 A1 | 4/2014 | Koezuka et al. |
| 2014/0113405 A1 | 4/2014 | Tsubuku et al. |
| 2014/0151688 A1 | 6/2014 | Yamazaki |
| 2014/0154837 A1 | 6/2014 | Yamazaki |
| 2014/0175435 A1 | 6/2014 | Yamazaki et al. |
| 2014/0197407 A1 | 7/2014 | Yamazaki |
| 2014/0203276 A1 | 7/2014 | Yamazaki et al. |
| 2014/0225105 A1 | 8/2014 | Tanaka et al. |
| 2014/0239293 A1 | 8/2014 | Yamazaki et al. |
| 2014/0239296 A1 | 8/2014 | Tokunaga et al. |
| 2014/0246673 A1 | 9/2014 | Akimoto et al. |
| 2014/0252345 A1 | 9/2014 | Tsubuku et al. |
| 2014/0264324 A1 | 9/2014 | Yamazaki |
| 2014/0291674 A1 | 10/2014 | Kurata et al. |
| 2014/0306217 A1 | 10/2014 | Yamazaki et al. |
| 2014/0306220 A1* | 10/2014 | Koezuka ........... H01L 29/66969 257/43 |
| 2014/0306221 A1 | 10/2014 | Yamazaki et al. |
| 2014/0319514 A1 | 10/2014 | Noda et al. |
| 2014/0319516 A1 | 10/2014 | Tanaka et al. |
| 2014/0332800 A1 | 11/2014 | Hanaoka |
| 2014/0339544 A1 | 11/2014 | Hanaoka et al. |
| 2014/0339548 A1 | 11/2014 | Yamazaki et al. |
| 2015/0001533 A1 | 1/2015 | Kuwabara et al. |
| 2015/0008428 A1 | 1/2015 | Yamamoto et al. |
| 2015/0011046 A1 | 1/2015 | Tanaka et al. |
| 2015/0024577 A1 | 1/2015 | Kato et al. |
| 2015/0028330 A1 | 1/2015 | Yamazaki et al. |
| 2015/0034949 A1 | 2/2015 | Yamazaki |
| 2015/0060848 A1 | 3/2015 | Sasagawa et al. |
| 2015/0069383 A1 | 3/2015 | Suzuki et al. |
| 2015/0069384 A1 | 3/2015 | Kobayashi et al. |
| 2015/0076493 A1 | 3/2015 | Kobayashi et al. |
| 2015/0076496 A1 | 3/2015 | Tanaka et al. |
| 2015/0079728 A1 | 3/2015 | Yamazaki |
| 2015/0079729 A1 | 3/2015 | Yamazaki |
| 2015/0097181 A1 | 4/2015 | Yamazaki |
| 2015/0108472 A1 | 4/2015 | Suzawa et al. |
| 2015/0109019 A1 | 4/2015 | Matsuda et al. |
| 2015/0115262 A1 | 4/2015 | Tokunaga et al. |
| 2015/0118790 A1 | 4/2015 | Yamazaki et al. |
| 2015/0123126 A1 | 5/2015 | Yamazaki et al. |
| 2015/0123127 A1 | 5/2015 | Yamazaki |
| 2015/0137120 A1 | 5/2015 | Yamazaki |
| 2015/0155363 A1 | 6/2015 | Nakazawa et al. |
| 2015/0171115 A1 | 6/2015 | Yamazaki et al. |
| 2015/0171116 A1 | 6/2015 | Okazaki et al. |
| 2015/0179803 A1 | 6/2015 | Yamazaki et al. |
| 2015/0187575 A1 | 7/2015 | Yamazaki et al. |
| 2015/0187814 A1 | 7/2015 | Miyairi et al. |
| 2015/0187824 A1 | 7/2015 | Yamazaki et al. |
| 2015/0187855 A1 | 7/2015 | Yamazaki et al. |
| 2015/0187949 A1 | 7/2015 | Yamazaki |
| 2015/0187951 A1 | 7/2015 | Endo et al. |
| 2015/0187952 A1 | 7/2015 | Yamazaki et al. |
| 2015/0194532 A1 | 7/2015 | Yamazaki |
| 2015/0200305 A1 | 7/2015 | Kobayashi et al. |
| 2015/0228676 A1 | 8/2015 | Yamazaki |
| 2015/0228799 A1 | 8/2015 | Koezuka et al. |
| 2015/0228803 A1 | 8/2015 | Koezuka et al. |
| 2015/0255310 A1 | 9/2015 | Yamazaki et al. |
| 2015/0287835 A1 | 10/2015 | Yamazaki |
| 2015/0294992 A1* | 10/2015 | Kato ............... H01L 29/7869 257/43 |
| 2015/0311347 A1 | 10/2015 | Yamazaki |
| 2015/0318359 A1* | 11/2015 | Shimomura ........ H01L 27/1225 257/43 |
| 2015/0325708 A1 | 11/2015 | Yakubo et al. |
| 2015/0333160 A1 | 11/2015 | Yamazaki et al. |
| 2015/0340505 A1 | 11/2015 | Yamazaki et al. |
| 2015/0348997 A1 | 12/2015 | Sasagawa et al. |
| 2015/0349127 A1 | 12/2015 | Kurata et al. |
| 2015/0349132 A1 | 12/2015 | Yamazaki |
| 2015/0349133 A1 | 12/2015 | Yamazaki et al. |
| 2015/0364610 A1 | 12/2015 | Tsubuku et al. |
| 2016/0005878 A1 | 1/2016 | Yamazaki |
| 2016/0013321 A1 | 1/2016 | Kobayashi et al. |
| 2016/0020329 A1 | 1/2016 | Koezuka et al. |
| 2016/0027923 A1 | 1/2016 | Yamazaki |
| 2016/0027924 A1 | 1/2016 | Sasaki et al. |
| 2016/0049521 A1 | 2/2016 | Tezuka et al. |
| 2016/0056272 A1 | 2/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 63-239117 | 10/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-086923 | 4/2011 |
| JP | 2012-256838 | 12/2012 |
| JP | 2013-250262 | 12/2013 |
| WO | WO-2004/114391 | 12/2004 |

OTHER PUBLICATIONS

Matsuda.S et al., "Reduction in Mobility Difference between C-Axis-Aligned Crystalline IGZO-FET and Si-FET by Miniaturization," SSDM 2014 (Extended Abstracts of the 2014 International

(56) References Cited

OTHER PUBLICATIONS

Conference on Solid State Devices and Materials), Sep. 8, 2014, pp. 138-139.
Kobayashi.Y et al., "Effect of Surrounded-Channel Structure on Electrical Characteristics of c-Axis Aligned Crystalline In—Ga—Zn—O Field-Effect Transistor," IEEE Electron Device Letters, Apr. 1, 2015, vol. 36, No. 4, pp. 309-311.
Yakubo.Y et al., "High-speed and Low-leakage Characteristics of 60-nm C-axis Aligned Crystalline Oxide Semiconductor FET with GHz-ordered Cutoff Frequency," SSDM 2014 (Extended Abstracts of the 2014 International Conference on Solid State Devices and Materials), Sep. 8, 2014, pp. 648-649.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or ZN] at Temperatures Over 1000° C.", Journal of Solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digeset of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m <4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters ) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics ) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters ) , Sep. 13, 2004, vol. 85, No. 11, pp. 1993-1995.

* cited by examiner

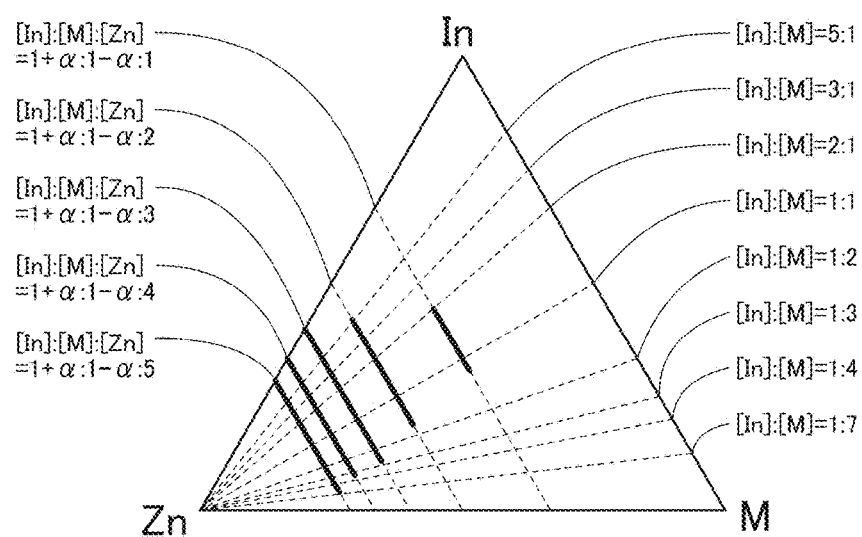

FIG. 24A1
FIG. 24A2
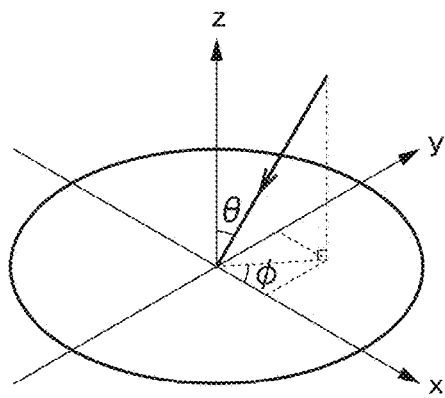
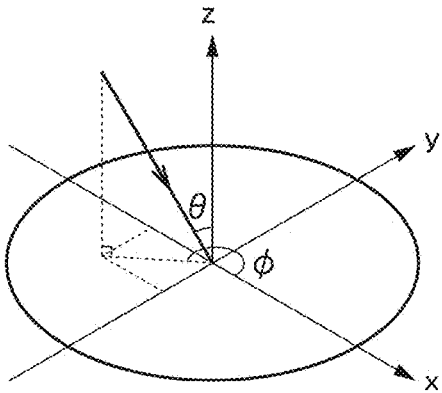
FIG. 24B
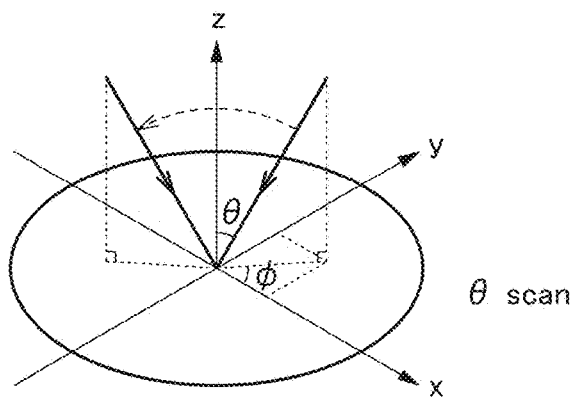
θ scan
FIG. 24C
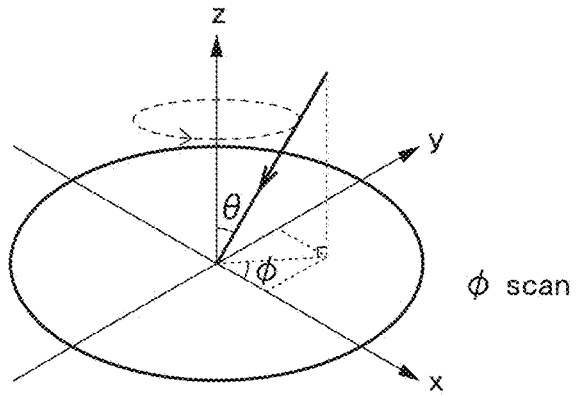
φ scan

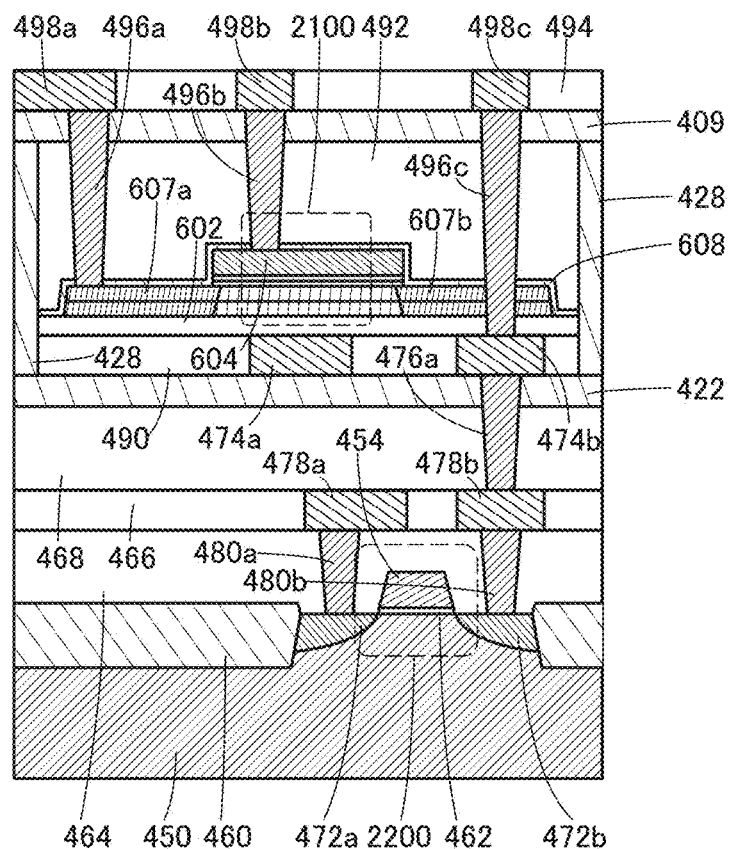
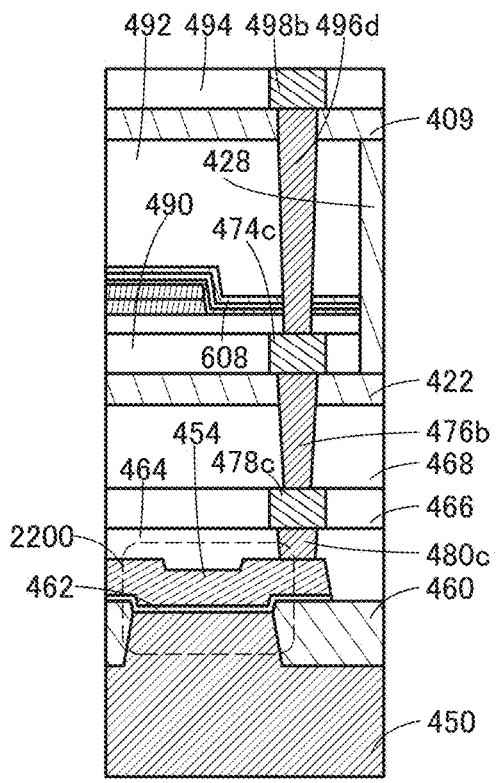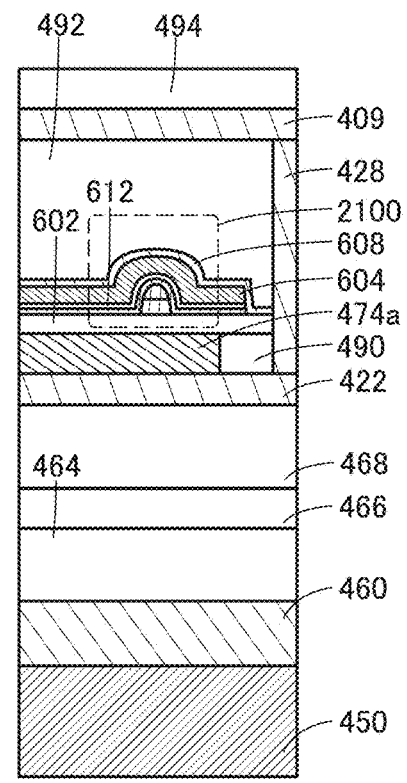
FIG. 26A
FIG. 26B
FIG. 26C

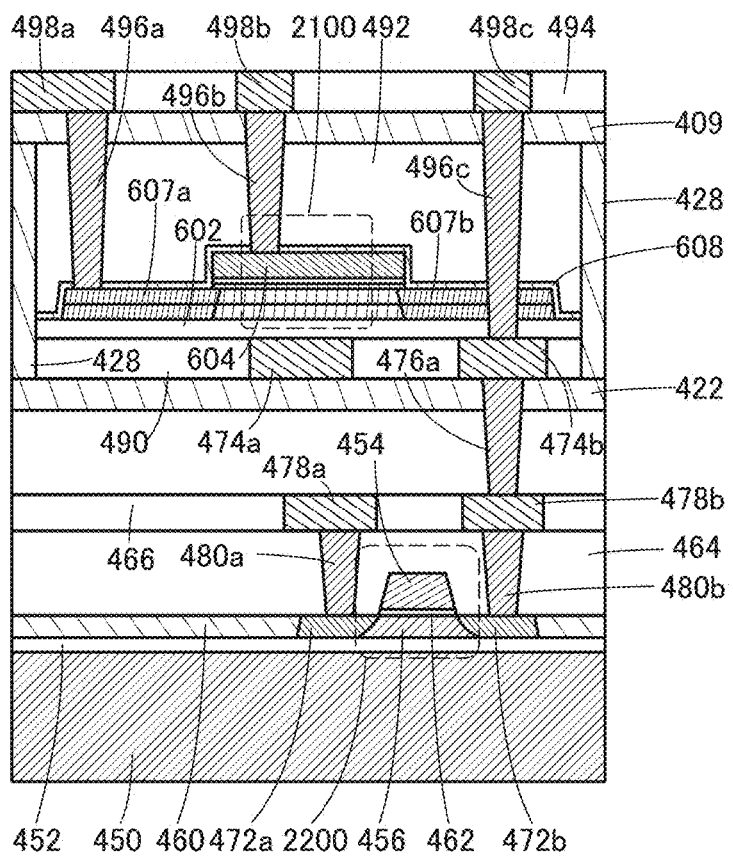
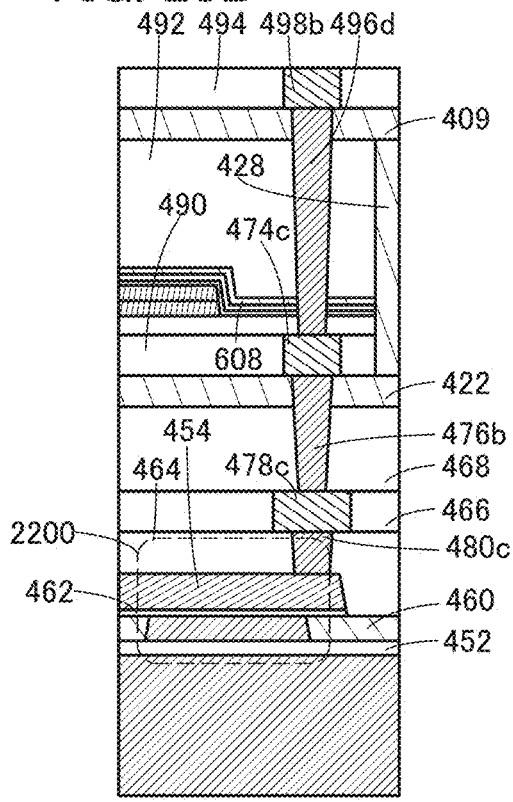
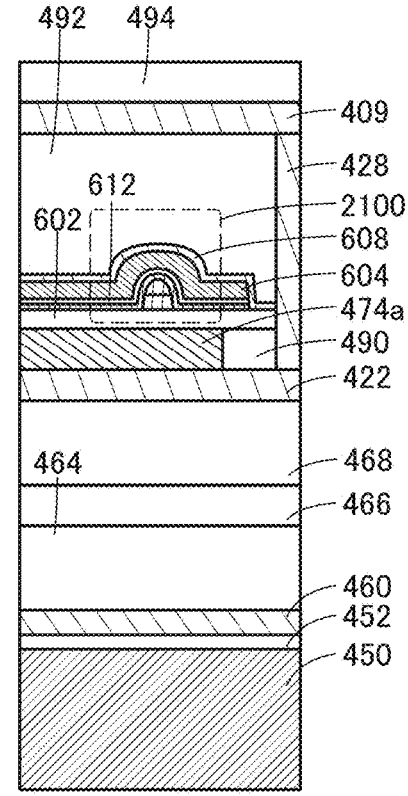
FIG. 28A
FIG. 28B
FIG. 28C

FIG. 38A1
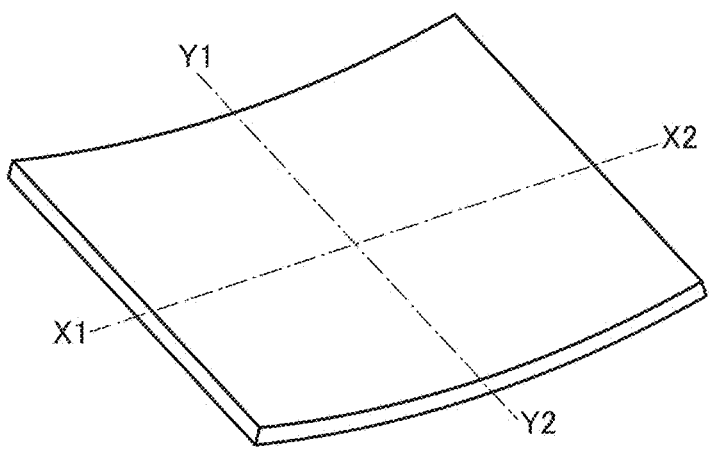
FIG. 38A2
FIG. 38A3
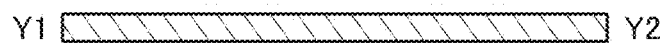
FIG. 38B1
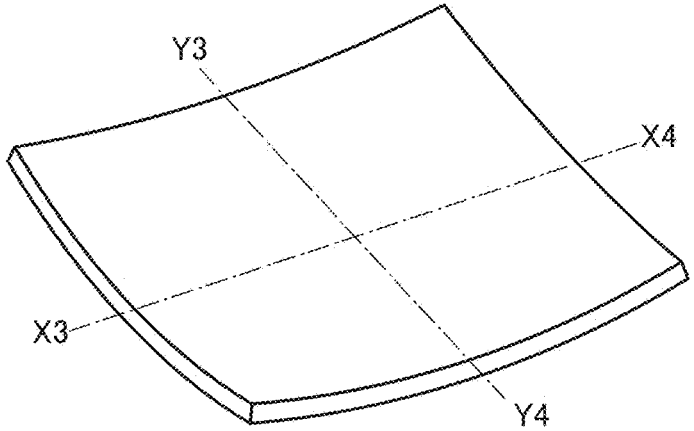
FIG. 38B2
FIG. 38B3
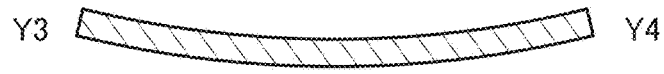

1521

1523

1522

1527

FIG. 46A1 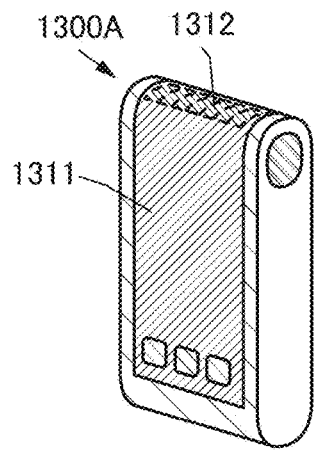
FIG. 46A2 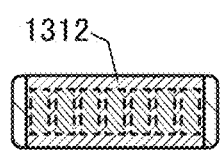
FIG. 46A3 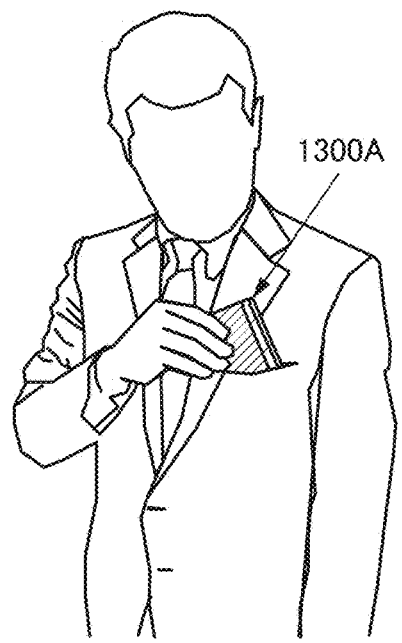
FIG. 46B1 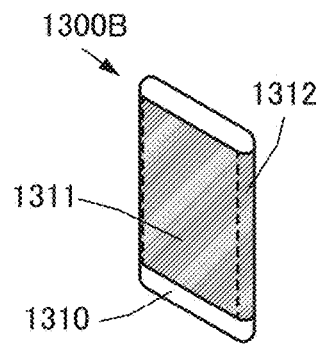
FIG. 46B2 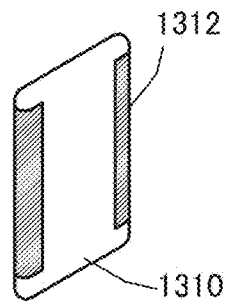
FIG. 46C1 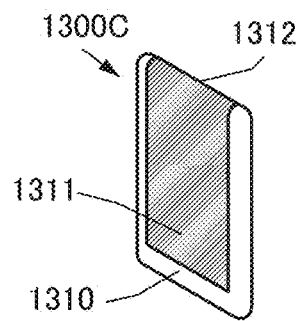
FIG. 46C2 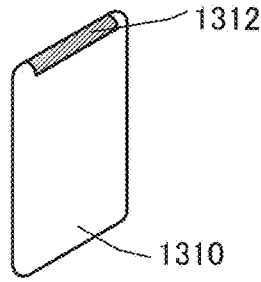

FIG. 48A
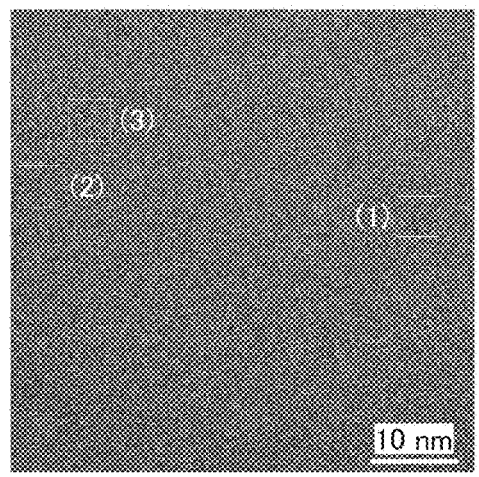
FIG. 48B  FIG. 48C  FIG. 48D
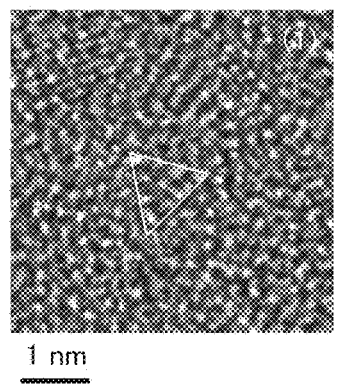 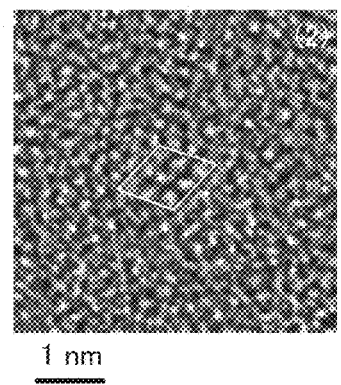 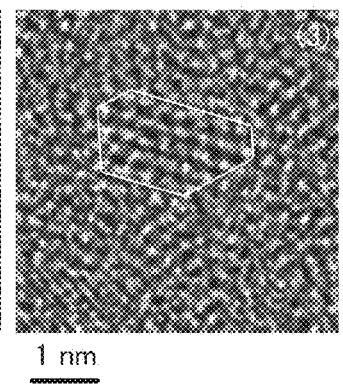

FIG. 49A out-of-plane method CAAC-OS
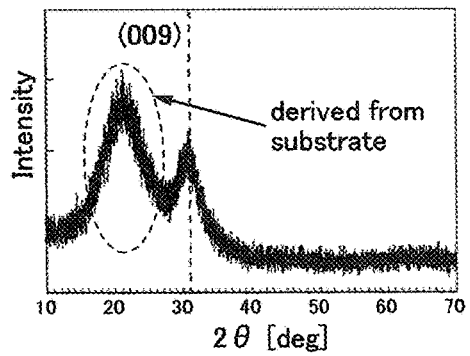
FIG. 49B
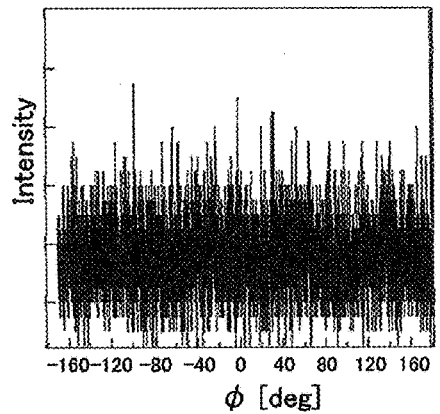
FIG. 49C
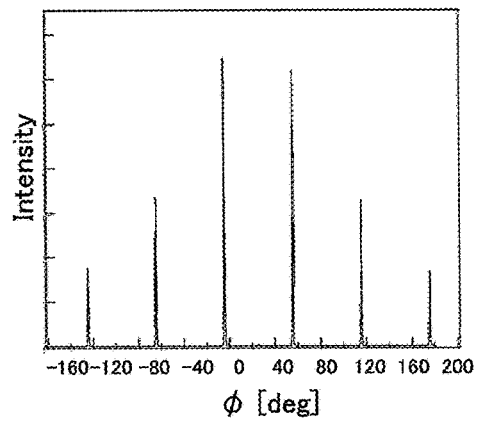

irradiation with electron beam from direction parallel to sample surface irradiation with electron beam from direction perpendicular to sample surface

SEMICONDUCTOR DEVICE

BACKGROUND OF THE INVENTION

1. Field of the Invention

One embodiment of the present invention relates to a semiconductor device and a manufacturing method thereof.

The present invention relates to, for example, a transistor, a semiconductor device, and manufacturing methods thereof. The present invention relates to, for example, a display device, a light-emitting device, a lighting device, a power storage device, a memory device, an imaging device, a processor, or an electronic device. The present invention relates to a method for manufacturing a display device, a liquid crystal display device, a light-emitting device, a memory device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an imaging device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where a driver circuit and a pixel circuit are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed.

Oxide semiconductors have been researched since early times. In 1988, it was disclosed to use a crystal In—Ga—Zn oxide for a semiconductor element (see Patent Document 1). In 1995, a transistor including an oxide semiconductor was invented, and its electrical characteristics were disclosed (see Patent Document 2).

In 2010, a transistor containing a crystalline In—Ga—Zn oxide that has more excellent electrical characteristics and higher reliability than a transistor containing an amorphous In—Ga—Zn oxide has been developed (see Patent Document 3). The crystalline In—Ga—Zn oxide has c-axis alignment and thus is called a c-axis aligned crystalline oxide semiconductor (CAAC-OS) or the like.

The transistor containing the CAAC-OS, since its discovery, has been reported to have excellent electrical characteristics. The transistor containing the CAAC-OS has characteristics superior to those of a transistor containing silicon in the following respects, for example.

It has been reported that the transistor containing the CAAC-OS is less likely to be affected by phonon scattering even with a short channel; thus, the field-effect mobility is less likely to be decreased (see Non-Patent Document 1). It has been also reported that a transistor containing the CAAC-OS and having a surrounded channel (s-channel) structure exhibits favorable switching characteristics even with a short channel (see Non-Patent Document 2). The transistor containing the CAAC-OS operates at high speed. For example, Non-Patent Document 3 reports a cutoff frequency of 20 GHz. Furthermore, it has been reported that the transistor containing the CAAC-OS has high breakdown voltage characteristics (see Patent Document 4) and has little variation in characteristics due to temperature (see Patent Document 5).

REFERENCE

Patent Documents

[Patent Document 1] Japanese Published Patent Application No. S63-239117
[Patent Document 2] Japanese translation of PCT international application No. H11-505377
[Patent Document 3] Japanese Published Patent Application No. 2011-086923
[Patent Document 4] Japanese Published Patent Application No. 2012-256838
[Patent Document 5] Japanese Published Patent Application No. 2013-250262

Non-Patent Documents

[Non-Patent Document 1] S. Matsuda et al., *Extended Abstracts International Conference on Solid State Devices and Materials,* 2014, pp. 138-139
[Non-Patent Document 2] Y. Kobayashi et al., *IEEE ELECTRON DEVICE LETTERS,* April 2015, Vol. 36, No. 4, pp. 309-311
[Non-Patent Document 3] Y. Yakubo et al., *Extended Abstracts International Conference on Solid State Devices and Materials,* 2014, pp. 648-649

SUMMARY OF THE INVENTION

An object is to provide a miniaturized transistor. Another object is to provide a transistor with favorable electrical characteristics. Another object is to provide a transistor with stable electrical characteristics. Another object is to provide a transistor with high frequency characteristics. Another object is to provide a transistor with low off-state current. Another object is to provide a semiconductor device including any of the transistors. Another object is to provide a module including the semiconductor device. Another object is to provide an electronic device including the semiconductor device or the module.

Note that the descriptions of these objects do not preclude the existence of other objects. In one embodiment of the present invention, there is no need to achieve all the objects.

Other objects will be apparent from and can be derived from the descriptions of the specification, the drawings, the claims, and the like.

(1) One embodiment of the present invention is a semiconductor device including a first insulator, a second insulator, a semiconductor, and a conductor. The semiconductor is over the first insulator. The second insulator is over the semiconductor. The conductor is over the second insulator. The semiconductor includes a first region, a second region, and a third region. The first region is a region where the semiconductor overlaps with the conductor. Each of the second region and the third region is a region where the semiconductor does not overlap with the conductor. The second region and the third region each have a region with a spinel crystal structure.

(2) One embodiment of the present invention is a semiconductor device including a first insulator, a second insulator, a protective film, a semiconductor, and a conductor. The semiconductor is over the first insulator. The second insulator is over the semiconductor. The conductor is over the second insulator. The protective film is in a region in contact with a side surface of the conductor. The semiconductor includes a first region, a second region, and a third region. The first region is a region where the semiconductor overlaps with at least one of the conductor and the protective film. Each of the second region and the third region is a region where the semiconductor does not overlap with the conductor. The second region and the third region each have a region with a spinel crystal structure.

(3) One embodiment of the present invention is the semiconductor device described in (1) or (2), in which the second region and the third region each have a region with higher conductivity than the first region.

(4) One embodiment of the present invention is the semiconductor device described in any one of (1) to (3), in which the second region and the third region each have a region with higher hydrogen concentration than the first region.

(5) One embodiment of the present invention is the semiconductor device described in any one of (1) to (4), in which the second region and the third region each have a region with higher concentration of helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, or tungsten than the first region.

(6) One embodiment of the present invention is the semiconductor device described in any one of (1) to (5), in which the region with the spinel crystal structure contains indium, an element M (aluminum, gallium, yttrium, or tin), and zinc.

(7) One embodiment of the present invention is the semiconductor device described in any one of (1) to (6), in which the first region has c-axis alignment.

(8) One embodiment of the present invention is the semiconductor device described in any one of (1) to (7), which further includes a third insulator and a fourth insulator. The third insulator is between the first insulator and the semiconductor. The fourth insulator is between the semiconductor and the second insulator. The third insulator and the fourth insulator each contain indium, an element M (aluminum, gallium, yttrium, or tin), and zinc.

(9) One embodiment of the present invention is the semiconductor device described in (8), in which the fourth insulator has a region in contact with a side surface of the semiconductor.

(10) One embodiment of the present invention is the semiconductor device described in any one of (1) to (9), in which an interface between the conductor and the second insulator has a region facing a side surface of the semiconductor.

A miniaturized transistor can be provided. A transistor with favorable electrical characteristics can be provided. A transistor with stable electrical characteristics can be provided. A transistor with high frequency characteristics can be provided. A transistor with low off-state current can be provided. A semiconductor device including any of the transistors can be provided. A module including the semiconductor device can be provided. An electronic device including the semiconductor device or the module can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

FIG. 23 is a ternary diagram for explaining composition of an In-M-Zn oxide.

FIGS. 24A1, 24A2, 24B, and 24C each illustrate ion incidence.

FIGS. 26A to 26C are cross-sectional views illustrating a semiconductor device of one embodiment of the present invention.

FIGS. 28A to 28C are cross-sectional views illustrating a semiconductor device of one embodiment of the present invention.

FIGS. 38A1, 38A2, 38A3, 38B1, 38B2, and 38B3 are perspective views and cross-sectional views illustrating semiconductor devices of embodiments of the present invention.

FIGS. 46A1, 46A2, 46A3, 46B1, 46B2, 46C1, and 46C2 are perspective views illustrating electronic devices of embodiments of the present invention.

FIGS. 48A to 48D are Cs-corrected high-resolution TEM images of a plane of a CAAC-OS.

FIGS. 49A to 49C show structural analysis of a CAAC-OS and a single crystal oxide semiconductor by XRD.

DETAILED DESCRIPTION OF THE INVENTION

Figure 1A:
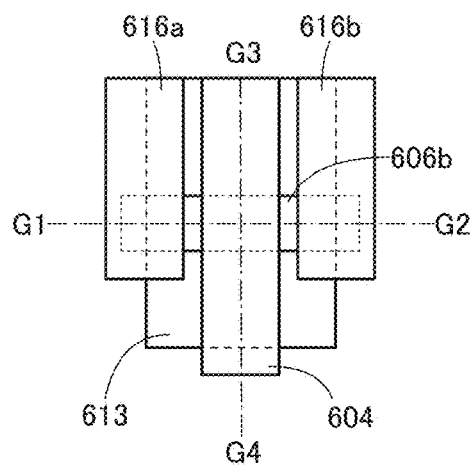
FIGS. 1A to 1C are a top view and cross-sectional views illustrating a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not denoted by reference numerals in some cases. In the case where the description of a component denoted by a different reference numeral is referred to, the description of the thickness, composition, structure, shape, or the like of the component can be used as appropriate.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential. Note that in general, a potential (a voltage) is relative and is determined depending on the amount relative to a reference potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements. Note that as well as the impurity, a main component element that is excessively contained might cause DOS. In that case, DOS can be lowered in some cases by a slight amount of an additive (e.g., greater than or equal to 0.001 atomic % and less than 3 atomic %). The above-described element that might serve as an impurity can be used as the additive.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values might be different from those calculated by using an effective channel width.

In this specification, the expression "A has a shape such that an end portion extends beyond an end portion of B" may indicate the case where at least one end portion of A is positioned on an outer side than at least one end portion of B in a top view or a cross-sectional view. Therefore, the expression "A has a shape such that an end portion extends beyond an end portion of B" can also be expressed as "an end portion of A is positioned on an outer side than an end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification, the term "semiconductor" can be replaced with any term for various semiconductors in some cases. For example, the term "semiconductor" can be replaced with the term for a Group 14 semiconductor such as silicon or germanium;

an oxide semiconductor; a compound semiconductor such as silicon carbide, germanium silicide, gallium arsenide, indium phosphide, zinc selenide, or cadmium sulfide; or an organic semiconductor.

<Transistor>

Figure 1C:
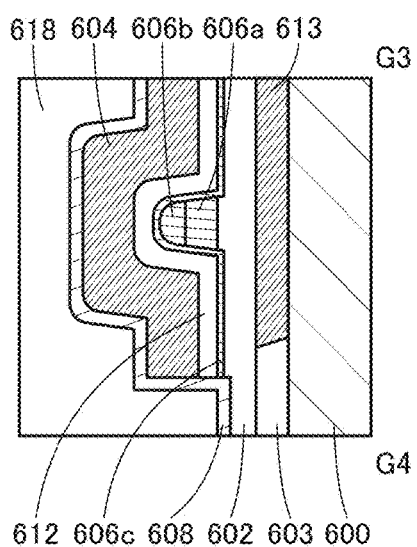
Figure 1B:
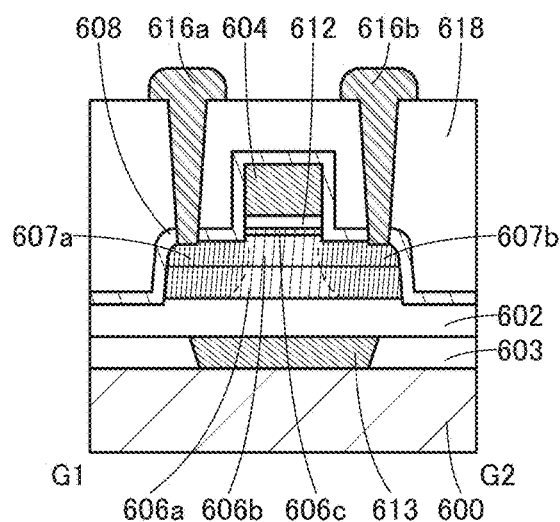

FIGS. 1A to 1C illustrate a structure of a transistor included in a semiconductor device of one embodiment of the present invention. FIG. 1A is a top view of the transistor. FIG. 1B is a cross-sectional view taken along dashed-dotted line G1-G2 in FIG. 1A. FIG. 1C is a cross-sectional view taken along dashed-dotted line G3-G4 in FIG. 1A. Note that some components such as an insulator are not illustrated in FIG. 1A for easy understanding.

In the cross-sectional views in FIGS. 1B and 1C, the transistor includes an insulator 603 and a conductor 613 over a substrate 600, an insulator 602 over the insulator 603 and the conductor 613, an insulator 606a over the insulator 602, a semiconductor 606b over the insulator 606a, an insulator 606c over the semiconductor 606b and the insulator 602, an insulator 612 over the insulator 606c, and a conductor 604 over the insulator 612. An insulator 608 is provided over the insulator 602, the semiconductor 606b, and the conductor 604. An insulator 618 is provided over the insulator 608. Openings that reach the semiconductor 606b are provided in the insulator 618 and the insulator 608, and a conductor 616a and a conductor 616b are connected to the semiconductor 606b through the openings.

The insulator 606a and the semiconductor 606b have a region 607a and a region 607b. The region 607a and the region 607b have higher conductivity (lower resistance) than the other regions. Note that the region 607a and the region 607b may be provided only in the insulator 606a or in the semiconductor 606b. The details of the region 607a and the region 607b will be described later.

The insulator 602 might have a projection and a depression. For example, a region in contact with at least one of the insulator 606a and the insulator 606c might be a projection, and a region not in contact with the insulators 606a and 606c might be a depression. The semiconductor 606b might have a projection and a depression. For example, a region in contact with the insulator 606c might be a projection and a region not in contact with the insulator 606c might be a depression.

The semiconductor 606b functions as a channel formation region of the transistor. The conductor 604 functions as a first gate electrode (also referred to as a front gate electrode) of the transistor. The conductor 613 functions as a second gate electrode (also referred to as a back gate electrode) of the transistor. The region 607a and the region 607b function as a source region and a drain region of the transistor.

As illustrated in FIG. 1C, the semiconductor 606b can be electrically surrounded by an electric field of the conductor 604 and/or the conductor 613 (a structure in which a semiconductor is electrically surrounded by an electric field of a conductor is referred to as a surrounded channel (s-channel) structure). Therefore, a channel is formed in the entire semiconductor 606b (the top, bottom, and side surfaces of the semiconductor 606b). In the s-channel structure, a large amount of current can flow between a source and a drain of a transistor, so that a high on-state current can be obtained.

In the case where the transistor has the s-channel structure, a channel is formed also in the side surface of the semiconductor 606b. Thus, as the thickness of the semiconductor 606b becomes larger, the channel region becomes larger. In other words, the thicker the semiconductor 606b is, the higher the on-state current of the transistor is. In addition, as the thickness of the semiconductor 606b becomes larger, the proportion of the region with high carrier controllability increases, leading to a smaller subthreshold swing value. The semiconductor 606b has, for example, a region with a thickness greater than or equal to 20 nm, preferably greater than or equal to 40 nm, further preferably greater than or equal to 60 nm, and still further preferably greater than or equal to 100 nm. Since the productivity of the semiconductor device might be decreased, the semiconductor 606b has, for example, a region with a thickness less than or equal to 300 nm, preferably less than or equal to 200 nm, and further preferably less than or equal to 150 nm.

The s-channel structure is suitable for a miniaturized transistor because a high on-state current can be obtained. A semiconductor device including the miniaturized transistor can have a high integration degree and high density. The transistor includes a region having a channel length of preferably less than or equal to 40 nm, further preferably less than or equal to 30 nm, and still further preferably less than or equal to 20 nm and a region having a channel width of preferably less than or equal to 40 nm, further preferably less than or equal to 30 nm, and still further preferably less than or equal to 20 nm, for example.

As the substrate 600, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 600. As a method for providing a device over a flexible substrate, a method in which the device is formed over a non-flexible substrate and then the device is separated and transferred to the substrate 600, which is a flexible substrate, can be given. In that case, a separation layer is preferably provided between the non-flexible substrate and the device. As the substrate 600, a sheet, a film, or a foil containing a fiber may be used. The substrate 600 may have elasticity. The substrate 600 may have a property of returning to its original shape when bending or pulling is stopped. Alternatively, the substrate 600 may have a property of not returning to its original shape. The thickness of the substrate 600 is, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate 600 has a small thickness, the weight of the semiconductor device can be reduced. When the substrate 600 has a small thickness, even in the case of using glass or the like, the substrate 600 may have elasticity or a property of returning to its original shape when bending or pulling is stopped. Therefore, an impact applied to the semiconductor device over the substrate 600, which is caused by dropping or the like, can be reduced. That is, a durable semiconductor device can be provided.

For the substrate 600 which is a flexible substrate, metal, an alloy, a resin, glass, or fiber thereof can be used, for example. The flexible substrate 600 preferably has a lower coefficient of linear expansion because deformation due to an environment is suppressed. The flexible substrate 600 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 600 because of its low coefficient of linear expansion.

The insulator 603 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 603 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 613 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 602 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 602 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 602 preferably contains excess oxygen in the case where the semiconductor 606b is an oxide semiconductor. Note that excess oxygen means oxygen in an insulator or the like which does not bond with (which is liberated from) the insulator or the like or has low bonding energy with the insulator or the like.

Here, an insulator containing excess oxygen may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in thermal desorption spectroscopy (TDS) analysis in the range of a surface temperature of 100° C. to 700° C. or 100° C. to 500° C.

The method for measuring the amount of released oxygen using TDS analysis will be described below.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2} = N_{H2}/S_{H2} \times S_{O2} \times \alpha$$

The value $N_{H2}$ is obtained by conversion of the number of hydrogen molecules desorbed from the standard sample into densities. The value $S_{H2}$ is the integral value of ion intensity when the standard sample is subjected to the TDS analysis. Here, the reference value of the standard sample is set to $N_{H2}/S_{H2}$. $S_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that since the above α includes the ionization rate of the oxygen molecules, the number of the released oxygen atoms can also be estimated through the measurement of the number of the released oxygen molecules.

Note that $N_{O2}$ is the number of the released oxygen molecules. The number of released oxygen in the case of being converted into oxygen atoms is twice the number of the released oxygen molecules.

Furthermore, an insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

The insulator 612 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 612 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 612 preferably contains excess oxygen in the case where the semiconductor 606b is an oxide semiconductor.

The conductor 604 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 608 is, for example, an insulator having a low hydrogen-transmitting property (i.e., a hydrogen barrier property).

Because of its small atomic radius or the like, hydrogen is likely to be diffused in an insulator (i.e., the diffusion coefficient of hydrogen is large). For example, a low-density insulator has a high hydrogen-transmitting property. In other words, a high-density insulator has a low hydrogen-transmitting property. The density of a low-density insulator is not always low throughout the insulator; an insulator including a low-density part is also referred to as a low-density insulator. This is because the low-density part serves as a hydrogen path. Although a density that allows hydrogen to be transmitted is not limited, it is typically lower than 2.6 g/cm$^3$. Examples of a low-density insulator include an inorganic insulator such as silicon oxide or silicon oxynitride and an organic insulator such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator having crystal grain boundaries can have a high hydrogen-transmitting property. In other words, hydrogen is less likely transmitted through an insulator having no grain boundaries or few grain boundaries. For example, a non-polycrystalline insulator (e.g., an amorphous insulator) has a lower hydrogen-transmitting property than a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of a device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

The insulator 608 is, for example, an insulator having a low oxygen-transmitting property (i.e., an oxygen barrier property).

The insulator 608 is, for example, an insulator having a low water-transmitting property (i.e., a water barrier property).

The insulator 618 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 618 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that the insulator 618 preferably includes an insulator with low relative permittivity. For example, the insulator 618 preferably contains silicon oxide, silicon oxynitride, silicon nitride oxide, silicon nitride, a resin, or the like. Examples of the resin include polyester, polyolefin, polyamide (e.g., nylon or aramid), polyimide, polycarbonate, and acrylic. Alternatively, silicon oxide containing carbon, silicon oxynitride containing carbon, silicon nitride oxide containing carbon, silicon nitride containing carbon, or the like is preferably contained.

Each of the conductors 616a and 616b may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may also be used, for example, and a conductor containing aluminum, a conductor containing copper and titanium, a conductor containing copper and manganese, a conductor containing indium, tin, and oxygen, a conductor containing titanium and nitrogen, or the like may be used.

In the case where each of the conductor 616a and the conductor 616b has a stacked-layer structure, a stack including a conductor functioning as an electrode (such a conductor is also referred to as a plug) that fills the opening in the insulator 618 and the insulator 608 and a conductor functioning as a wiring that is over the insulator 618 may be employed. The plug portion may include a base conductor. The use of the base conductor can increase the adhesion between the semiconductor 606b and the plug and reduce the contact resistance. The base conductor preferably has an impurity barrier property in some cases because an impurity contained in the plug, the wiring, or the like can be prevented from reaching the channel formation region.

The insulator 606a, the semiconductor 606b, and the insulator 606c will be described below.

Placing the insulator 606a under the semiconductor 606b and placing the insulator 606c over the semiconductor 606b can improve electrical characteristics of the transistor in some cases.

The insulator 606a, the semiconductor 606b, and the insulator 606c each preferably include a CAAC-OS.

The semiconductor 606b is an oxide containing indium, for example. The semiconductor 606b can have high carrier mobility (electron mobility) by containing indium, for example. The semiconductor 606b preferably contains an element M The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M in some cases. The element M is an element having a high bonding energy with oxygen, for example. The element M is an element whose bonding energy with oxygen is higher than that of indium, for example. The element M is an element that can increase the energy gap of the oxide, for example. Furthermore, the semiconductor 606b preferably contains zinc. When the oxide contains zinc, the oxide semiconductor is easily crystallized, in some cases.

Note that the semiconductor 606b is not limited to the oxide containing indium. The semiconductor 606b may be, for example, an oxide which does not contain indium and contains zinc, gallium, tin, or the like such as a zinc tin oxide or a gallium tin oxide.

The semiconductor 606b is formed using, for example, an oxide with a wide energy gap. For example, the energy gap of the semiconductor 606b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The insulators 606a and 606c are each an oxide containing one or more or two or more elements contained in the semiconductor 606b other than oxygen, for example. Since the insulators 606a and 606c each contain one or more or two or more elements contained in the semiconductor 606b other than oxygen, a defect state is less likely to be formed at the interface between the insulator 606a and the semiconductor 606b and the interface between the semiconductor 606b and the insulator 606c.

The insulator 606a, the semiconductor 606b, and the insulator 606c preferably contain at least indium. In the case of using an In-M-Zn oxide as the insulator 606a, when the summation of In and M is assumed to be 100 atomic %, the proportions of In and M are preferably set to be less than 50 atomic % and greater than 50 atomic %, respectively, and further preferably less than 25 atomic % and greater than 75 atomic %, respectively. In the case of using an In-M-Zn oxide as the semiconductor 606b, when the summation of In and M is assumed to be 100 atomic %, the proportions of In and M are preferably set to be greater than 25 atomic % and less than 75 atomic %, respectively, and further preferably greater than 34 atomic % and less than 66 atomic %, respectively. In the case of using an In-M-Zn oxide as the insulator 606c, when the summation of In and M is assumed to be 100 atomic %, the proportions of In and M are preferably set to be less than 50 atomic % and greater than 50 atomic %, respectively, and further preferably less than 25 atomic % and greater than 75 atomic %, respectively. Note that the insulator 606c may be an oxide that is of the same type as the oxide of the insulator 606a. Note that the insulator 606a and/or the insulator 606c do/does not necessarily contain indium in some cases. For example, the insulator 606a and/or the insulator 606c may be gallium oxide. Note that the atomic ratio between the elements contained in the insulator 606a, the semiconductor 606b, and the insulator 606c is not necessarily a simple integer ratio.

As the semiconductor 606b, an oxide having an electron affinity higher than that of the insulator 606a and that of the insulator 606c is used. For example, as the semiconductor 606b, an oxide having an electron affinity higher than that of the insulator 606a and that of the insulator 606c by 0.07 eV or higher and 1.3 eV or lower, preferably 0.1 eV or higher and 0.7 eV or lower, and further preferably 0.15 eV or higher and 0.4 eV or lower is used. Note that the electron affinity refers to an energy difference between the vacuum level and the conduction band minimum.

An indium gallium oxide has low electron affinity and a high oxygen-blocking property. Therefore, the insulator 606c preferably includes an indium gallium oxide. The gallium atomic ratio [Ga/(In+Ga)] is, for example, higher than or equal to 70%, preferably higher than or equal to 80%, further preferably higher than or equal to 90%.

In such a case, gate voltage application results in channel formation in the semiconductor 606b having the highest electron affinity among the insulator 606a, the semiconductor 606b, and the insulator 606c.

Figure 22:
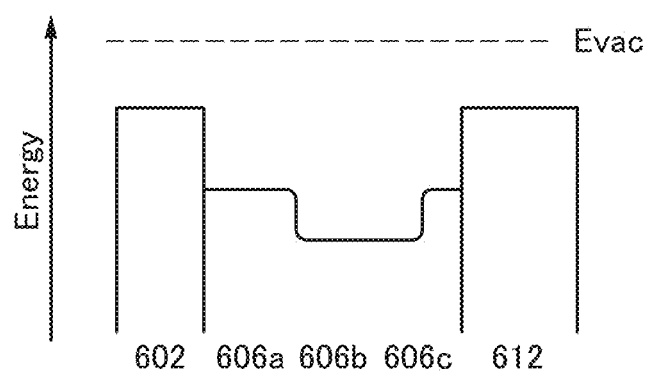
FIG. 22 is a band diagram of a channel formation region and its vicinity of a transistor of one embodiment of the present invention.

Here, in some cases, there is a mixed region of the insulator 606a and the semiconductor 606b between the insulator 606a and the semiconductor 606b. Furthermore, in some cases, there is a mixed region of the semiconductor 606b and the insulator 606c between the semiconductor 606b and the insulator 606c. The mixed region has a low density of defect states. For that reason, the stack including the insulator 606a, the semiconductor 606b, and the insulator 606c has a band structure where energy is changed continuously at each interface and in the vicinity of the interface (continuous junction) (see FIG. 22). Note that the boundary between the insulator 606a and the semiconductor 606b and the boundary between the insulator 606c and the semiconductor 606b are not clear in some cases.

At this time, electrons move mainly in the semiconductor 606b, not in the insulator 606a and the insulator 606c. Note that the insulator 606a and the insulator 606c can exhibit a property of any of a conductor, a semiconductor, and an insulator when existing alone. When the transistor operates, however, they each have a region where a channel is not formed. Specifically, a channel is formed only in a region near the interface between the insulator 606a and the semiconductor 606b and a region near the interface between the insulator 606c and the semiconductor 606b, whereas a channel is not formed in the other region. Therefore, the insulator 606a and the insulator 606c can be called insulators when the transistor operates, and are thus referred to as, not semiconductors or conductors, but insulators in this specification. The insulator 606a, the semiconductor 606b, and the insulator 606c are separately called semiconductor or insulator only because of the relative difference in physical property. Therefore, for example, an insulator that can be used as the insulator 606a or the insulator 606c can be used as the semiconductor 606b in some cases. As described above, when the density of defect states at the interface between the insulator 606a and the semiconductor 606b and the density of defect states at the interface between the semiconductor 606b and the insulator 606c are decreased, electron movement in the semiconductor 606b is less likely to be inhibited and the on-state current of the transistor can be increased.

As factors in inhibiting electron movement are decreased, the on-state current of the transistor can be increased. For example, in the case where there is no factor in inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 µm×1 µm of the top or bottom surface of the semiconductor 606b (a formation surface; here, the top surface of the insulator 606a) is less than 1 nm, preferably less than 0.6 nm, further preferably less than 0.5 nm, still further preferably less than 0.4 nm. The average surface roughness (also referred to as Ra) with the measurement area of 1 µm×1 µm is less than 1 nm, preferably less than 0.6 nm, further preferably less than 0.5 nm, still further preferably less than 0.4 nm. The maximum difference (P–V) with the measurement area of 1 µm×1 µm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Moreover, the thickness of the insulator 606c is preferably as small as possible to increase the on-state current of the transistor. For example, the insulator 606c is formed to include a region having a thickness of less than 10 nm, preferably less than or equal to 5 nm, further preferably less than or equal to 3 nm. Meanwhile, the insulator 606c has a function of blocking entry of elements other than oxygen (such as hydrogen and silicon) included in the adjacent insulator into the semiconductor 606b where a channel is formed. For this reason, it is preferable that the insulator 606c have a certain thickness. For example, the insulator 606c is formed to include a region having a thickness of greater than or equal to 0.3 nm, preferably greater than or equal to 1 nm, further preferably greater than or equal to 2 nm. The insulator 606c preferably has an oxygen blocking property to suppress outward diffusion of oxygen released from the insulator 602 and the like.

To improve reliability, the insulator 606a is preferably thick and the insulator 606c is preferably thin. For example, the insulator 606a includes a region with a thickness of, for example, greater than or equal to 10 nm, preferably greater than or equal to 20 nm, further preferably greater than or equal to 40 nm, still further preferably greater than or equal to 60 nm. When the thickness of the insulator 606a is made large, a distance from the interface between the adjacent insulator and the insulator 606a to the semiconductor 606b in which a channel is formed can be large. Since the productivity of the semiconductor device might be decreased, the insulator 606a has a region with a thickness of, for example, less than or equal to 200 nm, preferably less than or equal to 120 nm, further preferably less than or equal to 80 nm.

Between the semiconductor 606b and the insulator 606a, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, and further preferably higher than or equal to $1\times10^{16}$ atoms/cm$^3$ and lower than or equal to $2\times10^{18}$ atoms/cm$^3$ is provided, for example. Furthermore, between the semiconductor 606b and the insulator 606c, a region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, and further preferably higher than or equal to $1\times10^{16}$ atoms/cm$^3$ and lower than or equal to $2\times10^{18}$ atoms/cm$^3$ is provided.

The semiconductor 606b includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. It is preferable to reduce the hydrogen concentration in the insulator 606a and the insulator 606c in order to reduce the hydrogen concentration in the semiconductor 606b. The insulator 606a and the insulator 606c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. The semiconductor 606b includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, and still further preferably higher than or equal to $1\times10^{15}$ atoms/cm$^3$ and lower than or equal to $5\times10^{17}$ atoms/cm$^3$. It is preferable to reduce the nitrogen concentration in the insulator 606a and the insulator 606c in order to reduce the nitrogen concentration in the semiconductor 606b. The insulator 606a and the insulator 606c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, and still further preferably higher than or equal to $1\times10^{15}$ atoms/cm$^3$ and lower than or equal to $5\times10^{17}$ atoms/cm$^3$.

The above three-layer structure is an example. For example, a two-layer structure without the insulator 606a or the insulator 606c may be employed. Alternatively, a four-layer structure in which any one of the semiconductors described as examples of the insulator 606a, the semiconductor 606b, and the insulator 606c is provided under or over the insulator 606a or under or over the insulator 606c may be employed. An n-layer structure (n is an integer of 5 or more) may be employed in which one of the semiconductors described as examples of the insulator 606a, the semiconductor 606b, and the insulator 606c is provided at two or more of the following positions: over the insulator 606a, under the insulator 606a, over the insulator 606c, and under the insulator 606c may be employed.

<Composition>

The composition of an In-M-Zn oxide is described below. The element M is aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like.

FIG. 23 is a triangular diagram whose vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by any of the dashed lines denoted as [In]:[M]:[Zn]=1+α:1−α:1, [In]:[M]:[Zn]=1+α: 1−α:2, [In]:[M]:[Zn]=1+α:1−α:3, [In]:[M]:[Zn]=1+α:1−α: 4, and [In]:[M]:[Zn]=1+α:1−α:5. Note that the bold line on the dashed line represents, for example, the composition that allows an oxide as a raw material mixed and subjected to baking at 1350° C. to be a solid solution.

Thus, when an oxide has a composition close to the above composition that allows the oxide to be a solid solution, the crystallinity can be increased. When an In-M-Zn oxide is deposited by a sputtering method, the composition of a target might be different from the composition of a deposited film. For example, using an In-M-Zn oxide in which an atomic ratio is 1:1:1, 1:1:1.2, 3:1:2, 4:2:4.1, 1:3:2, 1:3:4, or 1:4:5 as a target results in a film having an atomic ratio of 1:1:0.7 (approximately 1:1:0.5 to 1:1:0.9), 1:1:0.9 (approximately 1:1:0.8 to 1:1:1.1), 3:1:1.5 (approximately 3:1:1 to 3:1:1.8), 4:2:3 (approximately 4:2:2.6 to 4:2:3.6), 1:3:1.5 (approximately 1:3:1 to 1:3:1.8), 1:3:3 (approximately 1:3: 2.5 to 1:3:3.5), or 1:4:4 (approximately 1:4:3.4 to 1:4:4.4). Thus, in order to obtain a film with a desired composition, a composition of a target may be selected in consideration of a change in the composition.

<Structure of Oxide Semiconductor>

A structure of an oxide semiconductor that can be used for the insulator 606a, the semiconductor 606b, the insulator 606c, or the like will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 47A:
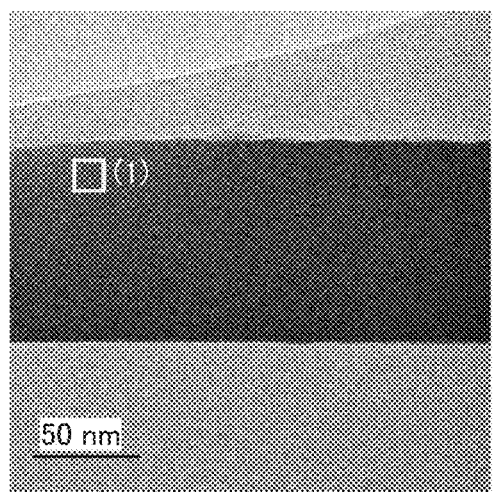
FIGS. 47A to 47D are Cs-corrected high-resolution TEM images of a cross section of a CAAC-OS and a cross-sectional schematic view of a CAAC-OS.

A CAAC-OS observed with TEM is described below. FIG. 47A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 47B:
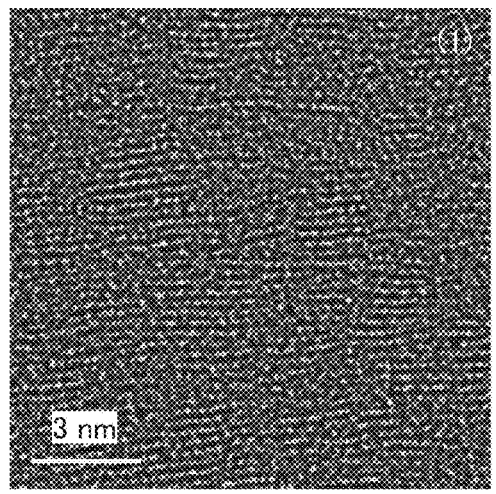

FIG. 47B is an enlarged Cs-corrected high-resolution TEM image of a region (1) in FIG. 47A. FIG. 47B shows that metal atoms are arranged in a layered manner in a pellet. Each metal atom layer has a configuration reflecting unevenness of a surface over which the CAAC-OS is formed (hereinafter, the surface is referred to as a formation surface) or the top surface of the CAAC-OS, and is arranged parallel to the formation surface or the top surface of the CAAC-OS.

Figure 47C:
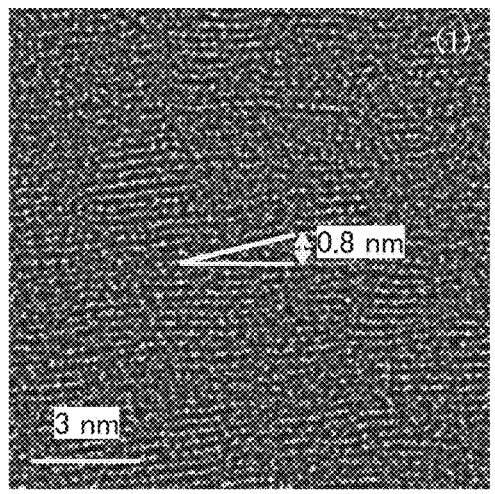

As shown in FIG. 47B, the CAAC-OS has a characteristic atomic arrangement. The characteristic atomic arrangement is denoted by an auxiliary line in FIG. 47C. FIGS. 47B and 47C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 47D:
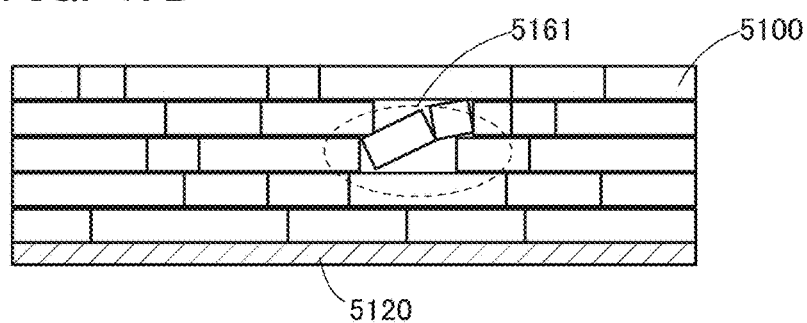

Here, according to the Cs-corrected high-resolution TEM images, the schematic arrangement of pellets 5100 of a CAAC-OS over a substrate 5120 is illustrated by such a structure in which bricks or blocks are stacked (see FIG. 47D). The part in which the pellets are tilted as observed in FIG. 47C corresponds to a region 5161 shown in FIG. 47D.

FIG. 48A shows a Cs-corrected high-resolution TEM image of a plane of the CAAC-OS observed from a direction substantially perpendicular to the sample surface. FIGS. 48B, 48C, and 48D are enlarged Cs-corrected high-resolution TEM images of regions (1), (2), and (3) in FIG. 48A, respectively. FIGS. 48B, 48C, and 48D indicate that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 49A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. The peak at 2θ of around 36° might be assigned to the (222) plane of a crystal structure that is classified into the space group Fd-3m (e.g., a spinel crystal structure), for example. Note that in the case of an oxide containing indium like an In-M-Zn oxide, the peak at 2θ of around 36° might indicate a spinel crystal of $Zn(Ga_{2-x}In_x)O_4$. Note that X is a rational number, where 0<X<2. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 49B, a peak is not clearly observed. In contrast, in the case of a single crystal oxide semiconductor of InGaZnO$_4$, when φ scan is performed with 2θ fixed at around 56°, as shown in FIG. 49C, six peaks which are derived from crystal planes equivalent to the (110) plane are observed. Accordingly, the structural analysis using XRD shows that the directions of a-axes and b-axes are irregularly oriented in the CAAC-OS.

Figure 50A:
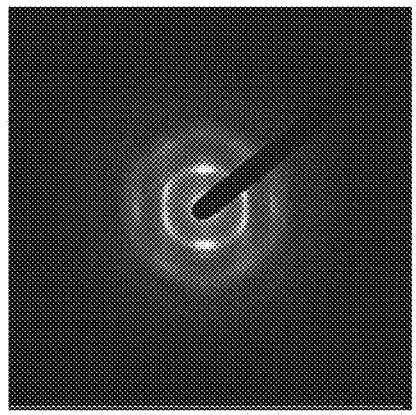
FIGS. 50A and 50B show electron diffraction patterns of a CAAC-OS.
Figure 50B:
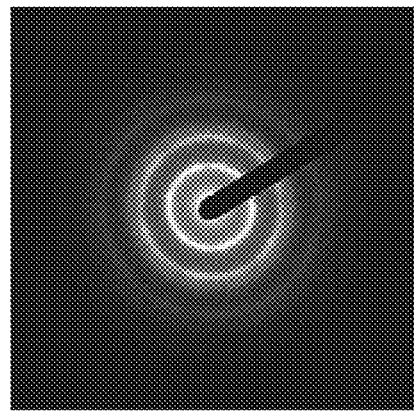

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 50A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 50B shows a diffraction pattern obtained in such a manner that an electron beam with a probe diameter of 300 nm is incident on the same sample in a direction perpendicular to the sample surface. As shown in FIG. 50B, a ring-like diffraction pattern is observed. Thus, the electron diffraction also indicates that the a-axes and b-axes of the pellets included in the CAAC-OS do not have regular alignment. The first ring in FIG. 50B is considered to be derived from the (010) plane, the (100) plane, and the like of the InGaZnO$_4$ crystal. The second ring in FIG. 50B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 51:
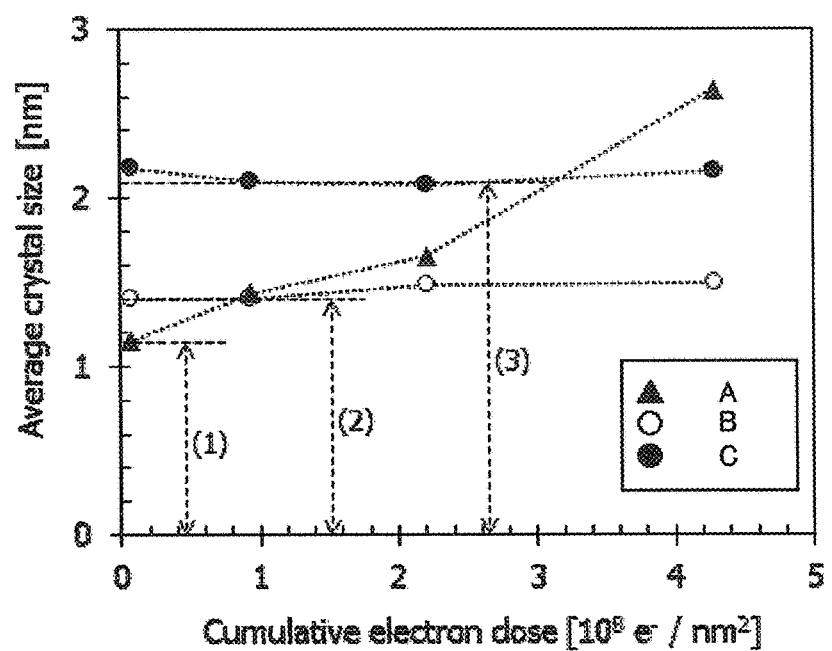
FIG. 51 shows a change of crystal parts of an In—Ga—Zn oxide due to electron irradiation.

FIG. 51 shows change in the average size of crystal parts (at 22 points to 45 points) in each sample. Note that the crystal part size corresponds to the length of a lattice fringe. FIG. 51 indicates that the crystal part size in the a-like OS increases with an increase in the cumulative electron dose. Specifically, as shown by (1) in FIG. 51, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 51, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Low-Resistance Region>

The region 607a and the region 607b will be described in detail below.

The region 607a and the region 607b lie astride the insulator 606a and the semiconductor 606b. The region 607a and the region 607b have higher conductivity than the other regions. Specifically, the region 607a and the region 607b have higher carrier density than the other regions.

In the case where the insulator 606a and the semiconductor 606b are each an In-M-Zn oxide, for example, hydrogen causes carrier generation. When hydrogen enters the site of an oxygen vacancy, for example, a donor level is formed. The hydrogen in the site of an oxygen vacancy becomes stable by weakly bonding to an adjacent metal element. Thus, the hydrogen is unlikely to be released by heat treatment or the like performed in a manufacturing process of the transistor. This means that when a donor level is once formed, the conductivity of the regions 607a and 607b can remain high. In addition, hydrogen can be prevented from entering the channel formation region or the like. Meanwhile, free hydrogen between lattices or hydrogen terminating a dangling bond of oxygen might not cause carrier generation. This can be understood from the fact that the carrier density is higher than the hydrogen concentration in the In-M-Zn oxide.

In other words, the In-M-Zn oxide contains much excess hydrogen that does not contribute to carrier generation. When the excess hydrogen is moved to oxygen vacancies, the conductivity of the In-M-Zn oxide can be increased. For this reason, the region 607a and the region 607b preferably have high density of oxygen vacancies.

In the case where the In-M-Zn oxide has a region with a spinel crystal structure, for example, the density of oxygen vacancies at the region and/or the interface between the region and another region might be high. A grain boundary is formed at the interface between the region and another region, for example. Since the density of defect states such as oxygen vacancies is high at the grain boundary, a donor level is formed when hydrogen enters. Furthermore, the grain boundary is planar; thus, the conductivity of the In-M-Zn oxide can be increased more efficiently than defect levels in dot-like distribution. Accordingly, each of the region 607a and the region 607b preferably has a region with a spinel crystal structure.

Modification Example of Transistor

Modification examples of the transistor included in the semiconductor device of one embodiment of the present invention will be described below. Note that the description is omitted in some cases where the description has already been made for FIGS. 1A to 1C. For example, for components denoted by the same reference numerals as those in FIGS. 1A to 1C, the descriptions for FIGS. 1A to 1C can be referred to.

Figure 2A:
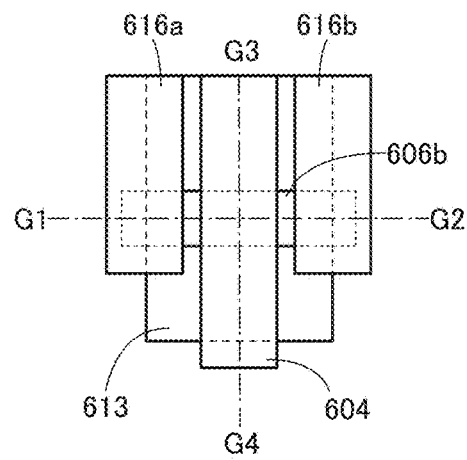
FIGS. 2A to 2C are a top view and cross-sectional views illustrating a transistor of one embodiment of the present invention.
Figure 2C:
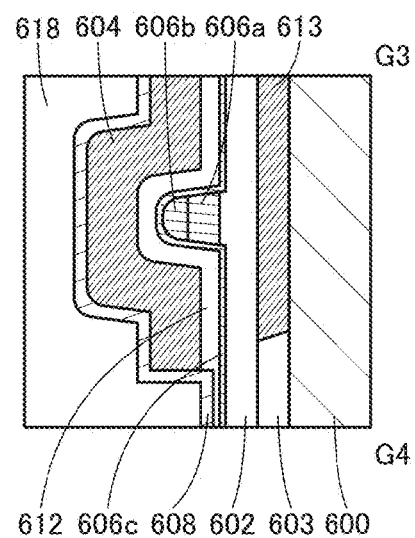
Figure 2B:
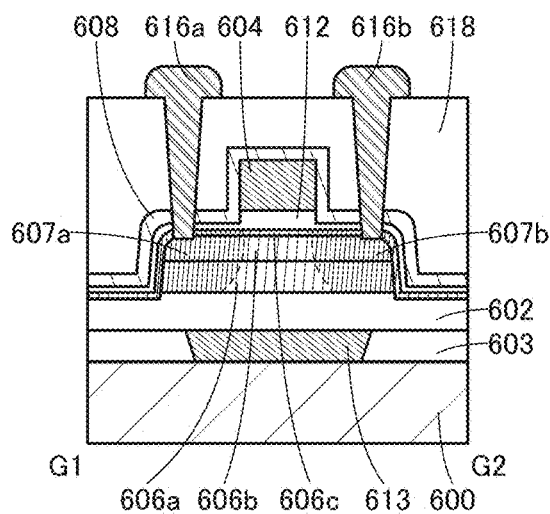

FIGS. 2A to 2C illustrate a structure of a transistor included in a semiconductor device of one embodiment of the present invention. FIG. 2A is a top view of the transistor. FIG. 2B is a cross-sectional view taken along dashed-dotted line G1-G2 in FIG. 2A. FIG. 2C is a cross-sectional view taken along dashed-dotted line G3-G4 in FIG. 2A. Note that some components such as an insulator are not illustrated in FIG. 2A for easy understanding.

In the cross-sectional views in FIGS. 2B and 2C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, and the conductor 604 over the insulator 612. The insulator 608 is provided over the insulator 612 and the conductor 604. The insulator 618 is provided over the insulator 608. Openings that reach the semiconductor 606b are provided in the insulator 618, the insulator 608, the insulator 612, and the insulator 606c, and the conductor 616a and the conductor 616b are connected to the semiconductor 606b through the openings.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

The insulator 602 might have a projection and a depression. For example, a region in contact with the insulator 606a might be a projection, and a region not in contact with the insulator 606a might be a depression. The insulator 612 might have a projection and a depression. For example, a region in contact with the conductor 604 might be a projection and a region not in contact with the conductor 604 might be a depression.

Figure 3A:
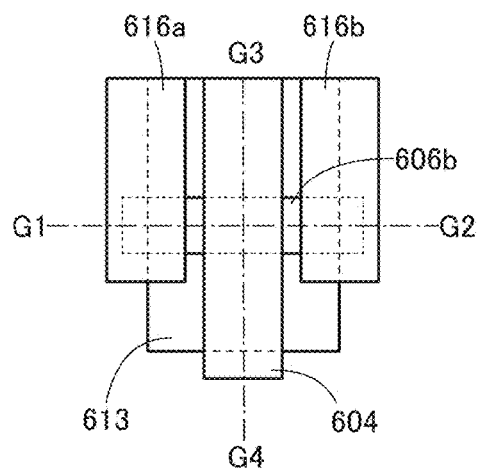
FIGS. 3A to 3C are a top view and cross-sectional views illustrating a transistor of one embodiment of the present invention.
Figure 3C:
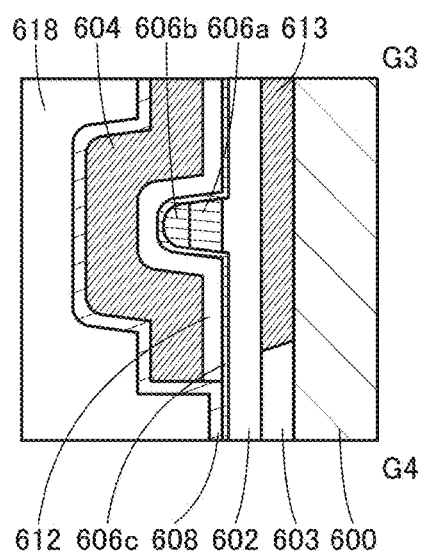
Figure 3B:
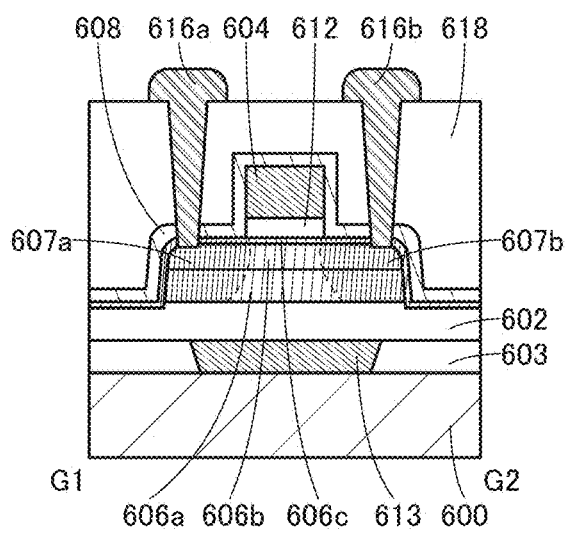

FIGS. 3A to 3C illustrate a structure of a transistor included in a semiconductor device of one embodiment of the present invention. FIG. 3A is a top view of the transistor. FIG. 3B is a cross-sectional view taken along dashed-dotted line G1-G2 in FIG. 3A. FIG. 3C is a cross-sectional view taken along dashed-dotted line G3-G4 in FIG. 3A. Note that some components such as an insulator are not illustrated in FIG. 3A for easy understanding.

In the cross-sectional views in FIGS. 3B and 3C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, and the conductor 604 over the insulator 612. The insulator 608 is provided over the insulator 606c and the conductor 604. The insulator 618 is provided over the insulator 608. Openings that reach the semiconductor 606b are provided in the insulator 618, the insulator 608, and the insulator 606c, and the conductor 616a and the conductor 616b are connected to the semiconductor 606b through the openings.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

The insulator 602 might have a projection and a depression. For example, a region in contact with the insulator 606a might be a projection, and a region not in contact with the insulator 606a might be a depression.

Figure 4A:
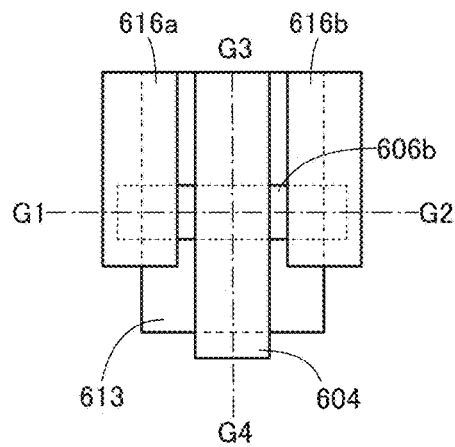
FIGS. 4A to 4C are a top view and cross-sectional views illustrating a transistor of one embodiment of the present invention.
Figure 4C:
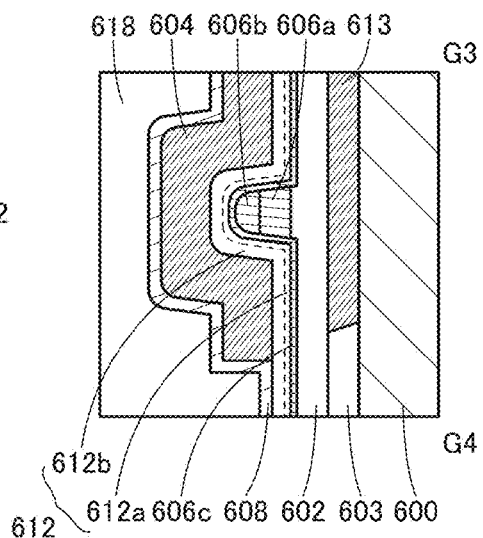
Figure 4B:
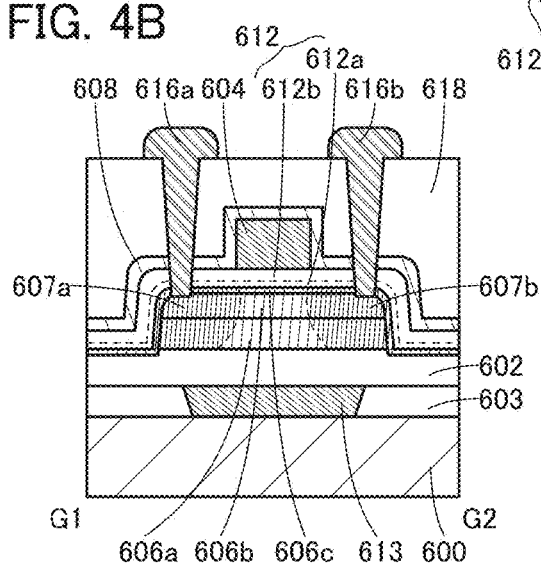

FIGS. 4A to 4C illustrate a structure of a transistor included in a semiconductor device of one embodiment of the present invention. FIG. 4A is a top view of the transistor. FIG. 4B is a cross-sectional view taken along dashed-dotted line G1-G2 in FIG. 4A. FIG. 4C is a cross-sectional view taken along dashed-dotted line G3-G4 in FIG. 4A. Note that some components such as an insulator are not illustrated in FIG. 4A for easy understanding.

In the cross-sectional views in FIGS. 4B and 4C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, and the conductor 604 over the insulator 612. The insulator 608 is provided over the insulator 612 and the conductor 604. The insulator 618 is provided over the insulator 608. Openings that reach the semiconductor 606b are provided in the insulator 618, the insulator 608, the insulator 612, and the insulator 606c, and the conductor 616a and the conductor 616b are connected to the semiconductor 606b through the openings.

In the insulator 612, an insulator 612a and an insulator 612b are stacked in this order. It is preferable to use a metal oxide for the insulator 612b, for example. With the use of the metal oxide, almost no projection or depression is formed in the insulator 612b, in some cases. The metal oxide preferably has high relative permittivity: for example, a relative permittivity of 7 or more, preferably 10 or more, and further preferably 14 or more. With the use of the metal oxide with high relative permittivity for part of the insulator 612, the effective oxide thickness can be made small while the physical thickness is made large. Thus, the leakage current of the transistor can be reduced even when the effective oxide thickness becomes small because of the miniaturization of the transistor.

For the insulator 612a, it is preferable to use an insulator with a large energy gap: for example, an insulator with an energy gap of 6 eV or more and preferably 7 eV or more. With the use of the insulator with a large energy gap for part of the insulator 612, the leakage current of the transistor can be reduced. Note that the insulator 612b and the insulator 612a may be stacked in this order. Another insulator may be provided over or under the insulator 612a and/or the insulator 612b. For example, a structure in which an insulator with high relative permittivity is sandwiched between insulators with a large energy gap, or a structure in which an insulator with a large energy gap is sandwiched between insulators with high relative permittivity may be employed.

Although the case where the insulator 612 has a stacked-layer structure is described here, the insulator 602 may have a similar stacked-layer structure. Also in that case, the leakage current of the transistor can be reduced, in some cases.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

Figure 5A:
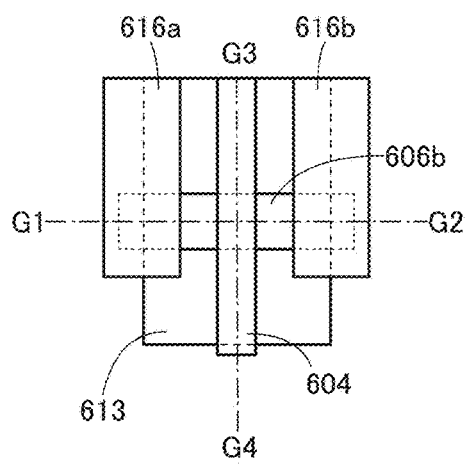
FIGS. 5A to 5C are a top view and cross-sectional views illustrating a transistor of one embodiment of the present invention.
Figure 5C:
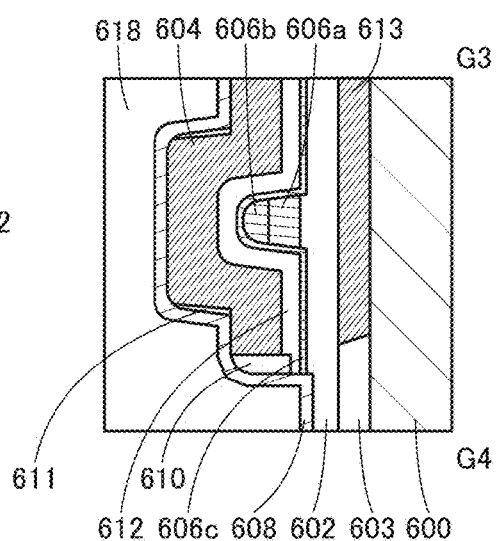
Figure 5B:
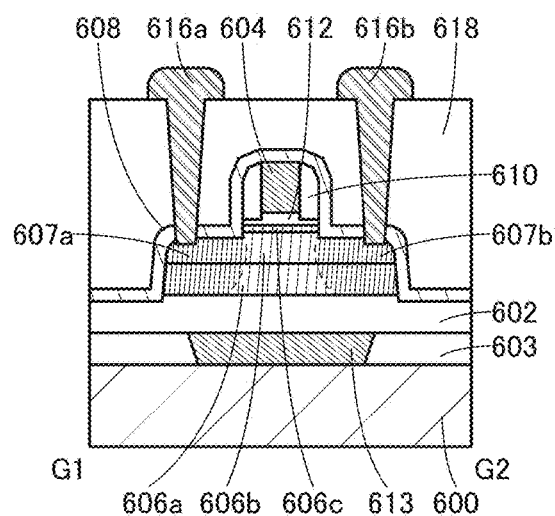

FIGS. 5A to 5C illustrate a structure of a transistor included in a semiconductor device of one embodiment of the present invention. FIG. 5A is a top view of the transistor. FIG. 5B is a cross-sectional view taken along dashed-dotted line G1-G2 in FIG. 5A. FIG. 5C is a cross-sectional view taken along dashed-dotted line G3-G4 in FIG. 5A. Note that some components such as an insulator are not illustrated in FIG. 5A for easy understanding.

In the cross-sectional views in FIGS. 5B and 5C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, the conductor 604 over the insulator 612, an insulator 610 that is over the insulator 612 and has a region in contact with a side surface of the conductor 604, and an insulator 611 that is over the conductor 604 and has a region in contact with a side surface of the conductor 604. The insulator 608 is provided over the insulator 602, the semiconductor 606b, the insulator 612, the insulator 610, the insulator 611, and the conductor 604. The insulator 618 is provided over the insulator 608. Openings that reach the semiconductor 606b are provided in the insulator 618 and the insulator 608, and the conductor 616a and the conductor 616b are connected to the semiconductor 606b through the openings. Although not illustrated, the conductors 616a and 616b may be provided such that at least one of the conductor 616a and the conductor 616b is in contact with the insulator 610. In that case, the distance between the conductor 616a and the conductor 616b can be made small; thus, the on-state current of the transistor can be increased, in some cases. Note that the insulator 611 might not be formed depending on the inclination angle of the side surface of the conductor 604. Moreover, although not illustrated, an insulator having a region in contact with side surfaces of the insulator 606a and the semiconductor 606b might be formed.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

The insulator 602 might have a projection and a depression. For example, a region in contact with at least one of the insulator 606a and the insulator 606c might be a projection, and a region not in contact with the insulators 606a and 606c might be a depression. The semiconductor 606b might have a projection and a depression. For example, a region in contact with the insulator 606c might be a projection and a region not in contact with the insulator 606c might be a depression.

Figure 6A:
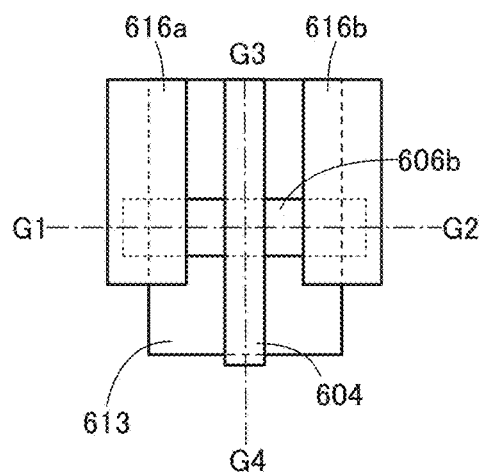
FIGS. 6A to 6C are a top view and cross-sectional views illustrating a transistor of one embodiment of the present invention.
Figure 6C:
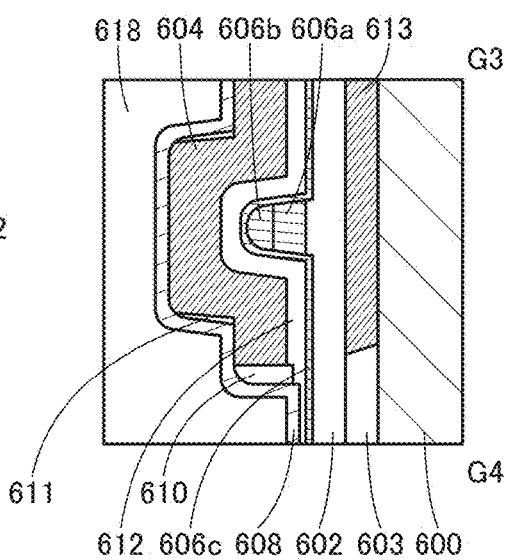
Figure 6B:
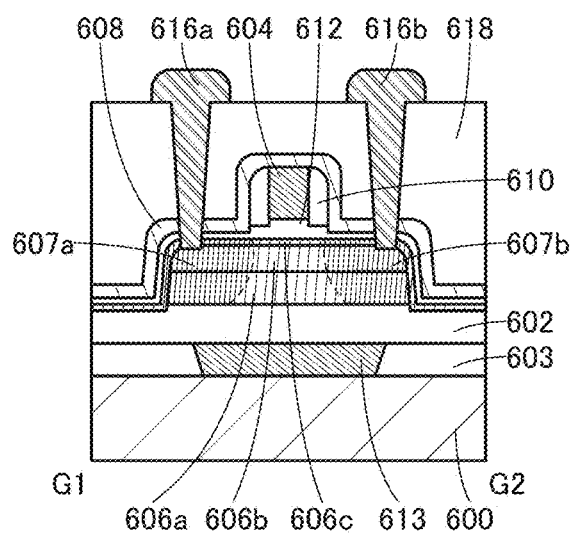

FIGS. 6A to 6C illustrate a structure of a transistor included in a semiconductor device of one embodiment of the present invention. FIG. 6A is a top view of the transistor. FIG. 6B is a cross-sectional view taken along dashed-dotted line G1-G2 in FIG. 6A. FIG. 6C is a cross-sectional view taken along dashed-dotted line G3-G4 in FIG. 6A. Note that some components such as an insulator are not illustrated in FIG. 6A for easy understanding.

In the cross-sectional views in FIGS. 6B and 6C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, the conductor 604 over the insulator 612, the insulator 610 that is over the insulator 612 and has a region in contact with a side surface of the conductor 604, and the insulator 611 that is over the conductor 604 and has a region in contact with a side surface of the conductor 604. The insulator 608 is provided over the insulator 612, the insulator 610, the insulator 611, and the conductor 604. The insulator 618 is provided over the insulator 608. Openings that reach the semiconductor 606b are provided in the insulator 618, the insulator 608, the insulator 612, and the insulator 606c, and the conductor 616a and the conductor 616b are connected to the semiconductor 606b through the openings. Although not illustrated, the conductors 616a and 616b may be provided such that at least one of the conductor 616a and the conductor 616b is in contact with the insulator 610. In that case, the distance between the conductor 616a and the conductor 616b can be made small; thus, the on-state current of the transistor can be increased, in some cases. Note that the insulator 611 might not be formed depending on the inclination angle of the side surface of the conductor 604. Moreover, although not illustrated, an insulator having a region in contact with side surfaces of the insulator 606a and the semiconductor 606b might be formed.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

The insulator 602 might have a projection and a depression. For example, a region in contact with the insulator 606a might be a projection, and a region not in contact with the insulator 606a might be a depression. The insulator 612 might have a projection and a depression. For example, a region in contact with the conductor 604 might be a projection and a region not in contact with the conductor 604 might be a depression.

Figure 7A:
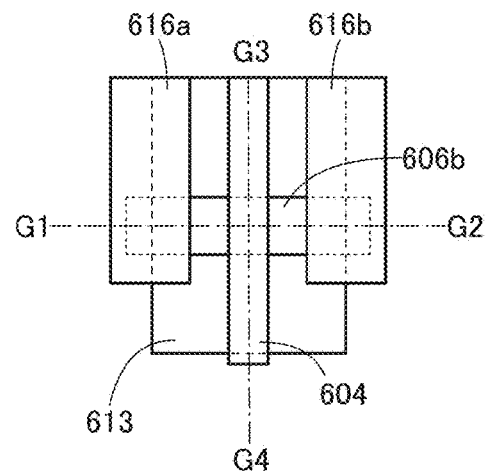
FIGS. 7A to 7C are a top view and cross-sectional views illustrating a transistor of one embodiment of the present invention.
Figure 7C:
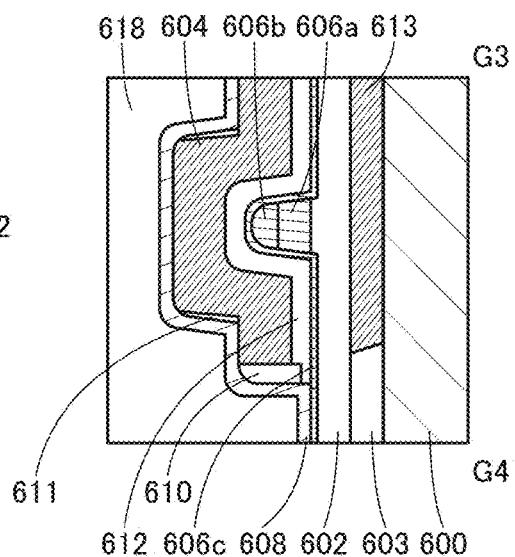
Figure 7B:
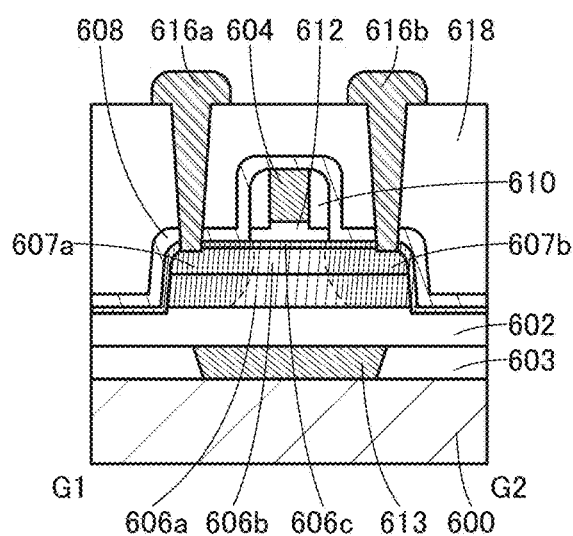

FIGS. 7A to 7C illustrate a structure of a transistor included in a semiconductor device of one embodiment of the present invention. FIG. 7A is a top view of the transistor. FIG. 7B is a cross-sectional view taken along dashed-dotted line G1-G2 in FIG. 7A. FIG. 7C is a cross-sectional view taken along dashed-dotted line G3-G4 in FIG. 7A. Note that some components such as an insulator are not illustrated in FIG. 7A for easy understanding.

In the cross-sectional views in FIGS. 7B and 7C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, the conductor 604 over the insulator 612, the insulator 610 that is over the insulator 612 and has a region in contact with a side surface of the conductor 604, and the insulator 611 that is over the conductor 604 and has a region in contact with a side surface of the conductor 604. The insulator 608 is provided over the insulator 606c, the insulator 610, the insulator 611, and the conductor 604. The insulator 618 is provided over the insulator 608. Openings that reach the semiconductor 606b are provided in the insulator 618, the insulator 608, and the insulator 606c, and the conductor 616a and the conductor 616b are connected to the semiconductor 606b through the openings. Although not illustrated, the conductors 616a and 616b may be provided such that at least one of the conductor 616a and the conductor 616b is in contact with the insulator 610. In that case, the distance between the conductor 616a and the conductor 616b can be made small; thus, the on-state current of the transistor can be increased, in some cases. Note that the insulator 611 might not be formed depending on the inclination angle of the side surface of the conductor 604. Moreover, although not illustrated, an insulator having a region in contact with side surfaces of the insulator 606a and the semiconductor 606b might be formed.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

The insulator 602 might have a projection and a depression. For example, a region in contact with the insulator 606a might be a projection, and a region not in contact with the insulator 606a might be a depression.

Figure 8A:
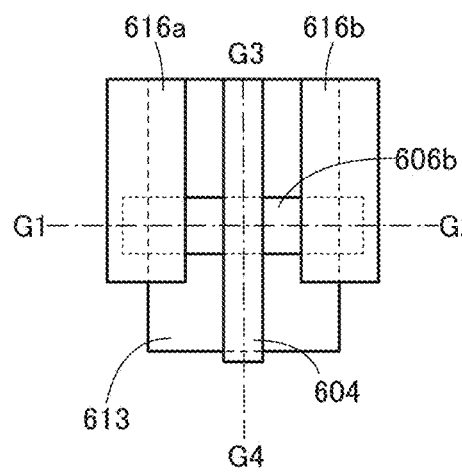
FIGS. 8A to 8C are a top view and cross-sectional views illustrating a transistor of one embodiment of the present invention.
Figure 8C:
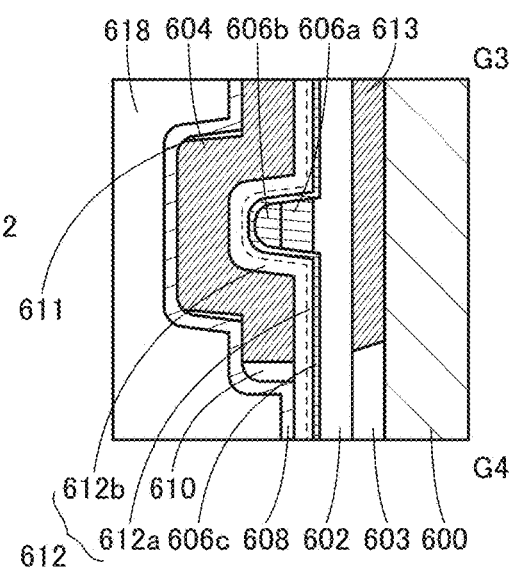
Figure 8B:
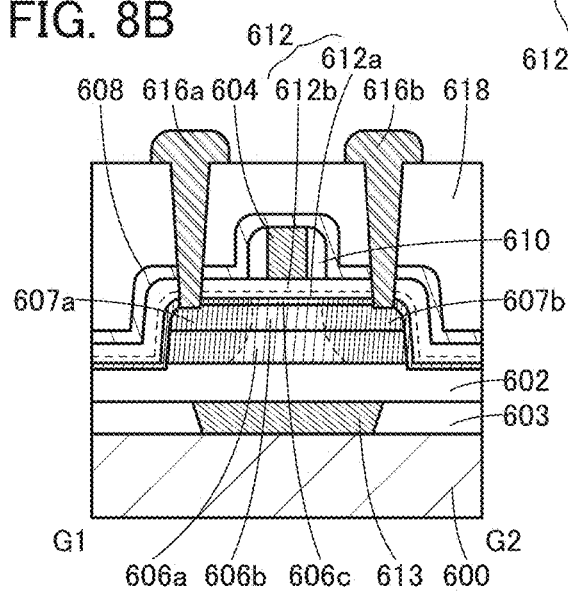

FIGS. 8A to 8C illustrate a structure of a transistor included in a semiconductor device of one embodiment of the present invention. FIG. 8A is a top view of the transistor. FIG. 8B is a cross-sectional view taken along dashed-dotted line G1-G2 in FIG. 8A. FIG. 8C is a cross-sectional view taken along dashed-dotted line G3-G4 in FIG. 8A. Note that some components such as an insulator are not illustrated in FIG. 8A for easy understanding.

In the cross-sectional views in FIGS. 8B and 8C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, the conductor 604 over the insulator 612, the insulator 610 that is over the insulator 612 and has a region in contact with a side surface of the conductor 604, and the insulator 611 that is over the conductor 604 and has a region in contact with a side surface of the conductor 604. The insulator 608 is provided over the insulator 612, the insulator 610, the insulator 611, and the conductor 604. The insulator 618 is provided over the insulator 608. Openings that reach the semiconductor 606b are provided in the insulator 618, the insulator 608, the insulator 612, and the insulator 606c, and the conductor 616a and the conductor 616b are connected to the semiconductor 606b through the openings. Although not illustrated, the conductors 616a and 616b may be provided such that at least one of the conductor 616a and the conductor 616b is in contact with the insulator 610. In that case, the distance between the conductor 616a and the conductor 616b can be made small; thus, the on-state current of the transistor can be increased, in some cases. Note that the insulator 611 might not be formed depending on the inclination angle of the side surface of the conductor 604. Moreover, although not illustrated, an insulator having a region in contact with side surfaces of the insulator 606a and the semiconductor 606b might be formed.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

In the insulator 612, the insulator 612a and the insulator 612b are stacked in this order. It is preferable to use a metal oxide for the insulator 612b, for example. With the use of the metal oxide, almost no projection or depression is formed in the insulator 612b, in some cases. The metal oxide preferably has high relative permittivity: for example, a relative permittivity of 7 or more, preferably 10 or more, and further preferably 14 or more. With the use of the metal oxide with high relative permittivity for part of the insulator 612, the effective oxide thickness can be made small while the physical thickness is made large. Thus, the leakage current of the transistor can be reduced even when the effective oxide thickness becomes small because of the miniaturization of the transistor.

For the insulator 612a, it is preferable to use an insulator with a large energy gap: for example, an insulator with an energy gap of 6 eV or more and preferably 7 eV or more. With the use of the insulator with a large energy gap for part of the insulator 612, the leakage current of the transistor can be reduced. Note that the insulator 612b and the insulator 612a may be stacked in this order. Another insulator may be provided over or under the insulator 612a and/or the insulator 612b. For example, a structure in which an insulator with high relative permittivity is sandwiched between insulators with a large energy gap, or a structure in which an insulator with a large energy gap is sandwiched between insulators with high relative permittivity may be employed.

Although the case where the insulator 612 has a stacked-layer structure is described here, the insulator 602 may have a similar stacked-layer structure. Also in that case, the leakage current of the transistor can be reduced, in some cases.

Figure 9A:
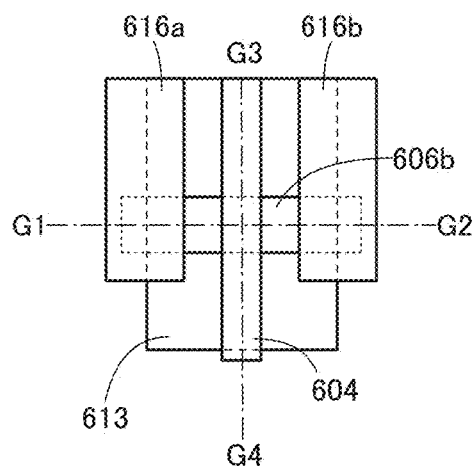
FIGS. 9A to 9C are a top view and cross-sectional views illustrating a transistor of one embodiment of the present invention.
Figure 9C:
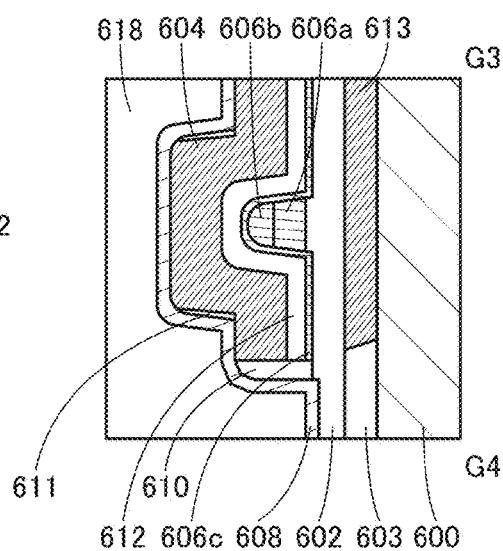
Figure 9B:
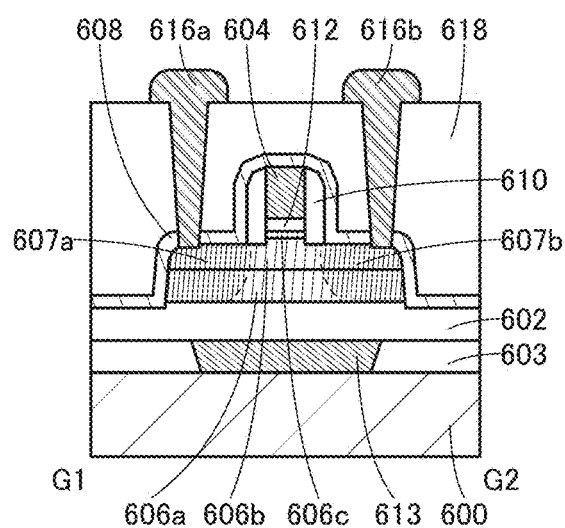

FIGS. 9A to 9C illustrate a structure of a transistor included in a semiconductor device of one embodiment of the present invention. FIG. 9A is a top view of the transistor. FIG. 9B is a cross-sectional view taken along dashed-dotted line G1-G2 in FIG. 9A. FIG. 9C is a cross-sectional view taken along dashed-dotted line G3-G4 in FIG. 9A. Note that some components such as an insulator are not illustrated in FIG. 9A for easy understanding.

In the cross-sectional views in FIGS. 9B and 9C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, the conductor 604 over the insulator 612, the insulator 610 that is over the semiconductor 606b and has a region in contact with a side surface of the conductor 604, and the insulator 611 that is over the conductor 604 and has a region in contact with a side surface of the conductor 604. The insulator 608 is provided over the insulator 602, the semiconductor 606b, the insulator 612, the insulator 610, the insulator 611, and the conductor 604. The insulator 618 is provided over the insulator 608. Openings that reach the semiconductor 606b are provided in the insulator 618 and the insulator 608, and the conductor 616a and the conductor 616b are connected to the semiconductor 606b through the openings. Although not illustrated, the conductors 616a and 616b may be provided such that at least one of the conductor 616a and the conductor 616b is in contact with the insulator 610. In that case, the distance between the conductor 616a and the conductor 616b can be made small; thus, the on-state current of the transistor can be increased, in some cases. Note that the insulator 611 might not be formed depending on the inclination angle of the side surface of the conductor 604. Moreover, although not illustrated, an insulator having a region in contact with side surfaces of the insulator 606a and the semiconductor 606b might be formed.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

The insulator 602 might have a projection and a depression. For example, a region in contact with at least one of the insulator 606a and the insulator 606c might be a projection, and a region not in contact with the insulators 606a and 606c might be a depression. A region in contact with the insulator 610 might have a thickness between the thickness of the projection and the thickness of the depression. The semiconductor 606b might have a projection and a depression. For example, a region in contact with the insulator 606c might be a projection and a region not in contact with the insulator 606c might be a depression.

Figure 10A:
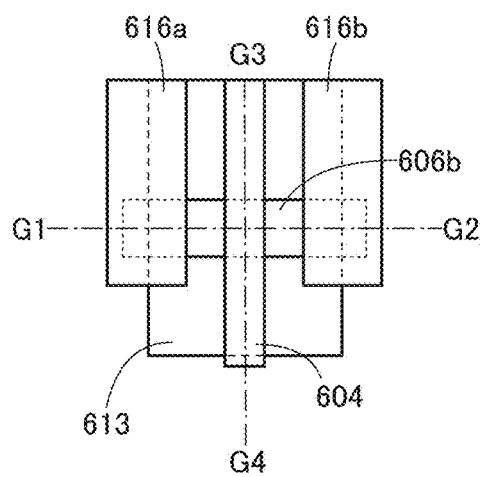
FIGS. 10A to 10C are a top view and cross-sectional views illustrating a transistor of one embodiment of the present invention.
Figure 10C:
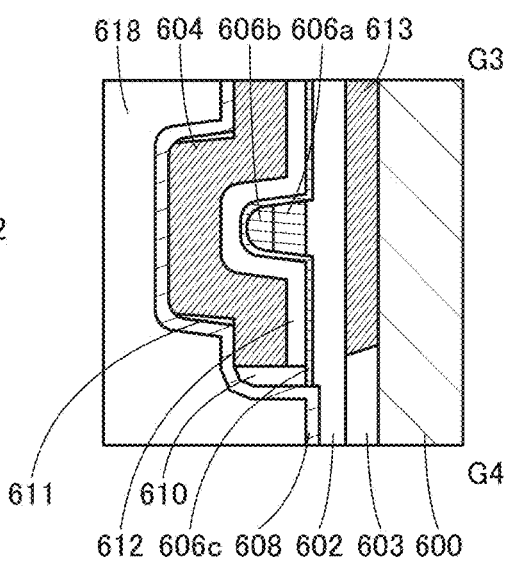
Figure 10B:
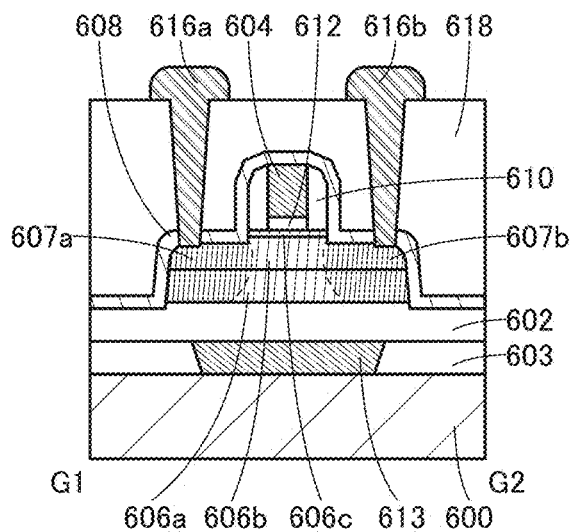

FIGS. 10A to 10C illustrate a structure of a transistor included in a semiconductor device of one embodiment of the present invention. FIG. 10A is a top view of the transistor. FIG. 10B is a cross-sectional view taken along dashed-dotted line G1-G2 in FIG. 10A. FIG. 10C is a cross-sectional view taken along dashed-dotted line G3-G4 in FIG. 10A. Note that some components such as an insulator are not illustrated in FIG. 10A for easy understanding.

In the cross-sectional views in FIGS. 10B and 10C, the transistor includes the insulator 603 and the conductor 613 over the substrate 600, the insulator 602 over the insulator 603 and the conductor 613, the insulator 606a over the insulator 602, the semiconductor 606b over the insulator 606a, the insulator 606c over the semiconductor 606b and the insulator 602, the insulator 612 over the insulator 606c, the conductor 604 over the insulator 612, the insulator 610 that is over the insulator 606c and has a region in contact with a side surface of the conductor 604, and the insulator 611 that is over the conductor 604 and has a region in contact with a side surface of the conductor 604. The insulator 608 is provided over the insulator 602, the semiconductor 606b, the insulator 612, the insulator 610, the insulator 611, and the conductor 604. The insulator 618 is provided over the insulator 608. Openings that reach the semiconductor 606b are provided in the insulator 618 and the insulator 608, and the conductor 616a and the conductor 616b are connected to the semiconductor 606b through the openings. Although not illustrated, the conductors 616a and 616b may be provided such that at least one of the conductor 616a and the conductor 616b is in contact with the insulator 610. In that case, the distance between the conductor 616a and the conductor 616b can be made small; thus, the on-state current of the transistor can be increased, in some cases. Note that the insulator 611 might not be formed depending on the inclination angle of the side surface of the conductor 604. Moreover, although not illustrated, an insulator having a region in contact with side surfaces of the insulator 606a and the semiconductor 606b might be formed.

The insulator 606a and the semiconductor 606b have the region 607a and the region 607b. The region 607a and the region 607b have higher conductivity (lower resistance) than the other regions. Note that the region 607a and the region 607b may be provided only in the insulator 606a or in the semiconductor 606b.

The insulator 602 might have a projection and a depression. For example, a region in contact with at least one of the insulator 606a and the insulator 606c might be a projection, and a region not in contact with the insulators 606a and 606c might be a depression. A region in contact with the insulator 610 might have a thickness between the thickness of the projection and the thickness of the depression. The semiconductor 606b might have a projection and a depression. For example, a region in contact with the insulator 606c might be a projection and a region not in contact with the insulator 606c might be a depression.

The above-described transistor structures are just examples. A novel transistor structure may be employed in which the above-described transistor structures are partly combined with each other.

<Method for Manufacturing Transistor>

A method for manufacturing the transistor illustrated in FIGS. 1A to 1C will be described below.

A conductor, an insulator, or a semiconductor may be deposited by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Depending on a source gas, CVD methods can be classified into a metal CVD (MCVD) method and a metal organic CVD (MOCVD) method.

A PECVD method allows formation of a high quality film at relatively low temperatures. A TCVD method does not use plasma and thus causes less plasma damage to an object. A wiring, an electrode, an element (e.g., transistor or capacitor), or the like included in a semiconductor device might be charged up by receiving electric charges from plasma, for example. In that case, accumulated electric charges might break the wiring, electrode, element, or the like included in the semiconductor device. Such plasma damage is not caused in the case of using a TCVD method; thus, the yield of a semiconductor device can be increased. In addition, since plasma damage does not occur in the deposition by a TCVD method, a film with few defects can be obtained.

An ALD method also causes less plasma damage to an object. Since plasma damage does not occur in the deposition by an ALD method, a film with few defects can be obtained.

Unlike in a deposition method in which particles ejected from a target or the like are deposited, in a CVD method and an ALD method, a film is formed by a reaction at a surface of an object. Thus, a CVD method and an ALD method both can provide favorable step coverage almost regardless of the shape of an object. In particular, an ALD method can provide excellent step coverage and excellent thickness uniformity and thus is favorably used for covering a surface of an opening with a high aspect ratio, for example. On the other hand, an ALD method has a relatively low deposition rate; thus, it is sometimes preferable to combine an ALD method with another deposition method with a high deposition rate, such as a CVD method.

When a CVD method or an ALD method is used, composition of a film to be formed can be controlled with the flow rate ratio of source gases. For example, by the CVD method or the ALD method, a film with a desired composition can be formed by adjusting the flow rate ratio of source gases. Moreover, by a CVD method or an ALD method, a film whose composition is continuously changed can be formed by changing the flow rate ratio of source gases while forming the film. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Here, a method for processing a conductor, an insulator, or a semiconductor is described. As a processing method, any of a variety of fine processing techniques can be used. For example, a method may be used in which a resist mask formed by a photolithography process or the like is subjected to thinning treatment. Alternatively, a method may be used in which a dummy pattern is formed by a photolithography process or the like, the dummy pattern is provided with a sidewall and is then removed, and a conductor, an insulator, or a semiconductor is etched using the remaining sidewall as a resist mask. To achieve a high aspect ratio, anisotropic dry etching is preferably used for the etching of the conductor, the insulator, or the semiconductor. Alternatively, a hard mask formed of an inorganic film or a metal film may be used.

As light used to form the resist mask, for example, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may also be performed by a liquid immersion exposure technique. As light for the exposure, extreme ultra-violet light (EUV) or X-rays may be used. Instead of the light for the exposure, an electron beam can be used. It is preferable to use extreme ultra-violet light (EUV), X-rays, or an electron beam because extremely fine processing can be performed. In the case of performing exposure by scanning of a beam, such as an electron beam, a photomask is not needed.

Before a resist film that is processed into the resist mask is formed, an organic resin film having a function of improving adhesion between the conductor, the insulator, or the semiconductor and the resist film may be formed. The organic resin film can be formed by, for example, a spin coating method to planarize a surface by covering a step thereunder and thus can reduce variation in thickness of the resist mask over the organic resin film. In the case of fine processing, in particular, a material serving as an anti-reflection film against light for the exposure is preferably used for the organic resin film. Examples of such an organic resin film serving as an anti-reflection film include a bottom anti-reflection coating (BARC) film. The removal of the organic resin film may be performed at the same time as the removal of the resist mask or after the removal of the resist mask.

First, the substrate 600 is prepared. An element (semiconductor element, capacitor, or the like) or a wiring layer may be formed over the substrate 600. An insulator may be formed over the substrate 600, the element, or the wiring layer.

Next, an insulator to be the insulator 603 is formed.

After that, oxygen ions may be added so that the insulator to be the insulator 603 contains excess oxygen. The addition of oxygen ions may be performed by an ion implantation method at an acceleration voltage of higher than or equal to 2 kV and lower than or equal to 10 kV at a dose of greater than or equal to $5 \times 10^{14}$ ions/cm$^2$ and less than or equal to $5 \times 10^{16}$ ions/cm$^2$, for example.

Then, the insulator to be the insulator 603 is processed into the insulator 603 having a groove portion.

Next, a conductor to be the conductor 613 is formed.

Figure 11A:
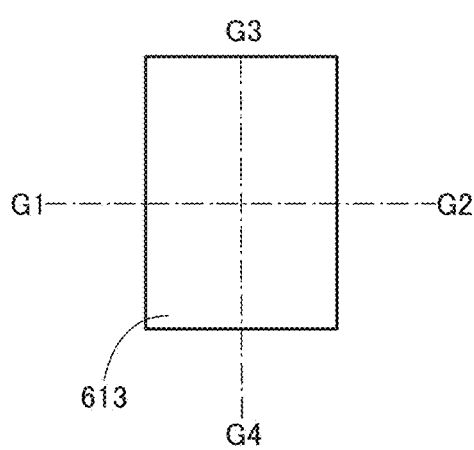
FIGS. 11A to 11C are a top view and cross-sectional views illustrating a transistor of one embodiment of the present invention.
Figure 11C:
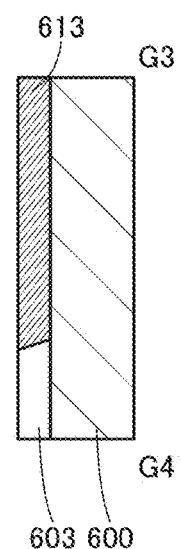
Figure 11B:
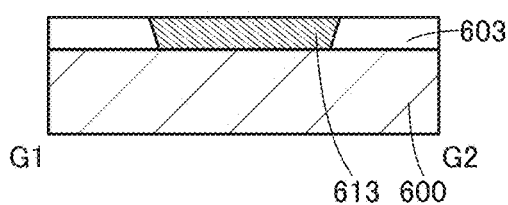

Subsequently, the conductor to be the conductor 613 is processed by a chemical mechanical polishing (CMP) method to form the conductor 613 in the groove portion of the insulator 603 (see FIGS. 11A to 11C). Note that the method is not limited to a CMP method as long as a similar shape can be obtained.

Then, the insulator 602 is formed. Subsequently, an insulator to be the insulator 606a is formed over the insulator 602.

After that, oxygen ions may be added so that the insulator to be the insulator 606a contains excess oxygen. The addition of oxygen ions may be performed by an ion implantation method at an acceleration voltage of higher than or equal to 2 kV and lower than or equal to 10 kV at a dose of greater than or equal to $5 \times 10^{14}$ ions/cm$^2$ and less than or equal to $5 \times 10^{16}$ ions/cm$^2$, for example.

Next, a semiconductor to be the semiconductor 606b is formed. It is preferable that the insulator to be the insulator 606a and the semiconductor to be the semiconductor 606b be successively formed without exposure to the air. In that case, the impurity concentration of a region between the insulator to be the insulator 606a and the semiconductor to be the semiconductor 606b can be reduced.

After that, heat treatment may be performed. The heat treatment can reduce the hydrogen concentration in the insulator to be the insulator 606a and in the semiconductor to be the semiconductor 606b in some cases. Furthermore, the heat treatment can reduce oxygen vacancies in the insulator to be the insulator 606a and in the semiconductor to be the semiconductor 606b in some cases. The heat treatment is performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment in an inert gas atmosphere is performed, and then heat treatment in an atmosphere containing an oxidizing gas at 10 ppm or more, 1% or more, or 10% or more is performed in order to compensate desorbed oxygen. The heat treatment can increase the crystallinity of the insulator to be the insulator 606a and the semiconductor to be the semiconductor 606b and can remove impurities, such as hydrogen and water, for example.

Figure 12A:
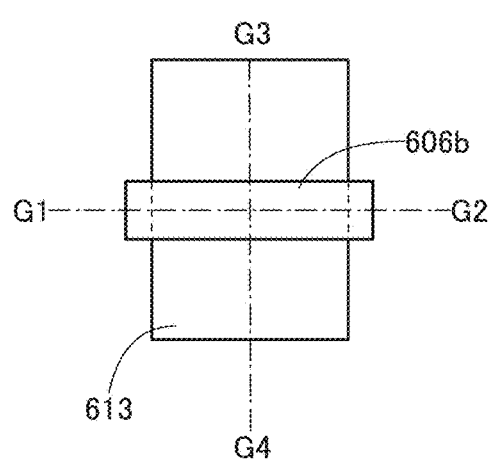
FIGS. 12A to 12C are a top view and cross-sectional views illustrating a transistor of one embodiment of the present invention.
Figure 12C:
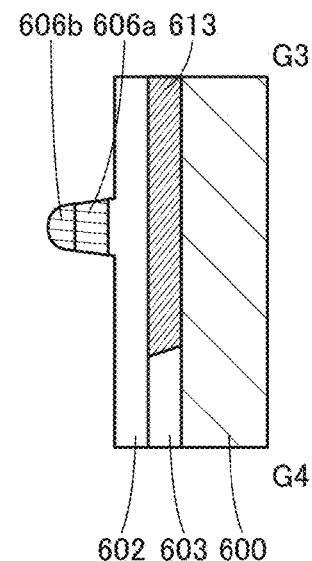
Figure 12B:
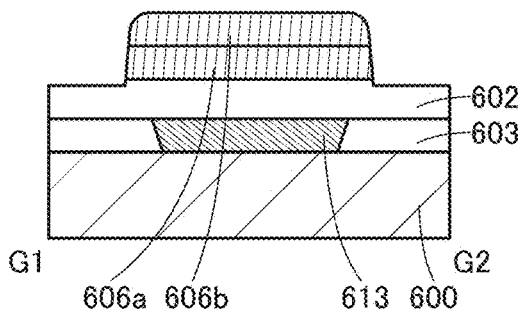

Then, the insulator to be the insulator 606a and the semiconductor to be the semiconductor 606b are processed into the island-shaped insulator 606a and the island-shaped semiconductor 606b, respectively (see FIGS. 12A to 12C).

After that, heat treatment may be performed. The heat treatment can reduce the hydrogen concentration in the insulator 606a and in the semiconductor 606b in some cases. Furthermore, the heat treatment can reduce oxygen vacancies in the insulator 606a and in the semiconductor 606b in some cases. The heat treatment is performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment in an inert gas atmosphere is performed, and then heat treatment in an atmosphere containing an oxidizing gas at 10 ppm or more, 1% or more, or 10% or more is performed in order to compensate desorbed oxygen. The heat treatment can increase the crystallinity of the insulator 606a and the semiconductor 606b and can remove impurities, such as hydrogen and water, for example.

Next, an insulator 636c is formed.

Subsequently, an insulator 622 is formed.

Figure 13A:
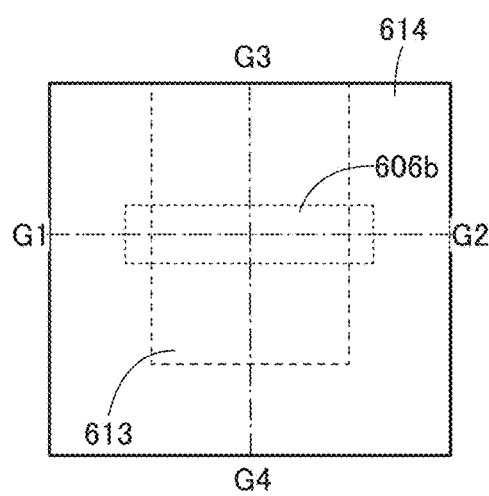
FIGS. 13A to 13C are a top view and cross-sectional views illustrating a transistor of one embodiment of the present invention.
Figure 13C:
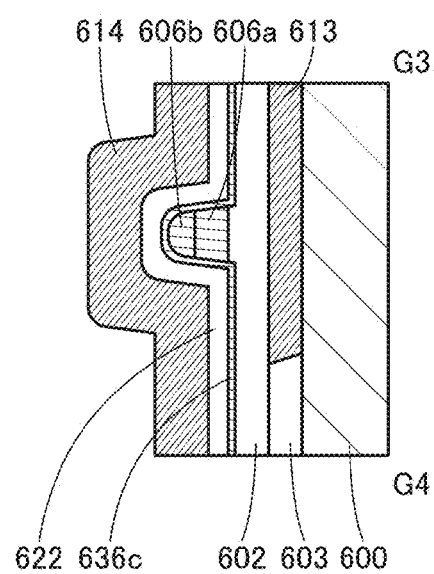
Figure 13B:
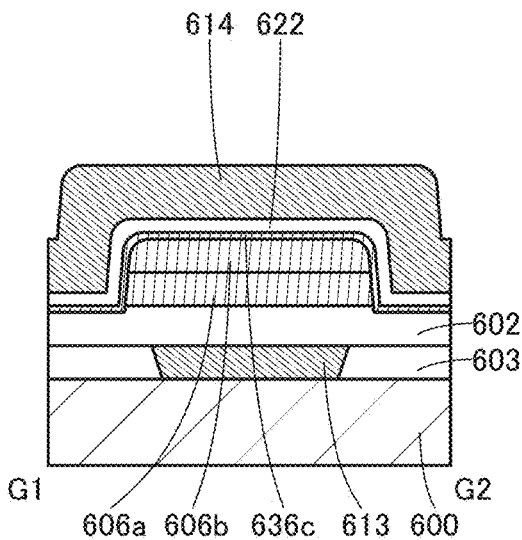

Then, a conductor 614 is formed (see FIGS. 13A to 13C). It is preferable that the insulator 636c, the insulator 622, and the conductor 614 be successively formed without exposure to the air. In that case, the impurity concentration of regions between the insulator 636c and the insulator 622 and between the insulator 622 and the conductor 614 can be reduced.

Figure 14A:
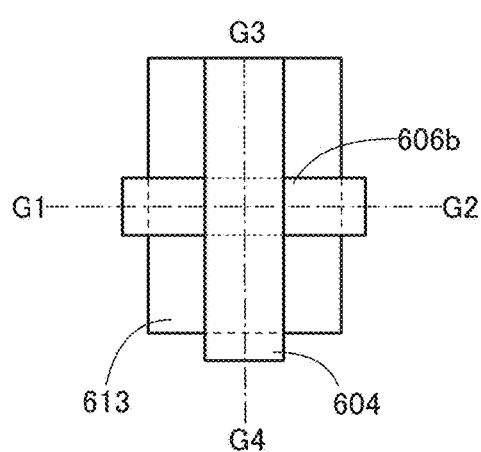
FIGS. 14A to 14C are a top view and cross-sectional views illustrating a transistor of one embodiment of the present invention.
Figure 14C:
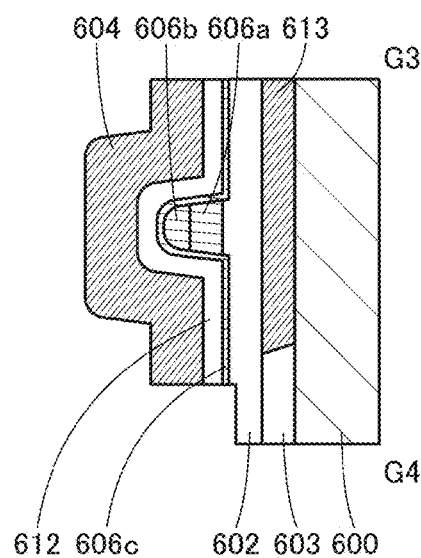
Figure 14B:
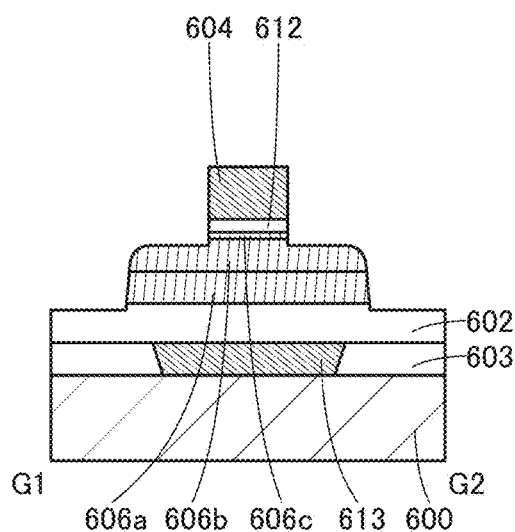

Next, the insulator 636c, the insulator 622, and the conductor 614 are processed into the insulator 606c, the insulator 612, and the conductor 604, respectively (see FIGS. 14A to 14C).

Figure 15A:
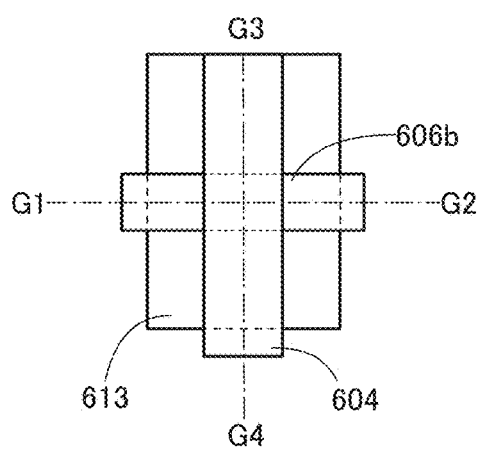
FIGS. 15A to 15C are a top view and cross-sectional views illustrating a transistor of one embodiment of the present invention.
Figure 15C:
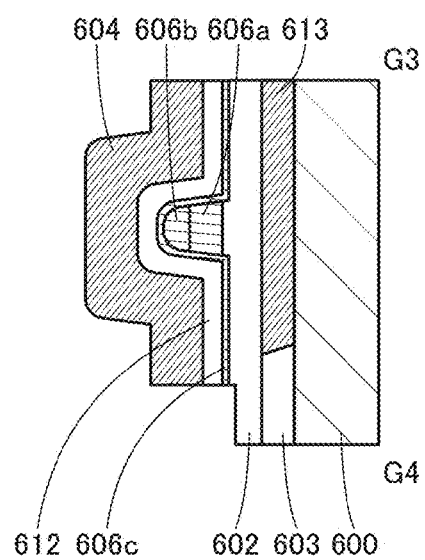
Figure 15B:
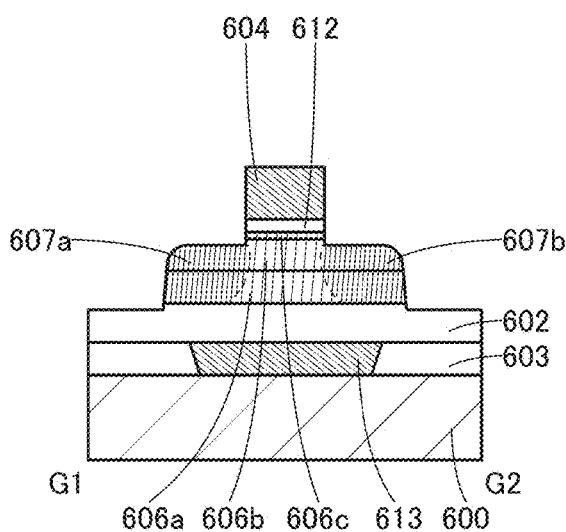

After that, a dopant is added to form the regions 607a and 607b in the insulator 606a and the semiconductor 606b (see FIGS. 15A to 15C). The dopant is hardly added to a region below the conductor 604 because the conductor 604 and the like serve as shields. This means that the regions 607a and 607b can be formed in a self-aligned manner.

For the dopant addition, an ion implantation method by which an ionized source gas is subjected to mass separation and then added, an ion doping method by which an ionized source gas is added without mass separation, or the like can be used. In the case of performing mass separation, ion species to be added and its concentration can be controlled properly. In contrast, in the case of not performing mass separation, ions at a high concentration can be added in a short time. Alternatively, an ion implantation method or an ion doping method in which atomic or molecular clusters are generated and ionized may be employed. Note that the term "dopant" may be changed into the term "ion," "donor," "acceptor," "impurity," or "element."

The dopant addition may be controlled by setting the addition conditions such as the acceleration voltage and the dose as appropriate. The dose of the dopant is, for example, greater than or equal to $1 \times 10^{12}$ ions/cm$^2$ and less than or equal to $1 \times 10^{16}$ ions/cm$^2$, and preferably greater than or equal to $1 \times 10^{13}$ ions/cm$^2$ and less than or equal to $1 \times 10^{15}$ ions/cm$^2$. The acceleration voltage at the time of the dopant addition is higher than or equal to 2 kV and lower than or equal to 50 kV, and preferably higher than or equal to 5 kV and lower than or equal to 30 kV.

The dopant may be added while heating at, for example, 200° C. or higher and 700° C. or lower, preferably 300° C. or higher and 500° C. or lower, and further preferably 350° C. or higher and 450° C. or lower.

Examples of the dopant include helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Among these elements, helium, neon, argon, krypton, xenon, nitrogen, fluorine, phosphorus, chlorine, arsenic, and boron are preferable because these elements can be added relatively easily by an ion implantation method, an ion doping method, or the like.

Heat treatment may be performed after the dopant addition. The heat treatment may be performed at 250° C. or higher and 650° C. or lower and preferably 350° C. or higher and 450° C. or lower in a nitrogen atmosphere, or under reduced pressure or air (ultra dry air), for example.

In part of the insulator 606a and the semiconductor 606b to which the dopant is added, a region with a spinel crystal structure is formed by the impact of the dopant addition.

Although ion addition by an ion implantation method or ion doping treatment can be performed at a specific angle (e.g., a right angle) with respect to a sample surface, any of the methods described with reference to FIGS. 24A1, 24A2, 24B, and 24C can be employed. FIGS. 24A1, 24A2, 24B, and 24C each schematically illustrate the state where one ion is incident on a sample surface at an angle θ and an angle φ.

The x-axis, the y-axis, and the z-axis in each of FIGS. 24A1, 24A2, 24B, and 24C are straight lines intersecting with each other at an incident point of a certain ion. The x-axis is a given straight line on the sample surface. The y-axis is a straight line that is on the sample surface and intersects with the x-axis at right angles. The z-axis is the normal to the sample surface that passes through the incident point. The angle θ is an angle formed by the ion incident direction and the z-axis in a cross-sectional direction. The angle φ is an angle formed by the ion incident direction and the x-axis when seen from the top.

In the case where an ion is incident on the sample surface at a specific angle (θ, φ) using an object as a mask, the ion can also be added to part of the sample under the object.

In the case where an ion is incident on the sample surface only at a specific angle (θ, φ), a region where the ion is not added might exist on the opposite side of the ion incident side, because of the height of the object. A region where an ion is not added can be referred to as the shade of an object. For this reason, the ion is preferably incident at a plurality of angles, in which case an influence of the shade on the sample surface can be reduced.

As illustrated in FIGS. 24A1 and 24A2, the ion is preferably incident on the sample surface at a first angle (θ, φ) and then incident thereon at a second angle (θ, φ). Note that at least one of the angles θ and ϕ of the first angle (θ, ϕ) is different from that of the second angle (θ, ϕ).

The angle θ of the first angle (θ, ϕ) is, for example, greater than or equal to 10° and less than or equal to 60°, preferably greater than or equal to 15° and less than or equal to 45°, and further preferably greater than or equal to 20° and less than or equal to 40°. The angle θ of the second angle (θ, ϕ) is, for example, greater than or equal to 10° and less than or equal to 60°, preferably greater than or equal to 15° and less than or equal to 45°, and further preferably greater than or equal to 20° and less than or equal to 40°. Note that the angle θ of the second angle (θ, ϕ) and the angle θ of the first angle (θ, ϕ) are symmetric about the z-axis. Thus, the angle θ of the second angle (θ, ϕ) can be expressed by negative values. Specifically, the angle θ of the second angle (θ, ϕ) can be, for example, greater than or equal to −60° and less than or equal to −10°, preferably greater than or equal to −45° and less than or equal to −15°, and further preferably greater than or equal to −40° and less than or equal to −20°.

The angle ϕ of the second angle (θ, ϕ) is larger than the angle ϕ of the first angle (θ, ϕ) by 90° or more and 270° or less and preferably 135° or more and 225° or less, for example, and specifically by 180°. Note that the ranges of the first angle (θ, ϕ) and the second angle (θ, ϕ) described here are just examples, and are not limited to the above ranges.

The ion incident angle is not limited to the two kinds of angles: the first angle (θ, ϕ) and the second angle (θ, ϕ). For example, the ion incident angle may be the first angle (θ, ϕ) to an n-th angle (θ, ϕ) (n is a natural number of 2 or more). The angles θ and/or the angles ϕ of the first angle (θ, ϕ) to the n-th angle (θ, ϕ) are different angles.

Alternatively, the ion may be incident on the sample surface at the first angle (θ, ϕ) and then scanning in the θ direction (also referred to as θ scanning) may be performed from the first angle (θ, ϕ) to the second angle (θ, ϕ) such that the angle θ passes through 0°, as illustrated in FIG. 24B. Note that the ion incident angle ϕ is not limited to one kind of angle and may be a first angle ϕ to an n-th angle ϕ (n is a natural number of 2 or more).

The angle θ of the first angle (θ, ϕ) is, for example, greater than or equal to 10° and less than or equal to 60°, preferably greater than or equal to 15° and less than or equal to 45°, and further preferably greater than or equal to 20° and less than or equal to 40°. The angle θ of the second angle (θ, ϕ) is, for example, greater than or equal to 10° and less than or equal to 60°, preferably greater than or equal to 15° and less than or equal to 45°, and further preferably greater than or equal to 20° and less than or equal to 40°. The angle θ of the first angle (θ, ϕ) may be equal to the angle θ of the second angle (θ, ϕ).

Note that the ϕ scanning may be performed continuously or stepwise, that is, in steps of, for example, 0.5°, 1°, 2°, 3°, 4°, 5°, 6°, 10°, 12°, 18°, 20°, 24°, or 30°.

Alternatively, the ion may incident on the sample surface at the first angle (θ, ϕ) and then scanning in the ω direction (also referred to as ω scanning) may be performed so that the ion incident angle is changed from the first angle (θ, ϕ) to the second angle (θ, ϕ) as illustrated in FIG. 24C. Note that the ion incident angle θ is not limited to one kind of angle and may be any of a first angle θ to an n-th angle θ (n is a natural number of 2 or more).

The angle θ of the first angle (θ, ϕ) and the second angle (θ, ϕ) is, for example, greater than or equal to 10° and less than or equal to 60°, preferably greater than or equal to 15° and less than or equal to 45°, and further preferably greater than or equal to 20° and less than or equal to 40°. The angle ϕ of the first angle (θ, ϕ) may be equal to the angle ϕ of the second angle (θ, ϕ).

Note that the ϕ scanning may be performed continuously or stepwise, that is, in steps of, for example, 0.5°, 1°, 2°, 3°, 4°, 5°, 6°, 10°, 12°, 18°, 20°, 24°, or 30°.

Although not illustrated, the θ scanning and the ϕ scanning may be performed in combination.

With the use of any of the methods described with reference to FIGS. 24A1, 24A2, 24B, and 24C, the regions 607a and 607b can be formed not only in a region not overlapping with the conductor 604 but also in a region partly overlapping with the conductor 604. In that case, an offset region having high resistance is not formed between the channel formation region and each of the region 607a and the region 607b, leading to an increase in the on-state current of the transistor.

In the above-described manner, the transistor illustrated in FIGS. 1A to 1C can be manufactured.

Next, a method for manufacturing the transistor illustrated in FIGS. 5A to 5C will be described.

First, the substrate 600 is prepared.

Next, an insulator to be the insulator 603 is formed.

After that, oxygen ions may be added so that the insulator to be the insulator 603 contains excess oxygen. The addition of oxygen ions may be performed by an ion implantation method at an acceleration voltage of higher than or equal to 2 kV and lower than or equal to 10 kV at a dose of greater than or equal to $5 \times 10^{14}$ ions/cm$^2$ and less than or equal to $5 \times 10^{16}$ ions/cm$^2$, for example.

Then, the insulator to be the insulator 603 is processed into the insulator 603 having a groove portion.

Next, a conductor to be the conductor 613 is formed.

Figure 16A:
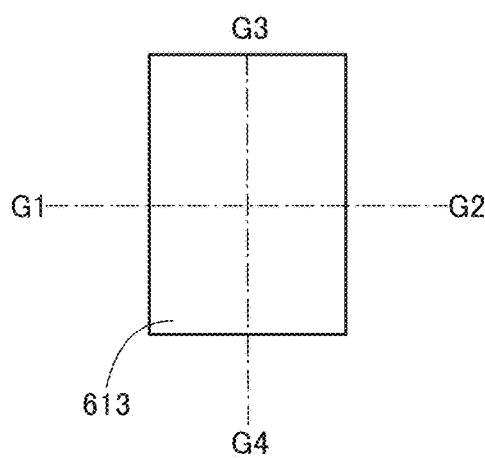
FIGS. 16A to 16C are a top view and cross-sectional views illustrating a transistor of one embodiment of the present invention.
Figure 16C:
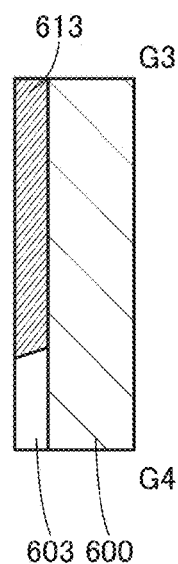
Figure 16B:
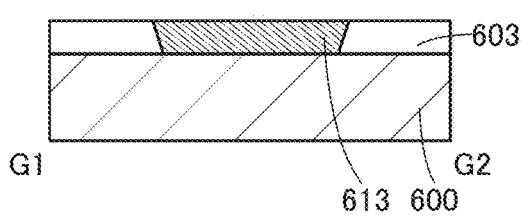

Subsequently, the conductor to be the conductor 613 is processed by a CMP method to form the conductor 613 in the groove portion of the insulator 603 (see FIGS. 16A to 16C). Note that the method is not limited to a CMP method as long as a similar shape can be obtained.

Then, the insulator 602 is formed. Subsequently, an insulator to be the insulator 606a is formed over the insulator 602.

After that, oxygen ions may be added so that the insulator to be the insulator 606a contains excess oxygen. The addition of oxygen ions may be performed by an ion implantation method at an acceleration voltage of higher than or equal to 2 kV and lower than or equal to 10 kV at a dose of greater than or equal to $5 \times 10^{14}$ ions/cm$^2$ and less than or equal to $5 \times 10^{16}$ ions/cm$^2$, for example.

Next, a semiconductor to be the semiconductor 606b is formed. It is preferable that the insulator to be the insulator 606a and the semiconductor to be the semiconductor 606b be successively formed without exposure to the air. In that case, the impurity concentration of a region between the insulator to be the insulator 606a and the semiconductor to be the semiconductor 606b can be reduced.

After that, heat treatment may be performed. The heat treatment can reduce the hydrogen concentration in the insulator to be the insulator 606a and in the semiconductor to be the semiconductor 606b in some cases. Furthermore, the heat treatment can reduce oxygen vacancies in the insulator to be the insulator 606a and in the semiconductor to be the semiconductor 606b in some cases. The heat treatment is performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment in an inert gas atmosphere is performed, and then heat treatment in an atmosphere containing an oxidizing gas at 10 ppm or more, 1% or more, or 10% or more is performed in order to compensate desorbed oxygen. The heat treatment can increase the crystallinity of the insulator to be the insulator 606a and the semiconductor to be the semiconductor 606b and can remove impurities, such as hydrogen and water, for example.

Figure 17A:
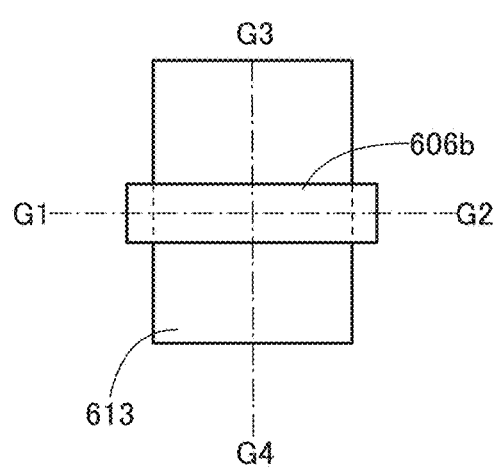
FIGS. 17A to 17C are a top view and cross-sectional views illustrating a transistor of one embodiment of the present invention.
Figure 17C:
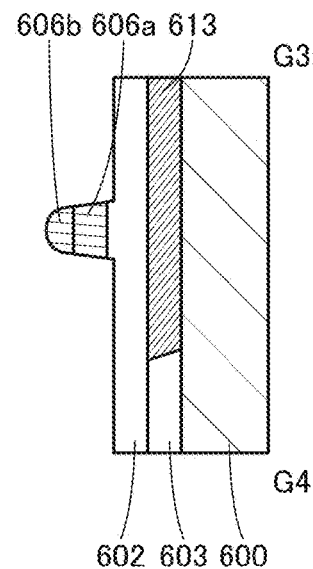
Figure 17B:
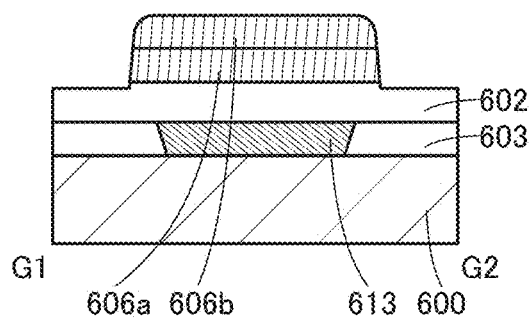

Then, the insulator to be the insulator 606a and the semiconductor to be the semiconductor 606b are processed into the island-shaped insulator 606a and the island-shaped semiconductor 606b, respectively (see FIGS. 17A to 17C).

After that, heat treatment may be performed. The heat treatment can reduce the hydrogen concentration in the insulator 606a and in the semiconductor 606b in some cases. Furthermore, the heat treatment can reduce oxygen vacancies in the insulator 606a and in the semiconductor 606b in some cases. The heat treatment is performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment in an inert gas atmosphere is performed, and then heat treatment in an atmosphere containing an oxidizing gas at 10 ppm or more, 1% or more, or 10% or more is performed in order to compensate desorbed oxygen. The heat treatment can increase the crystallinity of the insulator 606a and the semiconductor 606b and can remove impurities, such as hydrogen and water, for example.

Next, the insulator 636c is formed.

Subsequently, the insulator 622 is formed.

Figure 18A:
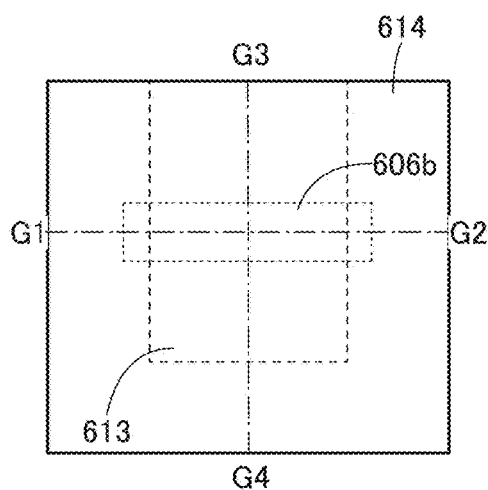
FIGS. 18A to 18C are a top view and cross-sectional views illustrating a transistor of one embodiment of the present invention.
Figure 18C:
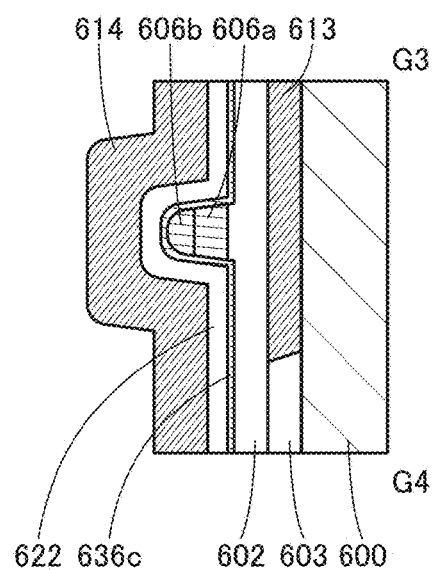
Figure 18B:
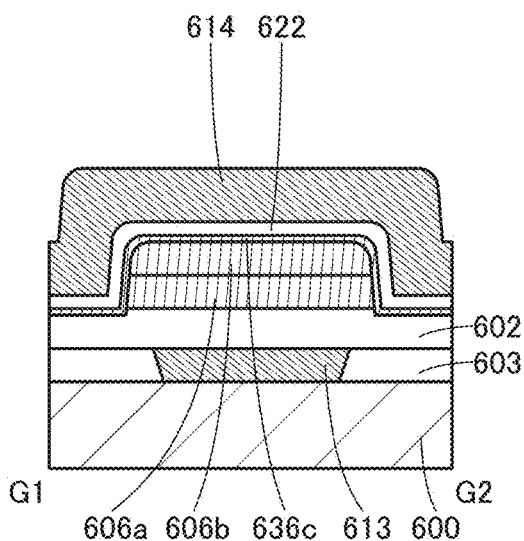

Then, the conductor 614 is formed (see FIGS. 18A to 18C). It is preferable that the insulator 636c, the insulator 622, and the conductor 614 be successively formed without exposure to the air. In that case, the impurity concentration of regions between the insulator 636c and the insulator 622 and between the insulator 622 and the conductor 614 can be reduced.

Figure 19A:
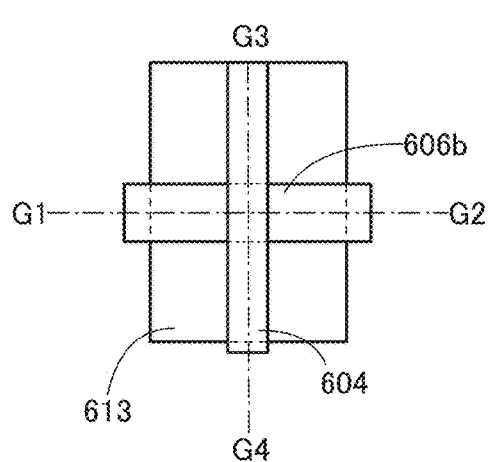
FIGS. 19A to 19C are a top view and cross-sectional views illustrating a transistor of one embodiment of the present invention.
Figure 19C:
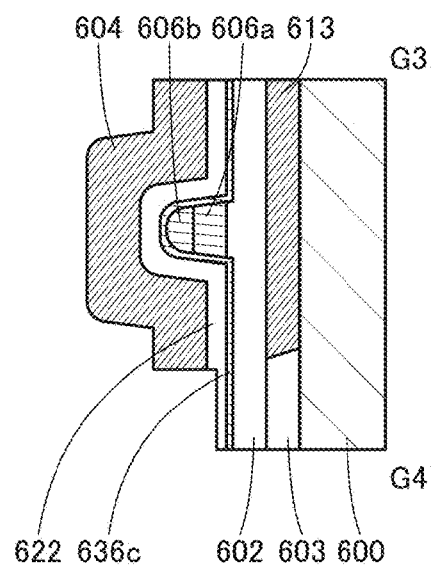
Figure 19B:
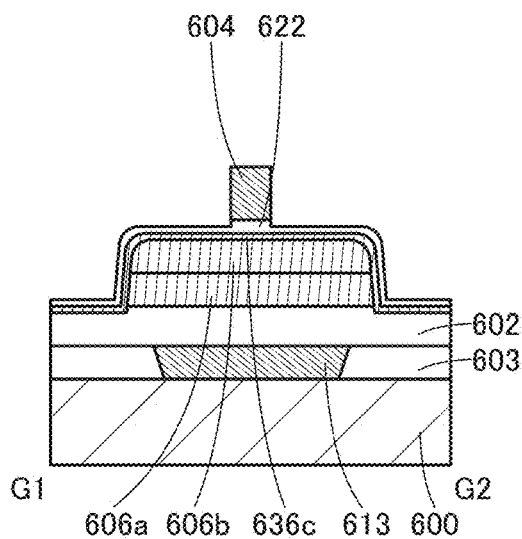

Next, the conductor 614 is processed into the conductor 604 (see FIGS. 19A to 19C).

After that, an insulator to be the insulators 610 and 611 is formed.

Figure 20A:
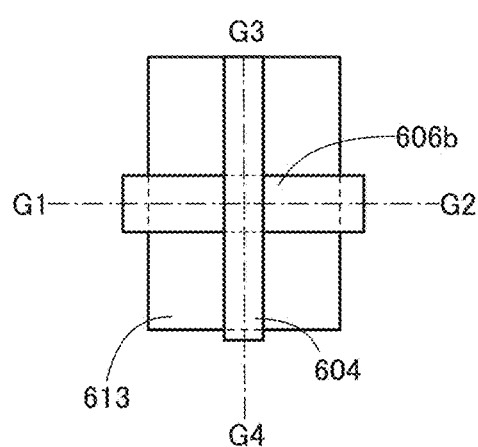
FIGS. 20A to 20C are a top view and cross-sectional views illustrating a transistor of one embodiment of the present invention.
Figure 20C:
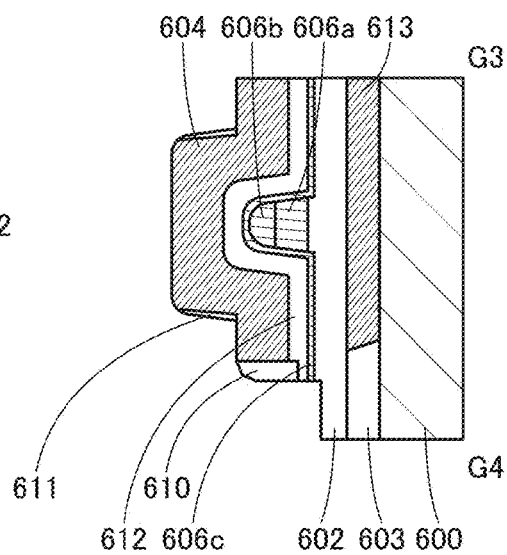
Figure 20B:
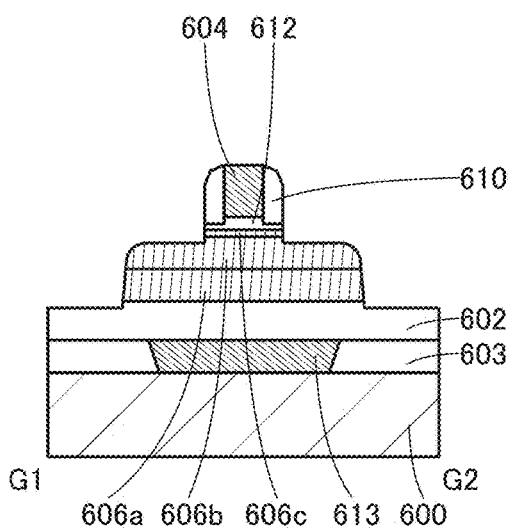

Subsequently, the insulator to be the insulators 610 and 611 is anisotropically etched such that the insulator partly remains on the side surfaces of the conductor 604, whereby the insulators 610 and 611 can be formed (see FIGS. 20A to 20C). The insulator 622 and the insulator 636c are also etched at the time of formation of the insulators 610 and 611, whereby the insulator 612 and the insulator 606c are formed.

Figure 21A:
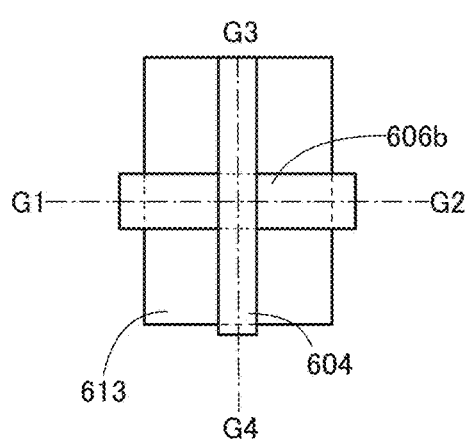
FIGS. 21A to 21C are a top view and cross-sectional views illustrating a transistor of one embodiment of the present invention.
Figure 21C:
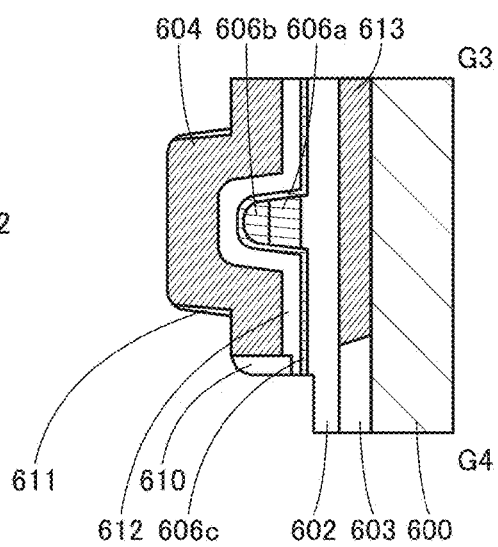
Figure 21B:
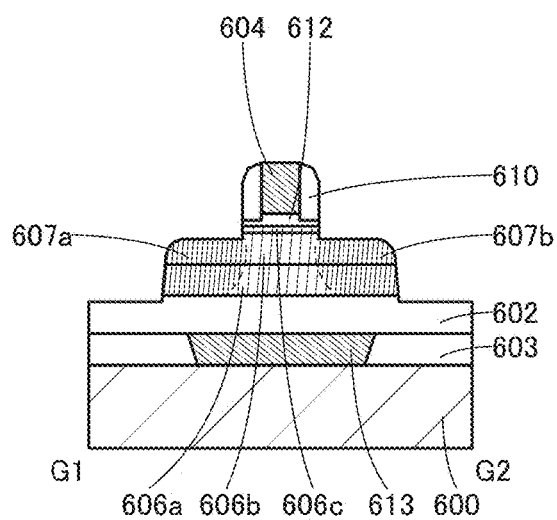

After that, a dopant is added to form the regions 607a and 607b in the insulator 606a and the semiconductor 606b (see FIGS. 21A to 21C). The dopant is hardly added to a region below the conductor 604 and the insulator 610 because the conductor 604, the insulator 610, and the like serve as shields. This means that the regions 607a and 607b can be formed in a self-aligned manner.

For the dopant addition, an ion implantation method by which an ionized source gas is subjected to mass separation and then added, an ion doping method by which an ionized source gas is added without mass separation, or the like can be used. In the case of performing mass separation, ion species to be added and its concentration can be controlled properly. In contrast, in the case of not performing mass separation, ions at a high concentration can be added in a short time. Alternatively, an ion implantation method or an ion doping method in which atomic or molecular clusters are generated and ionized may be employed. Note that the term "dopant" may be changed into the term "ion," "donor," "acceptor," "impurity," or "element."

The dopant addition may be controlled by setting the addition conditions such as the acceleration voltage and the dose as appropriate. The dose of the dopant is, for example, greater than or equal to $1\times10^{12}$ ions/cm$^2$ and less than or equal to $1\times10^{16}$ ions/cm$^2$, preferably greater than or equal to $1\times10^{13}$ ions/cm$^2$ and less than or equal to $1\times10^{15}$ ions/cm$^2$. The acceleration voltage at the time of the dopant addition is higher than or equal to 2 kV and lower than or equal to 50 kV, preferably higher than or equal to 5 kV and lower than or equal to 30 kV.

The dopant may be added while heating at, for example, 200° C. or higher and 700° C. or lower, preferably 300° C. or higher and 500° C. or lower, and further preferably 350° C. or higher and 450° C. or lower.

As the dopant, for example, hydrogen, helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten are given. Among these elements, helium, neon, argon, krypton, xenon, nitrogen, fluorine, phosphorus, chlorine, arsenic, and boron are preferable because these elements can be added relatively easily by an ion implantation method, an ion doping method, or the like.

After the dopant addition, heat treatment may be performed. The heat treatment may be performed at higher than or equal to 250° C. and lower than or equal to 650° C., preferably higher than or equal to 350° C. and lower than or equal to 450° C. in a nitrogen atmosphere, or under reduced pressure or air (ultra dry air), for example.

In part of the insulator 606a and the semiconductor 606b to which the dopant is added, a region with a spinel crystal structure is formed by the impact of the dopant addition.

Ion addition by an ion implantation method or ion doping treatment can be performed at a specific angle (e.g., a right angle) with respect to a sample surface. For example, any of the methods described with reference to FIGS. 24A1, 24A2, 24B, and 24C can be employed.

In the above-described manner, the transistor illustrated in FIGS. 5A to 5C can be manufactured.

<Circuit>

An example of a circuit of a semiconductor device of one embodiment of the present invention will be described.

<CMOS Inverter>

Figure 25A:
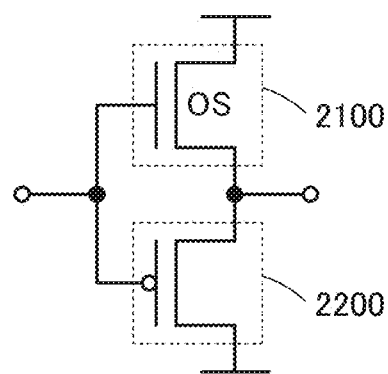
FIGS. 25A and 25B are circuit diagrams each illustrating a semiconductor device of one embodiment of the present invention.

A circuit diagram in FIG. 25A shows a configuration of what is called a CMOS inverter in which a p-channel transistor 2200 and an n-channel transistor 2100 are connected to each other in series and in which gates of them are connected to each other.

<Structure 1 of Semiconductor Device>

FIGS. 26A to 26C are cross-sectional views illustrating the semiconductor device of FIG. 25A. The semiconductor device shown in FIGS. 26A to 26C includes the transistor 2200 and the transistor 2100. The transistor 2100 is placed above the transistor 2200. Any of the above-described transistors can be used as the transistor 2100. Thus, the description regarding the above-mentioned transistors is referred to for the transistor 2100 as appropriate. Note that FIGS. 26A to 26C are cross-sectional views of different portions.

The transistor 2200 shown in FIGS. 26A to 26C is a transistor including a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 functions as a gate insulator. The conductor 454 functions as a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIGS. 26A to 26C includes an insulator 464, an insulator 466, an insulator 468, an insulator 422, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 490, the insulator 602, an insulator 492, an insulator 428, an insulator 409, and an insulator 494.

The insulator 422, the insulator 428, and the insulator 409 have barrier properties. This means that the semiconductor device illustrated in FIGS. 26A to 26C has a structure in which the transistor 2100 is surrounded by insulators having barrier properties. Note that one or more of the insulator 422, the insulator 428, and the insulator 409 are not necessarily provided.

The insulator 464 is placed over the transistor 2200. The insulator 466 is placed over the insulator 464. The insulator 468 is placed over the insulator 466. The insulator 490 is placed over the insulator 468. The transistor 2100 is placed over the insulator 490. The insulator 492 is placed over the transistor 2100. The insulator 494 is placed over the insulator 492.

The insulator 464 includes an opening reaching the region 472a, an opening reaching the region 472b, and an opening reaching the conductor 454. In the openings, the conductor 480a, the conductor 480b, and the conductor 480c are provided.

The insulator 466 includes an opening reaching the conductor 480a, an opening reaching the conductor 480b, and an opening reaching the conductor 480c. In the openings, the conductor 478a, the conductor 478b, and the conductor 478c are provided.

The insulator 468 and the insulator 422 include an opening reaching the conductor 478b and an opening reaching the conductor 478c. In the openings, the conductor 476a and the conductor 476b are provided.

The insulator 490 includes an opening overlapping with a channel formation region of the transistor 2100, an opening reaching the conductor 476a, and an opening reaching the conductor 476b. In the openings, the conductor 474a, the conductor 474b, and the conductor 474c are provided.

The conductor 474a may function as a gate electrode of the transistor 2100. The electrical characteristics of the transistor 2100, such as the threshold voltage, may be controlled by application of a predetermined potential to the conductor 474a, for example. The conductor 474a may be electrically connected to the conductor 604 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable.

The insulator 409 and the insulator 492 include the opening reaching the conductor 474b through the region 607b that is one of the source and the drain of the transistor 2100, the opening reaching the region 607a that is the other of the source and the drain of the transistor 2100, the opening reaching the conductor 604 that is the gate electrode of the transistor 2100, and the opening reaching the conductor 474c. In the openings, the conductor 496a, the conductor 496b, the conductor 496c, and the conductor 496d are provided. Note that in some cases, an opening provided in a component of the transistor 2100 or the like is positioned between openings provided in other components.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are provided.

The insulators 464, 466, 468, 490, 492, and 494 may be formed using the same or different materials. The insulators 464, 466, 468, 490, 492, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulators 464, 466, 468, 490, 492, and 494 may each be formed using, for example, one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

At least one of the insulators 464, 466, 468, 490, 492, and 494 preferably includes an insulator having a barrier property.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480*a*, the conductor 480*b*, the conductor 480*c*, the conductor 478*a*, the conductor 478*b*, the conductor 478*c*, the conductor 476*a*, the conductor 476*b*, the conductor 474*a*, the conductor 474*b*, the conductor 474*c*, the conductor 496*a*, the conductor 496*b*, the conductor 496*c*, the conductor 496*d*, the conductor 498*a*, the conductor 498*b*, and the conductor 498*c* may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used. At least one of the conductors 480*a*, 480*b*, 480*c*, 478*a*, 478*b*, 478*c*, 476*a*, 476*b*, 474*a*, 474*b*, 474*c*, 496*a*, 496*b*, 496*c*, 496*d*, 498*a*, 498*b*, and 498*c* preferably includes a conductor having a barrier property.

Figure 27A:
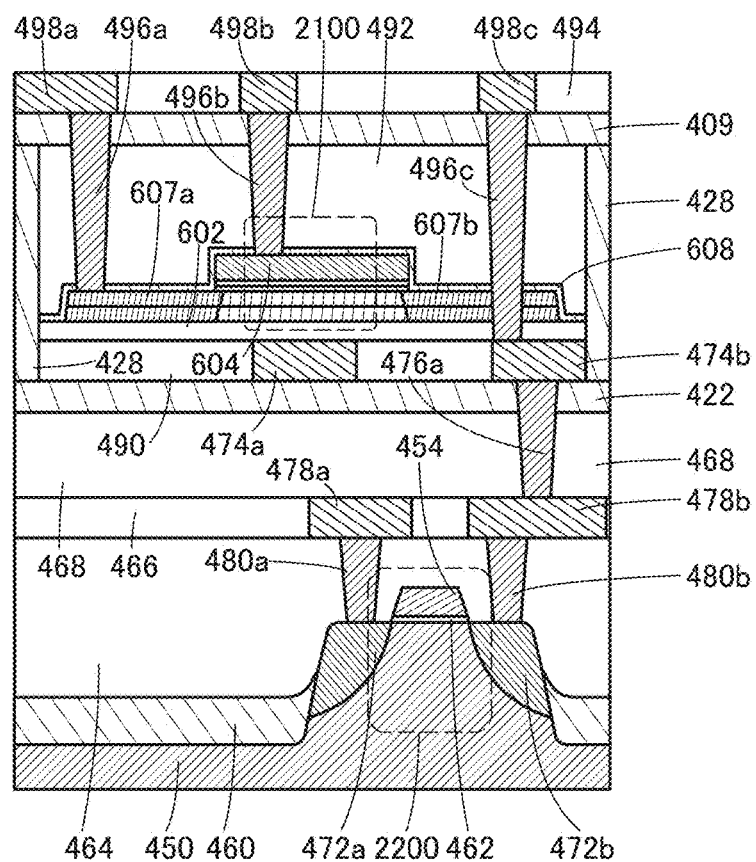
FIGS. 27A to 27C are cross-sectional views illustrating a semiconductor device of one embodiment of the present invention.
Figure 27B:
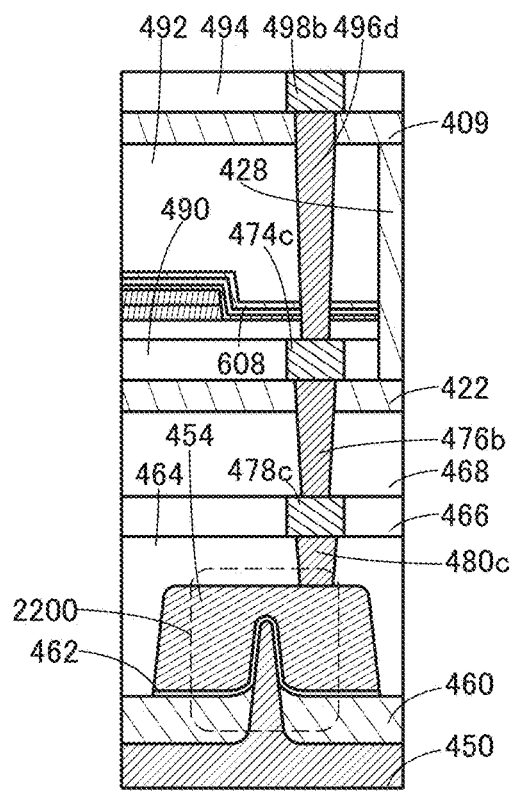
Figure 27C:
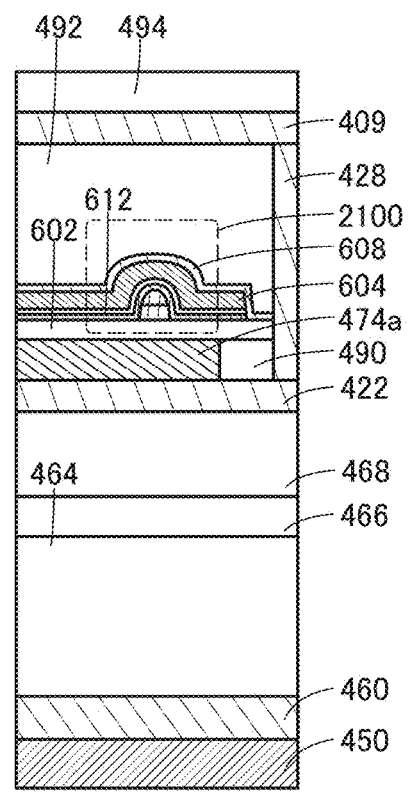

Note that a semiconductor device in FIGS. 27A to 27C is the same as the semiconductor device in FIGS. 26A to 26C except for the structure of the transistor 2200. Therefore, the description of the semiconductor device in FIGS. 26A to 26C is referred to for the semiconductor devices in FIGS. 27A to 27C. In the semiconductor devices in FIGS. 27A to 27C, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved. Note that FIGS. 27A to 27C are cross-sectional views of different portions.

Note that a semiconductor device in FIGS. 28A to 28C is the same as the semiconductor device in FIGS. 26A to 26C except for the structure of the transistor 2200. Therefore, the description of the semiconductor device in FIGS. 26A to 26C is referred to for the semiconductor device in FIGS. 28A to 28C. Specifically, in the semiconductor device in FIGS. 28A to 28C, the transistor 2200 is formed in an SOI substrate. In the structure in FIGS. 28A to 28C, a region 456 is apart from the semiconductor substrate 450 with an insulator 452 provided therebetween. Since the SOI substrate is used, a punch-through phenomenon and the like can be suppressed; thus, the off-state characteristics of the transistor 2200 can be improved. Note that the insulator 452 can be formed by turning part of the semiconductor substrate 450 into an insulator. For example, silicon oxide can be used as the insulator 452. Note that FIGS. 28A to 28C are cross-sectional views of different portions.

In each of the semiconductor devices shown in FIGS. 26A to 26C, FIGS. 27A to 27C, and FIGS. 28A to 28C, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 25B:
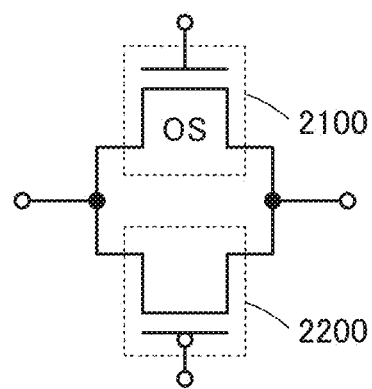

A circuit diagram in FIG. 25B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 29A:
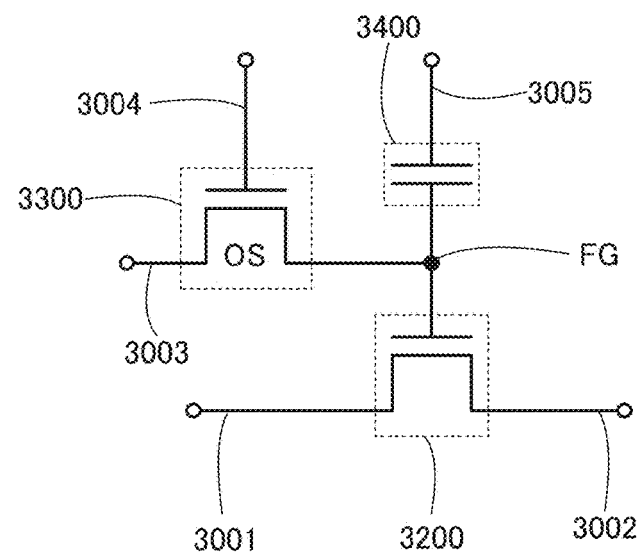
FIGS. 29A and 29B are circuit diagrams each illustrating a memory device of one embodiment of the present invention.
Figure 29B:
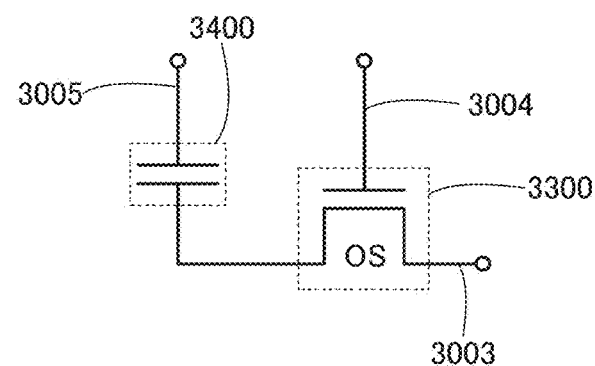

An example of a semiconductor device (memory device) which includes the transistor of one embodiment of the present invention, which can retain stored data even when not powered, and which has an unlimited number of write cycles is shown in FIGS. 29A and 29B.

The semiconductor device illustrated in FIG. 29A includes a transistor 3200 using a first semiconductor, a transistor 3300 using a second semiconductor, and a capacitor 3400. Note that the above-described transistor can be used as the transistor 3300.

Note that the transistor 3300 is preferably a transistor with a low off-state current. For example, a transistor including an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 29A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 29A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an "off state" regardless of the electric charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the electric charge supplied to the node FG, that is, a potential higher than $V_{th\_L}$ to the fifth wiring 3005 of memory cells from which data is not read may be employed.

<Structure 2 of Semiconductor Device>

Figure 30A:
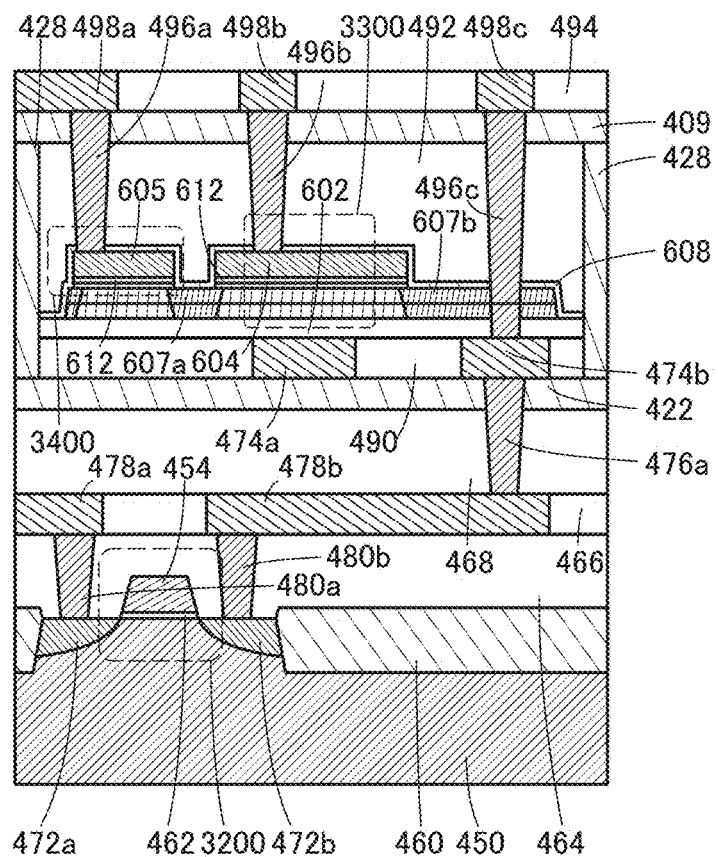
FIGS. 30A to 30C are cross-sectional views illustrating a semiconductor device of one embodiment of the present invention.
Figure 30B:
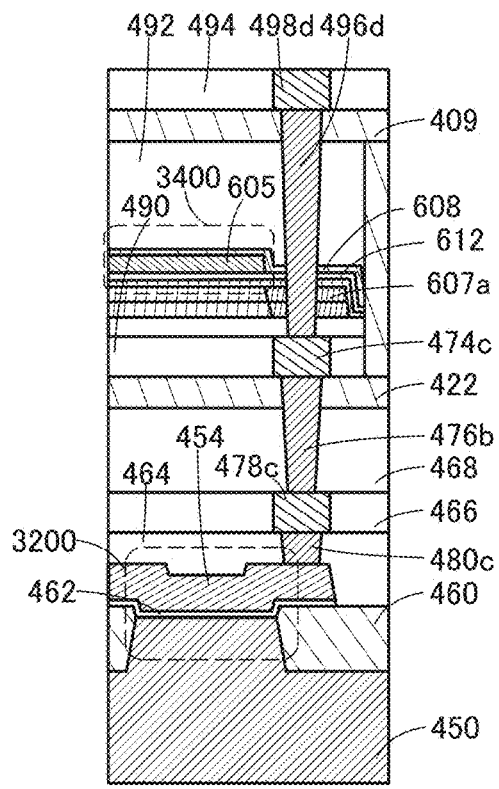
Figure 30C:
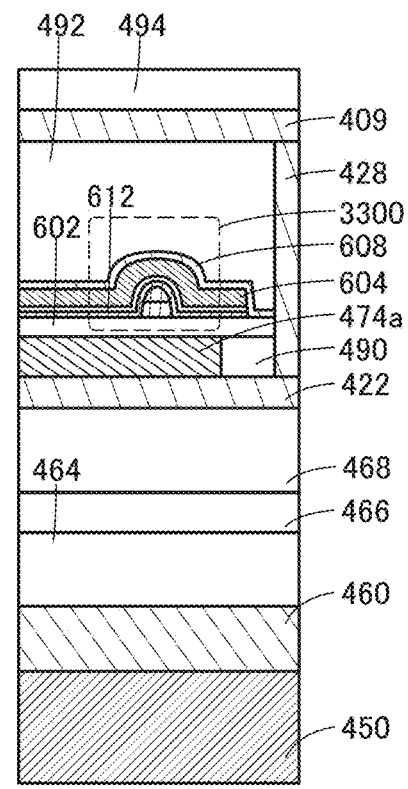

FIGS. 30A to 30C are cross-sectional views illustrating the semiconductor device of FIG. 29A. The semiconductor device shown in FIGS. 30A to 30C includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIGS. 26A to 26C is referred to. Note that although the transistor 2200 is illustrated as a p-channel transistor in FIGS. 26A to 26C, the transistor 3200 may be an n-channel transistor. Note that FIGS. 30A to 30C are cross-sectional views of different portions.

The transistor 3200 illustrated in FIGS. 30A to 30C is a transistor including the semiconductor substrate 450. The transistor 3200 includes the region 472a in the semiconductor substrate 450, the region 472b in the semiconductor substrate 450, the insulator 462, and the conductor 454.

The semiconductor device illustrated in FIGS. 30A to 30C includes the insulator 464, the insulator 466, the insulator 468, the insulator 422, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, a conductor 498d, the insulator 490, the insulator 602, the insulator 492, the insulator 428, the insulator 409, and the insulator 494.

The insulator 422, the insulator 428, and the insulator 409 have barrier properties. This means that the semiconductor device illustrated in FIGS. 30A to 30C has a structure in which the transistor 3300 is surrounded by insulators having barrier properties. Note that one or more of the insulator 422, the insulator 428, and the insulator 409 are not necessarily provided.

The insulator 464 is provided over the transistor 3200. The insulator 466 is provided over the insulator 464. The insulator 468 is provided over the insulator 466. The insulator 490 is provided over the insulator 468. The transistor 3300 is provided over the insulator 490. The insulator 492 is provided over the transistor 3300. The insulator 494 is provided over the insulator 492.

The insulator 464 has an opening reaching the region 472a, an opening reaching the region 472b, and an opening reaching the conductor 454. In the openings, the conductor 480a, the conductor 480b, and the conductor 480c are provided.

The insulator 466 includes an opening reaching the conductor 480a, an opening reaching the conductor 480b, and an opening reaching the conductor 480c. In the openings, the conductor 478a, the conductor 478b, and the conductor 478c are provided.

The insulator 468 and the insulator 422 include an opening reaching the conductor 478b and an opening reaching the conductor 478c. In the openings, the conductor 476a and the conductor 476b are provided.

The insulator 490 includes an opening overlapping with a channel formation region of the transistor 3300, an opening reaching the conductor 476a, and an opening reaching the conductor 476b. In the openings, the conductor 474a, the conductor 474b, and the conductor 474c are provided.

The conductor 474a may function as a bottom gate electrode of the transistor 3300. Alternatively, for example, electrical characteristics such as the threshold voltage of the transistor 3300 may be controlled by application of a constant potential to the conductor 474a. Further alternatively, for example, the conductor 474a and the conductor 604 that is a top gate electrode of the transistor 3300 may be electrically connected to each other. Thus, the on-state current of the transistor 3300 can be increased. A punch-through phenomenon can be suppressed; thus, stable electrical characteristics in a saturation region of the transistor 3300 can be obtained.

The insulator 409 and the insulator 492 include the opening reaching the conductor 474b through the region 607b that is one of the source and the drain of the transistor 3300, an opening reaching the conductor 605 that overlaps with the region 607a that is the other of the source and the drain of the transistor 3300, with an insulator 612 positioned therebetween, an opening reaching the conductor 604 that is the gate electrode of the transistor 3300, and the opening reaching the conductor 474c through the region 607a that is the other of the source and the drain of the transistor 3300. In the openings, the conductor 496a, the conductor 496b, the conductor 496c, and the conductor 496d are provided. Note that in some cases, an opening provided in a component of the transistor 3300 or the like is positioned between openings provided in other components.

The insulator 494 includes an opening reaching the conductor 496a, an opening reaching the conductor 496b, an opening reaching the conductor 496c, and an opening reaching the conductor 496d. In the openings, the conductor 498a, the conductor 498b, the conductor 498c, and the conductor 498d are provided.

At least one of the insulators 464, 466, 468, 490, 492, and 494 preferably includes an insulator having a barrier property.

The conductor 498d may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. Each of the conductors 498a, 498b, 498c, and 498d preferably includes a conductor having a barrier property.

The source or drain of the transistor 3200 is electrically connected to the region 607b that is one of the source and the drain of the transistor 3300 through the conductor 480b, the conductor 478b, the conductor 476a, the conductor 474b, and the conductor 496c. The conductor 454 that is the gate electrode of the transistor 3200 is electrically connected to the region 607a that is the other of the source and the drain of the transistor 3300 through the conductor 480c, the conductor 478c, the conductor 476b, the conductor 474c, and the conductor 496d.

The capacitor 3400 includes an electrode electrically connected to the other of the source and the drain of the transistor 3300, the conductor 605, and the insulator 612. The insulator 612 is preferably used in some cases because the insulator 612 can be formed in the same step as an insulator functioning as a gate insulator of the transistor 3300, leading to an increase in productivity. A layer formed in the same step as the conductor 604 functioning as the gate electrode of the transistor 3300 is preferably used as the conductor 605 in some cases, leading to an increase in productivity. The conductor 605 and the conductor 604 may be formed in different steps.

For the structures of other components, the description of FIGS. 26A to 26C and the like can be referred to as appropriate.

Figure 31A:
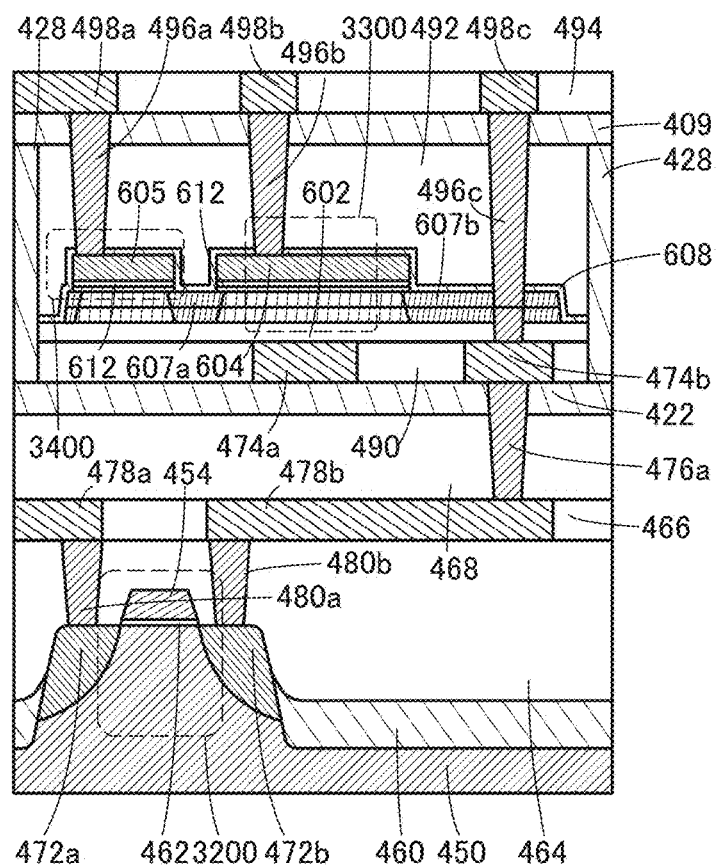
FIGS. 31A to 31C are cross-sectional views illustrating a semiconductor device of one embodiment of the present invention.
Figure 31B:
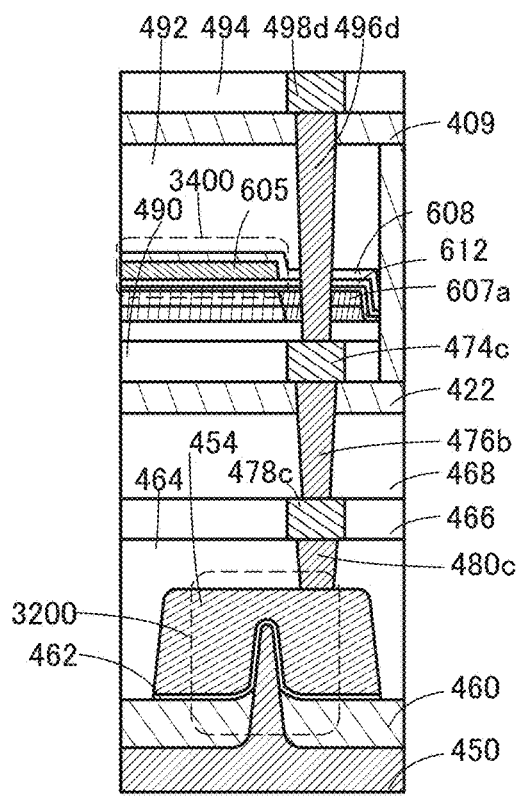
Figure 31C:
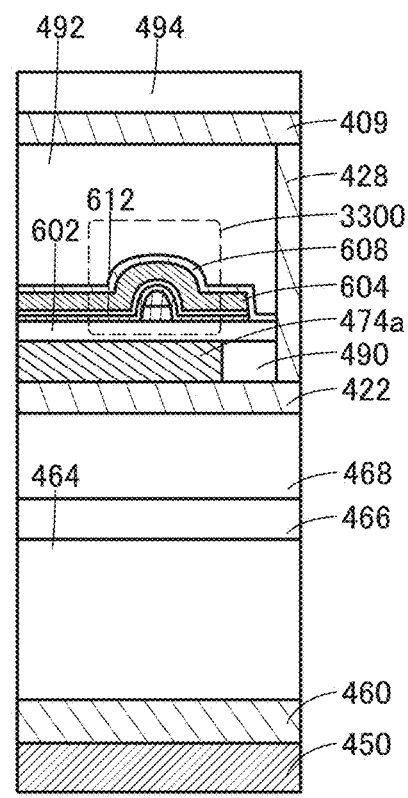

A semiconductor device in FIGS. 31A to 31C is the same as the semiconductor device in FIGS. 30A to 30C except for the structure of the transistor 3200. Therefore, the description of the semiconductor device in FIGS. 30A to 30C is referred to for the semiconductor devices in FIGS. 31A to 31C. Specifically, in the semiconductor devices in FIGS. 31A to 31C, the transistor 3200 is a Fin-type transistor. For the Fin-type transistor 3200, the description of the transistor 2200 in FIGS. 27A to 27C is referred to. Note that although the transistor 2200 is illustrated as a p-channel transistor in FIGS. 27A to 27C, the transistor 3200 may be an n-channel transistor. Note that FIGS. 31A to 31C are cross-sectional views of different portions.

Figure 32A:
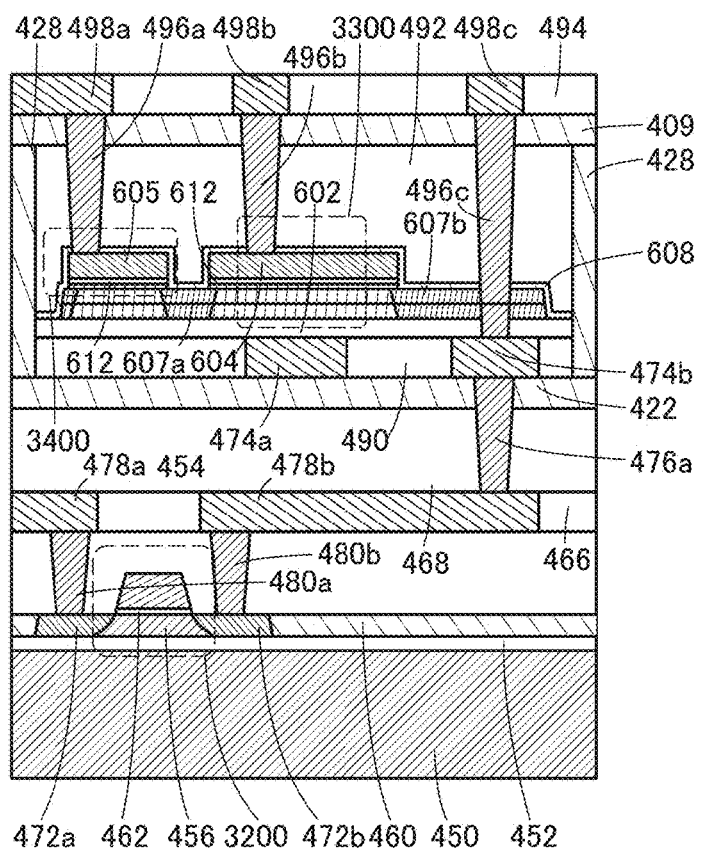
FIGS. 32A to 32C are cross-sectional views illustrating a semiconductor device of one embodiment of the present invention.
Figure 32B:
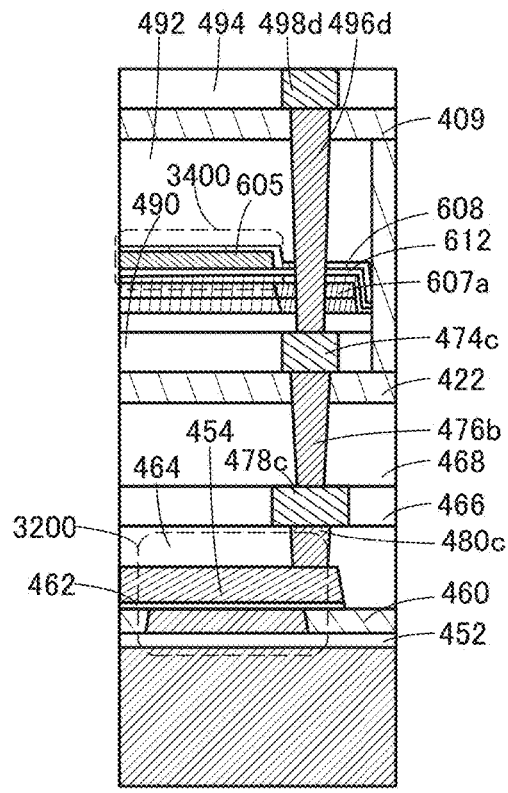
Figure 32C:
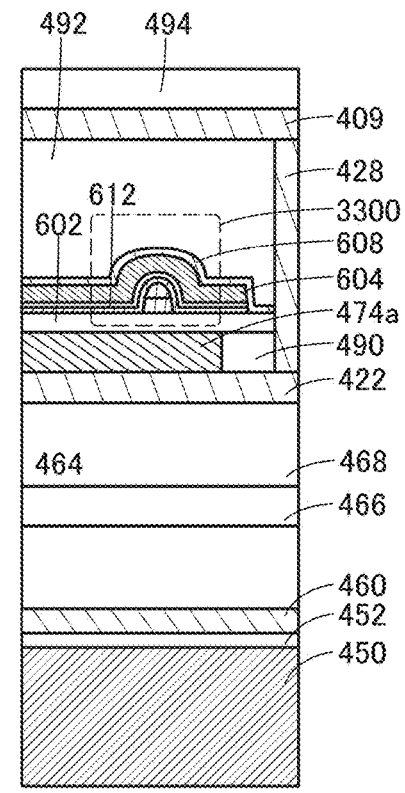

A semiconductor device in FIGS. 32A to 32C is the same as the semiconductor device in FIGS. 30A to 30C except for the structure of the transistor 3200. Therefore, the description of the semiconductor device in FIGS. 30A to 30C is referred to for the semiconductor device in FIGS. 32A to 32C. Specifically, in the semiconductor device in FIGS. 32A to 32C, the transistor 3200 is provided in the semiconductor substrate 450 that is an SOI substrate. For the transistor 3200, which is provided in the semiconductor substrate 450 (SOI substrate), the description of the transistor 2200 in FIGS. 28A to 28C is referred to. Note that although the transistor 2200 is illustrated as a p-channel transistor in FIGS. 28A to 28C, the transistor 3200 may be an n-channel transistor. Note that FIGS. 32A to 32C are cross-sectional views of different portions.

<Memory Device 2>

The semiconductor device in FIG. 29B is different from the semiconductor device in FIG. 29A in that the transistor 3200 is not provided. Also in this case, data can be written and retained in a manner similar to that of the semiconductor device in FIG. 29A.

Reading of data in the semiconductor device in FIG. 29B is described. When the transistor 3300 is brought into an on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor including an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Imaging Device>

An imaging device of one embodiment of the present invention will be described below.

Figure 33A:
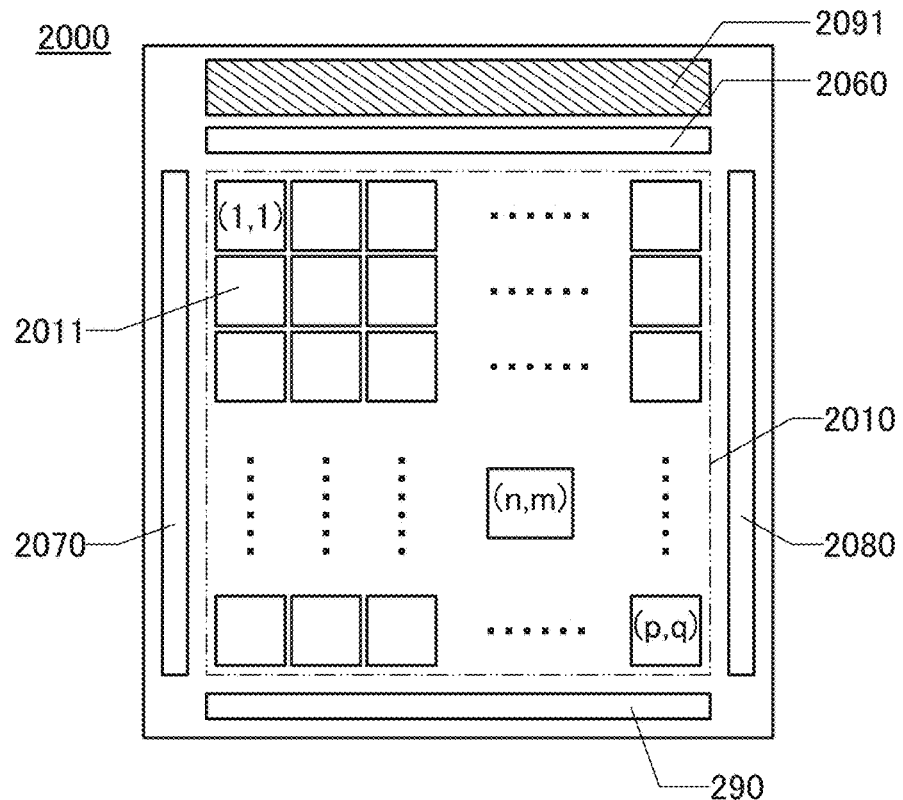
FIGS. 33A and 33B are top views each illustrating a semiconductor device of one embodiment of the present invention.

FIG. 33A is a plan view illustrating an example of an imaging device 2000 of one embodiment of the present invention. The imaging device 2000 includes a pixel portion 2010 and peripheral circuits for driving the pixel portion 2010 (a peripheral circuit 2060, a peripheral circuit 2070, a peripheral circuit 2080, and a peripheral circuit 2090). The pixel portion 2010 includes a plurality of pixels 2011 arranged in a matrix with p rows and q columns (p and q are each an integer of 2 or more). The peripheral circuit 2060, the peripheral circuit 2070, the peripheral circuit 2080, and the peripheral circuit 2090 are each connected to the plurality of pixels 2011, and a signal for driving the plurality of pixels 2011 is supplied. In this specification and the like, in some cases, a "peripheral circuit" or a "driver circuit" indicate all of the peripheral circuits 2060, 2070, 2080, and 2090. For example, the peripheral circuit 2060 can be regarded as part of the peripheral circuit.

The imaging device 2000 preferably includes a light source 2091. The light source 2091 can emit detection light P1.

The peripheral circuit includes at least one of a logic circuit, a switch, a buffer, an amplifier circuit, and a converter circuit. The peripheral circuit may be formed over a substrate where the pixel portion 2010 is formed. A semiconductor device such as an IC chip may be used as part or the whole of the peripheral circuit. Note that as the peripheral circuit, one or more of the peripheral circuits 2060, 2070, 2080, and 2090 may be omitted.

Figure 33B:
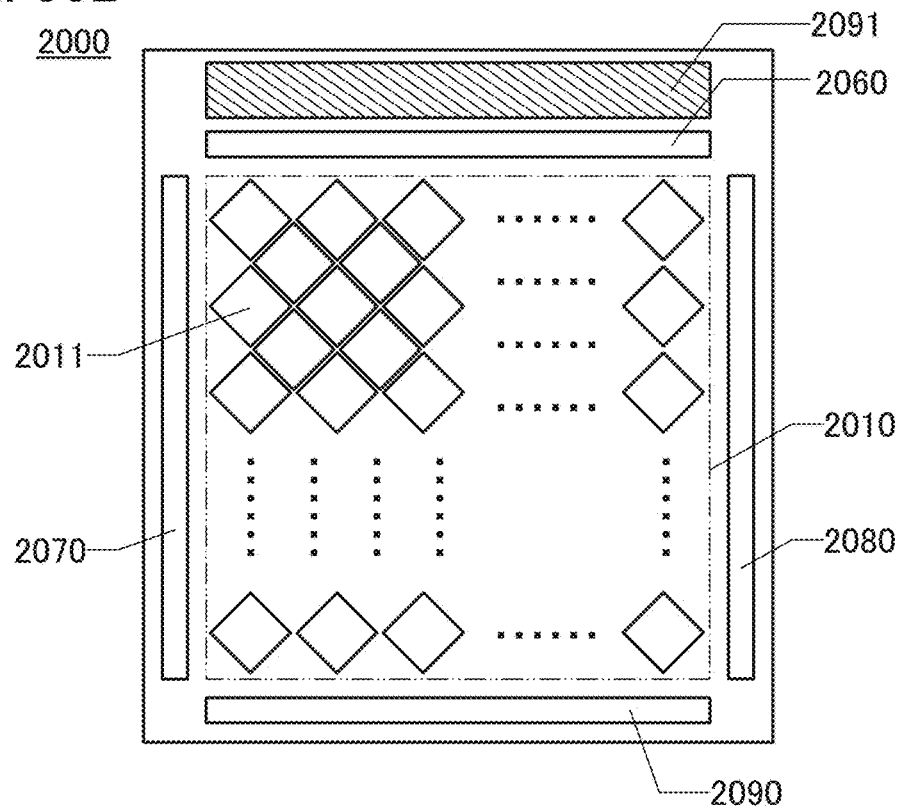

As illustrated in FIG. 33B, the pixels 2011 may be provided to be inclined in the pixel portion 2010 included in the imaging device 2000. When the pixels 2011 are obliquely arranged, the distance between pixels (pitch) can be shortened in the row direction and the column direction. Accordingly, the quality of an image taken with the imaging device 2000 can be improved.

Configuration Example 1 of Pixel

The pixel 2011 included in the imaging device 2000 is formed with a plurality of subpixels 2012, and each subpixel 2012 is combined with a filter (color filter) which transmits light in a specific wavelength band, whereby data for achieving color image display can be obtained.

Figure 34A:
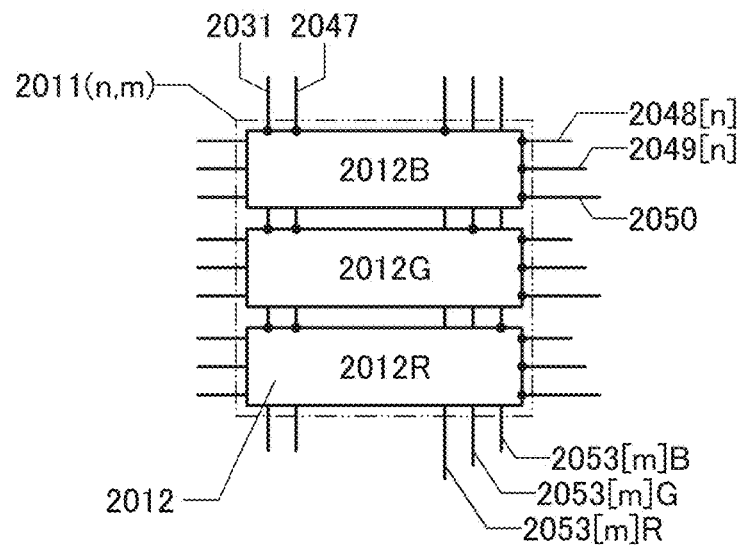
FIGS. 34A and 34B are block diagrams each illustrating a semiconductor device of one embodiment of the present invention.

FIG. 34A is a top view showing an example of the pixel 2011 with which a color image is obtained. The pixel 2011 illustrated in FIG. 34A includes a subpixel 2012 provided with a color filter that transmits light in a red (R) wavelength band (also referred to as a subpixel 2012R), a subpixel 2012 provided with a color filter that transmits light in a green (G) wavelength band (also referred to as a subpixel 2012G), and a subpixel 2012 provided with a color filter that transmits light in a blue (B) wavelength band (also referred to as a subpixel 2012B). The subpixel 2012 can function as a photosensor.

The subpixel 2012 (the subpixel 2012R, the subpixel 2012G, and the subpixel 2012B) is electrically connected to a wiring 2031, a wiring 2047, a wiring 2048, a wiring 2049, and a wiring 2050. In addition, the subpixel 2012R, the subpixel 2012G, and the subpixel 2012B are connected to respective wirings 2053 which are independently provided. In this specification and the like, for example, the wiring 2048 and the wiring 2049 that are connected to the pixel 2011 in the n-th row are referred to as a wiring 2048[n] and a wiring 2049[n]. For example, the wiring 2053 connected to the pixel 2011 in the m-th column is referred to as a wiring 2053[m]. Note that in FIG. 34A, the wirings 2053 connected to the subpixel 2012R, the subpixel 2012G, and the subpixel 2012B in the pixel 2011 in the m-th column are referred to as a wiring 2053[m]R, a wiring 2053[m]G, and a wiring 2053[m]B. The subpixels 2012 are electrically connected to the peripheral circuit through the above wirings.

Figure 34B:
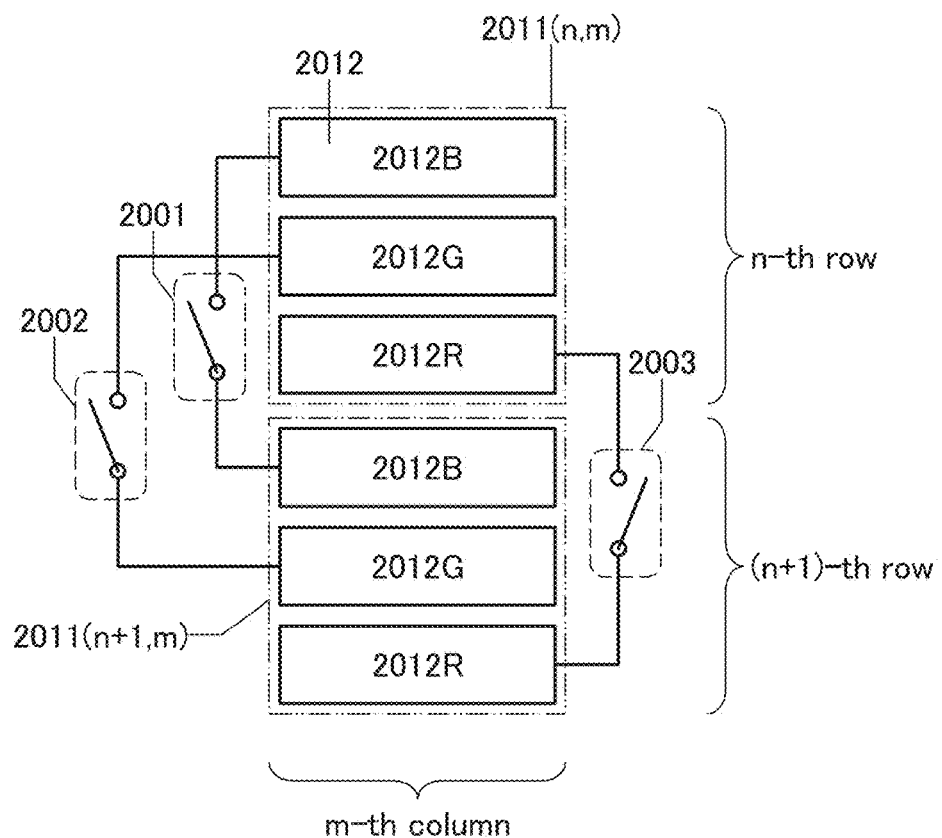

The imaging device 2000 has a structure in which the subpixel 2012 is electrically connected to the subpixel 2012 in an adjacent pixel 2011 which is provided with a color filter transmitting light in the same wavelength band as the subpixel 2012, via a switch. FIG. 34B shows a connection example of the subpixels 2012: the subpixel 2012 in the pixel 2011 arranged in the n-th (n is an integer greater than or equal to 1 and less than or equal to p) row and the m-th (m is an integer greater than or equal to 1 and less than or equal to q) column and the subpixel 2012 in the adjacent pixel 2011 arranged in an (n+1)-th row and the m-th column. In FIG. 34B, the subpixel 2012R arranged in the n-th row and the m-th column and the subpixel 2012R arranged in the (n+1)-th row and the m-th column are connected to each other via a switch 2001. The subpixel 2012G arranged in the n-th row and the m-th column and the subpixel 2012G arranged in the (n+1)-th row and the m-th column are connected to each other via a switch 2002. The subpixel 2012B arranged in the n-th row and the m-th column and the subpixel 2012B arranged in the (n+1)-th row and the m-th column are connected to each other via a switch 2003.

The color filter used in the subpixel 2012 is not limited to red (R), green (G), and blue (B) color filters, and color filters that transmit light of cyan (C), yellow (Y), and magenta (M) may be used. By provision of the subpixels 2012 that sense light in three different wavelength bands in one pixel 2011, a full-color image can be obtained.

The pixel 2011 including the subpixel 2012 provided with a color filter transmitting yellow (Y) light may be provided, in addition to the subpixels 2012 provided with the color filters transmitting red (R), green (G), and blue (B) light. The pixel 2011 including the subpixel 2012 provided with a color filter transmitting blue (B) light may be provided, in addition to the subpixels 2012 provided with the color filters transmitting cyan (C), yellow (Y), and magenta (M) light. When the subpixels 2012 sensing light in four different wavelength bands are provided in one pixel 2011, the reproducibility of colors of an obtained image can be increased.

For example, in FIG. 34A, in regard to the subpixel 2012 sensing light in a red wavelength band, the subpixel 2012 sensing light in a green wavelength band, and the subpixel 2012 sensing light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 2012 provided in the pixel 2011 may be one, two or more subpixels are preferably provided. For example, when two or more subpixels 2012 sensing light in the same wavelength band are provided, the redundancy is increased, and the reliability of the imaging device 2000 can be increased.

When an infrared (IR) filter that transmits infrared light and absorbs or reflects visible light is used as the filter, the imaging device 2000 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 2011 may be provided with a lens. An arrangement example of the pixel 2011, a filter 2054, and a lens 2055 is described with cross-sectional views in FIGS. 35A and 35B. With the lens 2055, the photoelectric conversion element can receive incident light efficiently. Specifically, as illustrated in FIG. 35A, light 2056 enters a photoelectric conversion element 2020 through the lens 2055, the filter 2054 (a filter 2054R, a filter 2054G, and a filter 2054B), a pixel circuit 2030, and the like which are provided in the pixel 2011.

As indicated by a region surrounded with dashed double-dotted lines, however, part of the light 2056 indicated by arrows might be blocked by some wirings 2057. Thus, a preferable structure is such that the lens 2055 and the filter 2054 are provided on the photoelectric conversion element 2020 side as illustrated in FIG. 35B, whereby the photoelectric conversion element 2020 can efficiently receive the light 2056. When the light 2056 enters the photoelectric conversion element 2020 from the photoelectric conversion element 2020 side, the imaging device 2000 with high sensitivity can be provided.

Figure 35A:
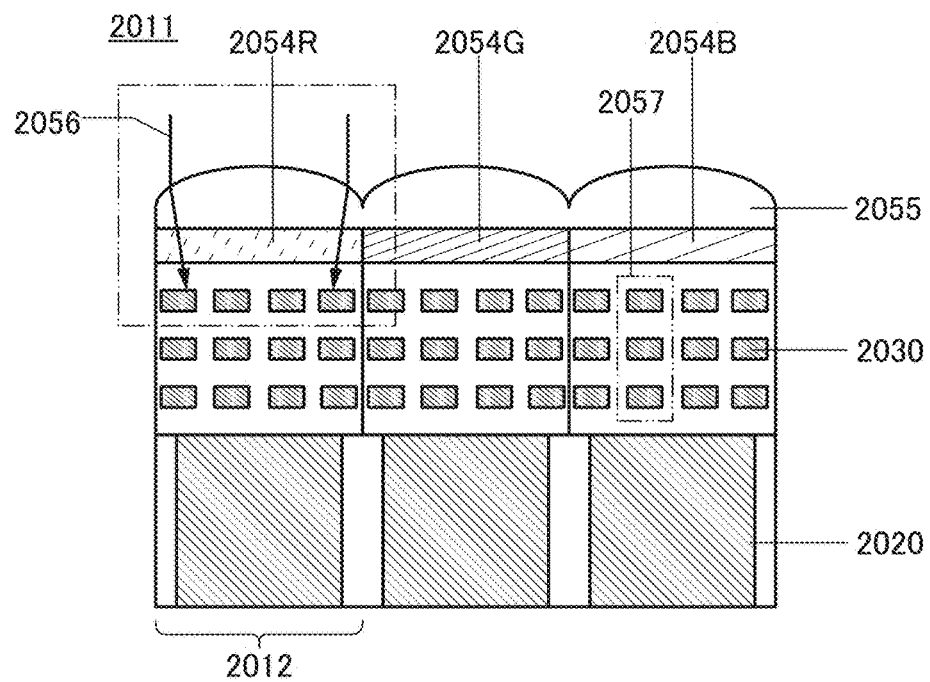
FIGS. 35A and 35B are cross-sectional views each illustrating a semiconductor device of one embodiment of the present invention.
Figure 35B:
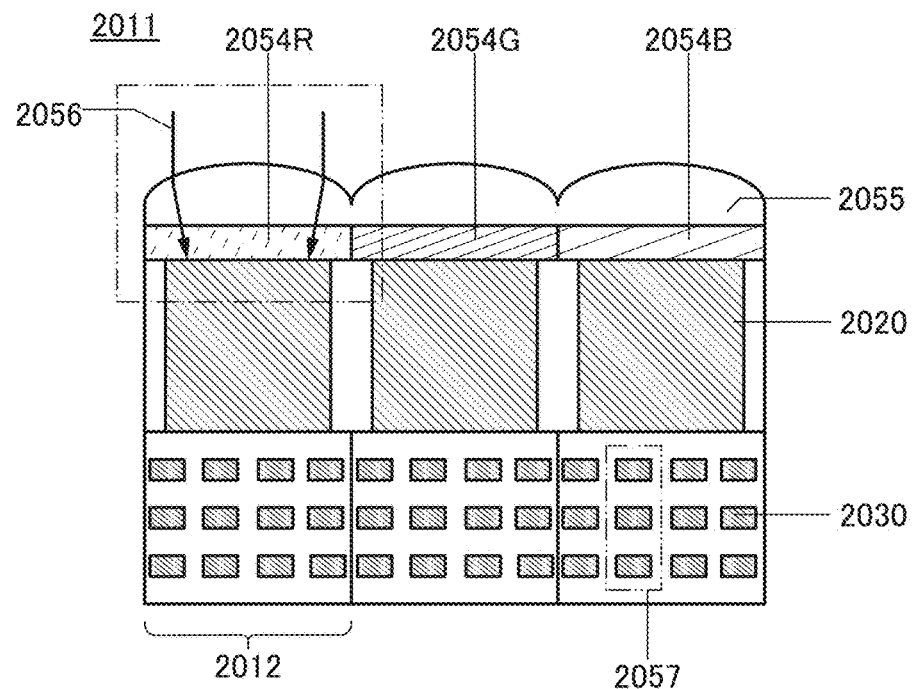

As the photoelectric conversion element 2020 illustrated in FIGS. 35A and 35B, a photoelectric conversion element in which a p-n junction or a p-i-n junction is formed may be used.

The photoelectric conversion element 2020 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 2020, the photoelectric conversion element 2020 can have a light absorption coefficient in a wide wavelength band, such as visible light, ultraviolet light, infrared light, X-rays, and gamma rays.

One pixel 2011 included in the imaging device 2000 may include the subpixel 2012 with a first filter in addition to the subpixel 2012 illustrated in FIGS. 34A and 34B.

Configuration Example 2 of Pixel

An example of a pixel including a transistor including silicon and a transistor including an oxide semiconductor will be described below.

Figure 36A:
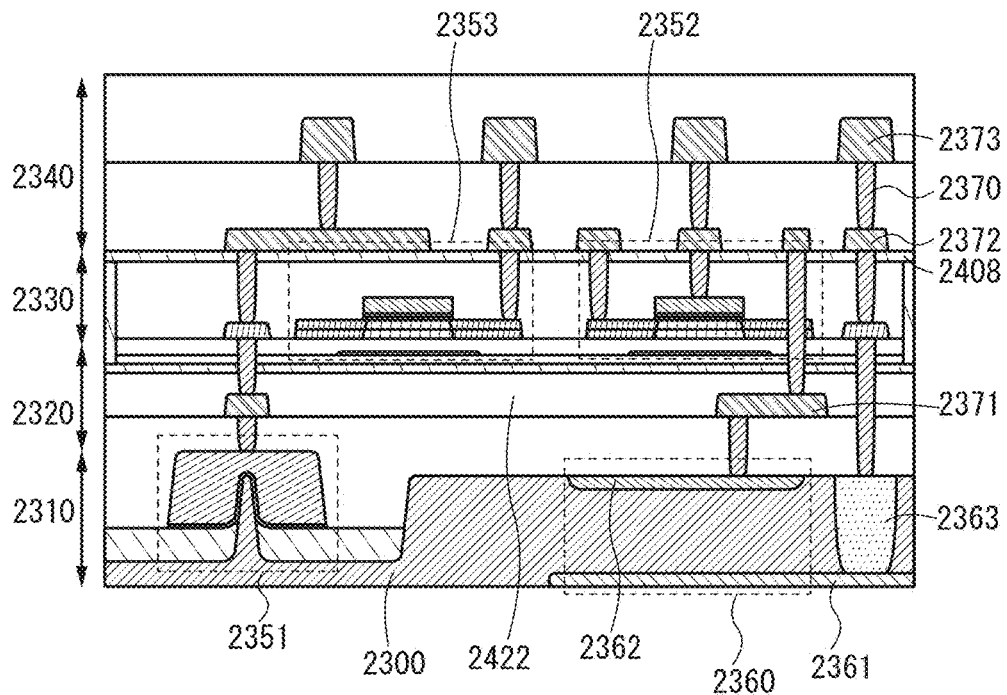
FIGS. 36A and 36B are cross-sectional views each illustrating a semiconductor device of one embodiment of the present invention.
Figure 36B:
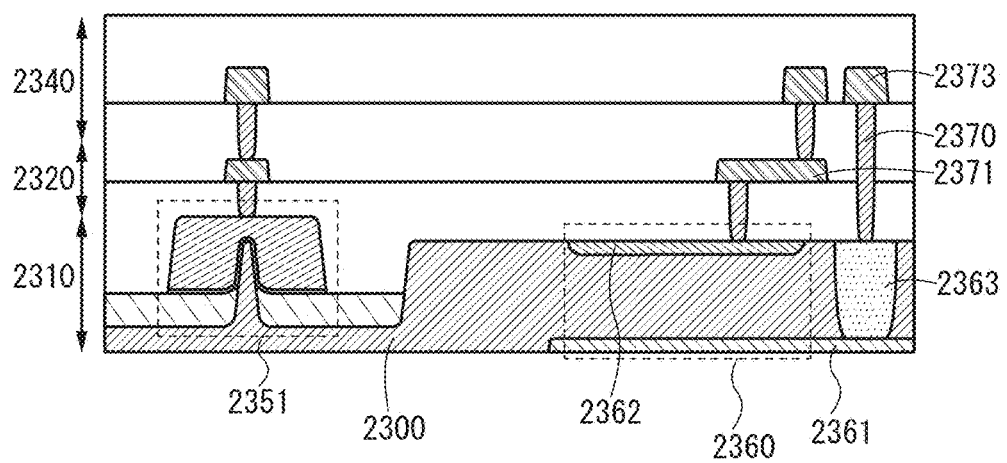

FIGS. 36A and 36B are each a cross-sectional view of an element included in an imaging device. The imaging device illustrated in FIG. 36A includes a transistor 2351 including silicon over a silicon substrate 2300, transistors 2352 and 2353 which include an oxide semiconductor and are stacked over the transistor 2351, and a photodiode 2360 provided in a silicon substrate 2300. The transistors and the photodiode 2360 are electrically connected to various plugs 2370 and wirings 2371. A cathode 2362 of the photodiode 2360 is electrically connected to the wiring 2371 through a plug. In addition, an anode 2361 of the photodiode 2360 is electrically connected to the plug 2370 through a low-resistance region 2363.

The imaging device includes a layer 2310 including the transistor 2351 provided on the silicon substrate 2300 and the photodiode 2360 provided in the silicon substrate 2300, a layer 2320 which is in contact with the layer 2310 and includes the wirings 2371, a layer 2330 which is in contact with the layer 2320 and includes the transistors 2352 and 2353, and a layer 2340 which is in contact with the layer 2330 and includes a wiring 2372 and a wiring 2373.

In the example of cross-sectional view in FIG. 36A, a light-receiving surface of the photodiode 2360 is provided on the side opposite to a surface of the silicon substrate 2300 where the transistor 2351 is formed. With this structure, a light path can be secured without an influence of the transistors and the wirings. Thus, a pixel with a high aperture ratio can be formed. Note that the light-receiving surface of the photodiode 2360 can be the same as the surface where the transistor 2351 is formed.

In the case where a pixel is formed with use of only transistors including an oxide semiconductor, the layer 2310 may include the transistor including an oxide semiconductor. Alternatively, the layer 2310 may be omitted, and the pixel may include only transistors including an oxide semiconductor.

In the case where a pixel is formed with use of only transistors including silicon, the layer 2330 may be omitted. An example of a cross-sectional view in which the layer 2330 is not provided is shown in FIG. 36B. In the case where the layer 2330 is not provided, the wiring 2372 of the layer 2340 can be omitted.

Note that the silicon substrate 2300 may be an SOI substrate. Furthermore, the silicon substrate 2300 can be replaced with a substrate made of germanium, silicon germanium, silicon carbide, gallium arsenide, aluminum gallium arsenide, indium phosphide, gallium nitride, or an organic semiconductor.

Here, an insulator 2422 is provided between the layer 2310 including the transistor 2351 and the photodiode 2360 and the layer 2330 including the transistors 2352 and 2353. However, there is no limitation on the position of the insulator 2422.

Hydrogen in an insulator provided in the vicinity of a channel formation region of the transistor 2351 terminates dangling bonds of silicon; accordingly, the reliability of the transistor 2351 can be improved. In contrast, hydrogen in the insulator provided in the vicinity of the transistor 2352, the transistor 2353, and the like becomes one of factors generating a carrier in the oxide semiconductor. Thus, the hydrogen may cause a reduction of the reliability of the transistor 2352, the transistor 2353, and the like. For this reason, in the case where the transistor including an oxide semiconductor is provided over the transistor including silicon, it is preferable that the insulator 2422 having a barrier property be provided between the transistors. Each of the transistor 2352 and the transistor 2353 is preferably surrounded by an insulator having a barrier property in all directions. In addition, an insulator 2408 having a barrier property is preferably provided over the transistor 2352 and the transistor 2353 to cover the transistors. When the hydrogen is confined below the insulator 2422, the reliability of the transistor 2351 can be improved. In addition, the hydrogen can be prevented from being diffused from a part below the insulator 2422 to a part above the insulator 2422; thus, the reliability of the transistor 2352, the transistor 2353, and the like can be increased.

The semiconductor device illustrated in FIG. 36A has a structure in which the transistor 2352 and the transistor 2353 are surrounded by insulators having barrier properties. Note that the transistor 2352 and the transistor 2353 are not necessarily surrounded by insulators having barrier properties.

In the cross-sectional view in FIG. 36A, the photodiode 2360 in the layer 2310 and the transistor in the layer 2330 can be formed so as to overlap with each other. Thus, the degree of integration of pixels can be increased. In other words, the resolution of the imaging device can be increased.

Figure 37A:
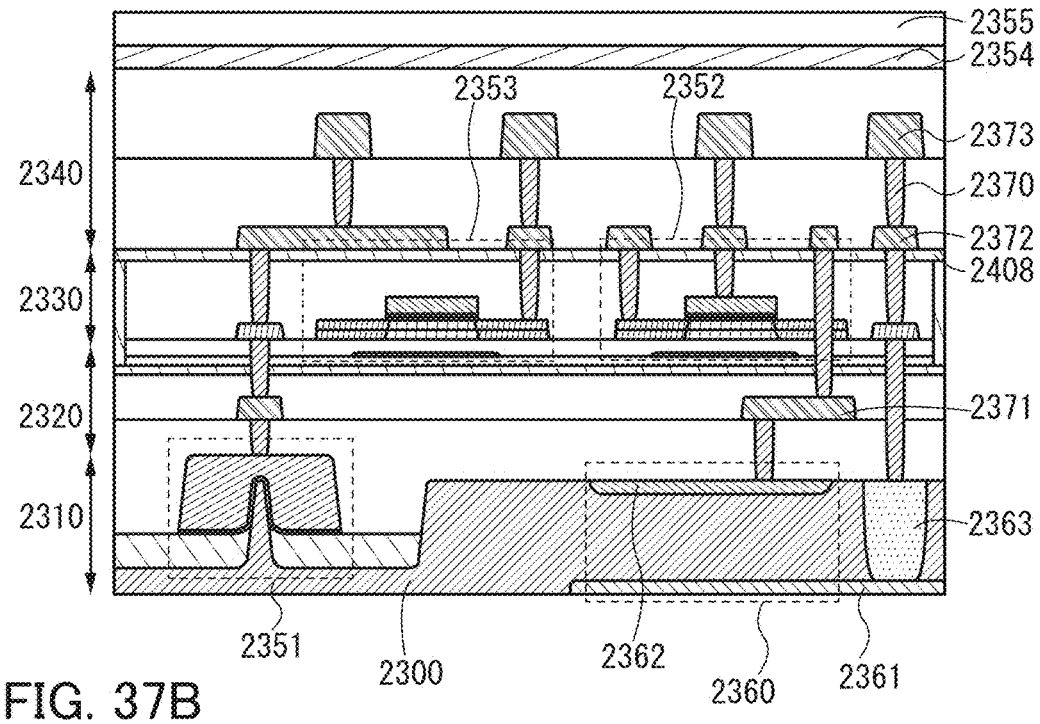
FIGS. 37A and 37B are cross-sectional views each illustrating a semiconductor device of one embodiment of the present invention.
Figure 37B:
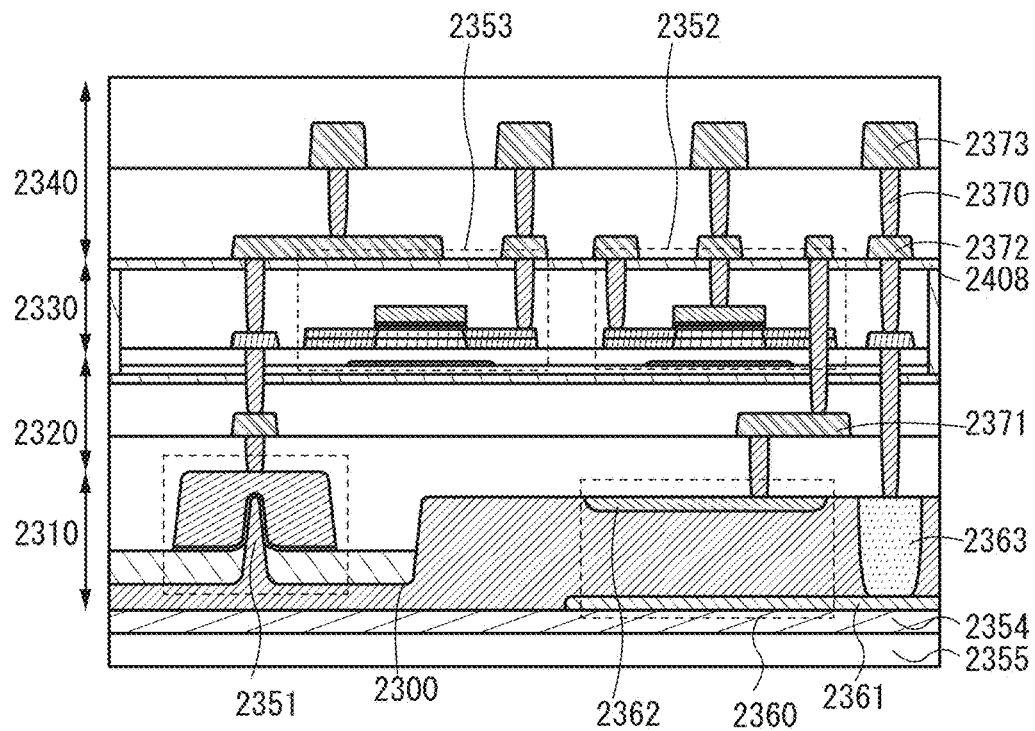

A filter 2354 and/or a lens 2355 may be provided over or under the pixel as shown in FIGS. 37A and 37B. For the filter 2354, refer to the description of the filter 2054. For the lens 2355, refer to for the description of the lens 2055.

As illustrated in FIG. 38A1 and FIG. 38B1, part or the whole of the imaging device can be bent. FIG. 38A1 illustrates a state in which the imaging device is bent in the direction of a dashed-dotted line X1-X2. FIG. 38A2 is a cross-sectional view illustrating a portion indicated by the dashed-dotted line X1-X2 in FIG. 38A1. FIG. 38A3 is a cross-sectional view illustrating a portion indicated by a dashed-dotted line Y1-Y2 in FIG. 38A1.

FIG. 38B1 illustrates a state where the imaging device is bent in the direction of a dashed-dotted line X3-X4 and the direction of a dashed-dotted line Y3-Y4. FIG. 38B2 is a cross-sectional view illustrating a portion indicated by the dashed-dotted line X3-X4 in FIG. 38B1. FIG. 38B3 is a cross-sectional view illustrating a portion indicated by the dashed-dotted line Y3-Y4 in FIG. 38B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

<FPGA>

One embodiment of the present invention can also be applied to an LSI such as a field programmable gate array (FPGA).

Figure 39A:
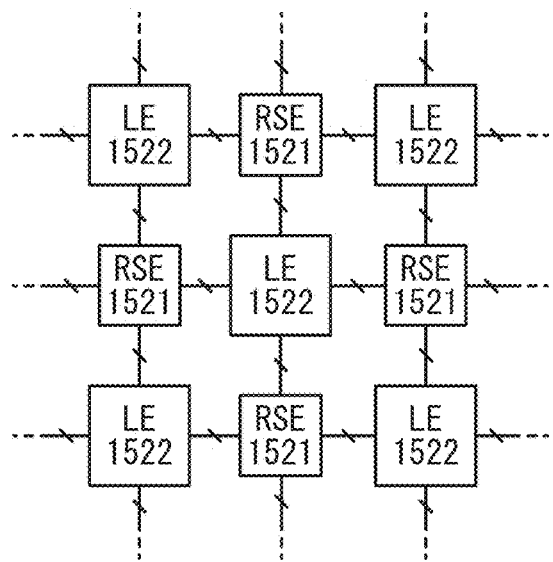
FIGS. 39A to 39E are circuit diagrams each illustrating a semiconductor device of one embodiment of the present invention.

FIG. 39A illustrates an example of a block diagram of an FPGA. The FPGA includes a routing switch element 1521 and a logic element 1522. The logic element 1522 can switch functions of a logic circuit, such as a function of a combination circuit or a function of a sequential circuit, in accordance with configuration data stored in a configuration memory.

Figure 39B:
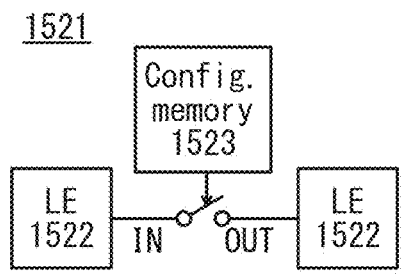

FIG. 39B is a schematic view illustrating a function of the routing switch element 1521. The routing switch element 1521 can switch a connection between the logic elements 1522 in accordance with configuration data stored in a configuration memory 1523. Note that although FIG. 39B illustrates one switch which switches a connection between a terminal IN and a terminal OUT, in an actual FPGA, a plurality of switches are provided between a plurality of the logic elements 1522.

Figure 39C:
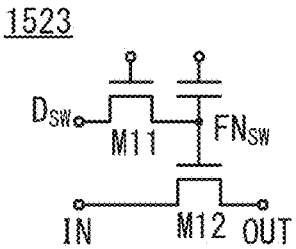

FIG. 39C illustrates a configuration example of a circuit serving as the configuration memory 1523. The configuration memory 1523 includes a transistor M11 that is a transistor including an oxide semiconductor and a transistor M12 that is a transistor including silicon. Configuration data Dsw is supplied to a node FNsw through the transistor M11. A potential of the configuration data Dsw can be retained by turning off the transistor M11. The on and off states of the transistor M12 can be switched depending on the potential of the retained configuration data Dsw, so that the connection between the terminal IN and the terminal OUT can be switched.

Figure 39D:
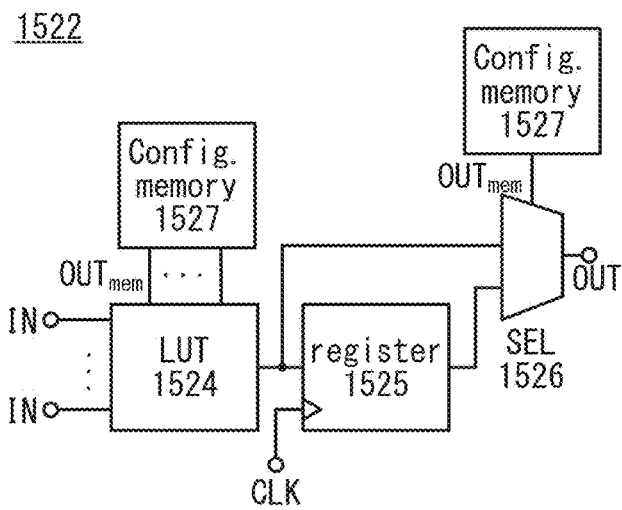

FIG. 39D is a schematic view illustrating a function of the logic element 1522. The logic element 1522 can switch a potential of a terminal $OUT_{mem}$ in accordance with configuration data stored in a configuration memory 1527. A lookup table 1524 can switch functions of a combination circuit that processes a signal of the terminal IN in accordance with the potential of the terminal $OUT_{mem}$. The logic element 1522 includes a register 1525 that is a sequential circuit and a selector 1526 that switches signals of the terminal OUT. The selector 1526 can select to output a signal of the lookup table 1524 or to output a signal of the register 1525 in accordance with the potential of the terminal $OUT_{mem}$, which is output from the configuration memory 1527.

Figure 39E:
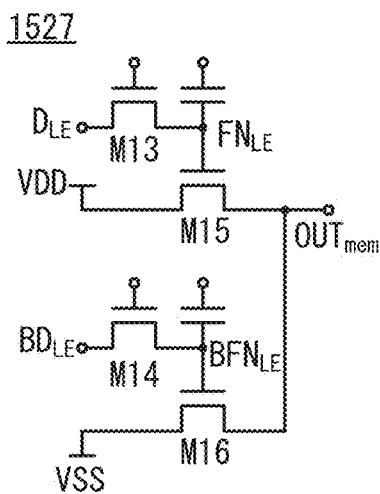

FIG. 39E illustrates a configuration example of a circuit serving as the configuration memory 1527. The configuration memory 1527 includes a transistor M13 and a transistor M14 that are transistors including an oxide semiconductor, and a transistor M15 and a transistor M16 that are transistors including silicon. Configuration data $D_{LE}$ is supplied to a node $FN_{LE}$ through the transistor M13. Configuration data $BD_{LE}$ is supplied to a node $BFN_{LE}$ through the transistor M14. The configuration data $BD_{LE}$ corresponds to a potential of the configuration data $D_{LE}$ whose logic is inverted. The potential of the configuration data $D_{LE}$ and the potential of the configuration data $BD_{LE}$ can be retained by turning off the transistor M13 and the transistor M14, respectively. The on and off states of one of the transistors M15 and M16 are switched in accordance with the retained potential of the configuration data $D_{LE}$ or the configuration data $BD_{LE}$, so that a potential VDD or a potential VSS can be supplied to the terminal $OUT_{mem}$.

For the configuration illustrated in FIGS. 39A to 39E, any of the above-described transistors, logic circuits, memory devices, and the like can be used. For example, transistors including silicon are used as the transistors M12, M15, and M16, and transistors including an oxide semiconductor are used as the transistors M11, M13, and M14. In that case, the transistors including silicon are formed over a silicon substrate and then, the transistors including an oxide semiconductor are formed over the transistors including silicon, in which case the chip size of the FPGA can be reduced. Furthermore, the combination of the low off-state current of the transistors including an oxide semiconductor and the high on-state current of the transistors including silicon enables the FPGA to have small power consumption and high operation speed.

<CPU>

A CPU including a semiconductor device such as any of the above-described transistors or the above-described memory device will be described below.

Figure 40:
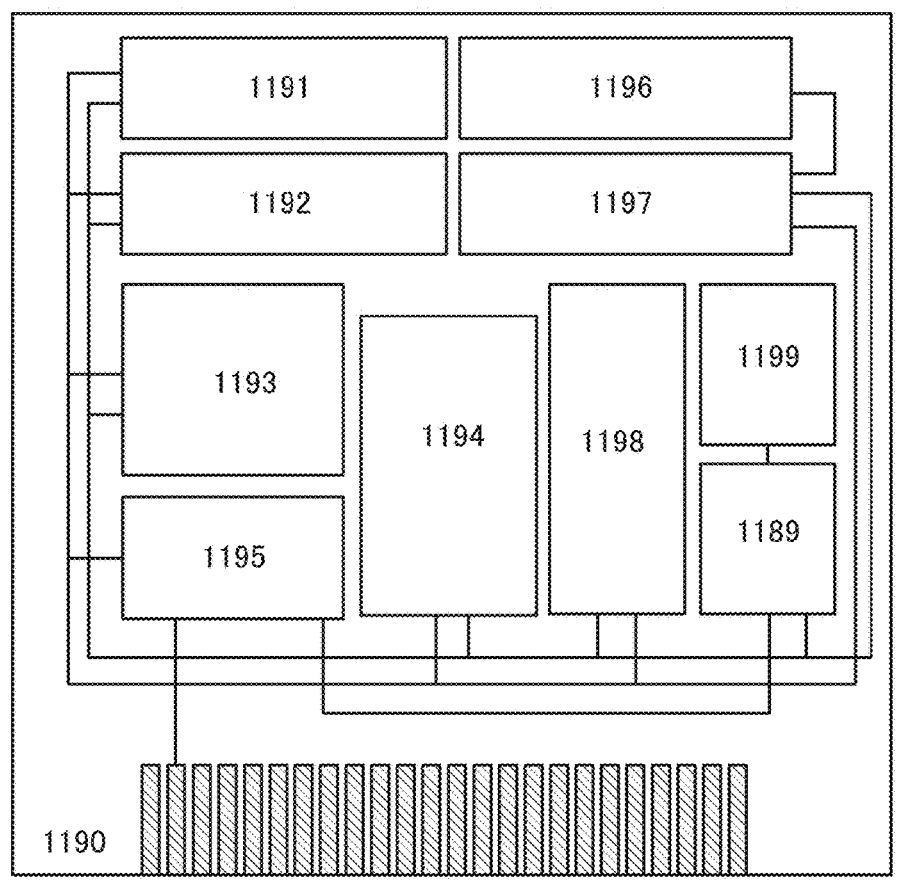
FIG. 40 is a block diagram illustrating a semiconductor device of one embodiment of the present invention.

FIG. 40 is a block diagram illustrating a configuration example of a CPU including any of the above-described transistors as a component.

The CPU illustrated in FIG. 40 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 40 is just an example in which the configuration has been simplified, and an actual CPU may have a variety of configurations depending on the application. For example, the CPU may have the following configuration: a structure including the CPU illustrated in FIG. 40 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 40, a memory cell is provided in the register 1196. For the memory cell of the register 1196, any of the above-described transistors, the above-described memory device, or the like can be used.

In the CPU illustrated in FIG. 40, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 41:
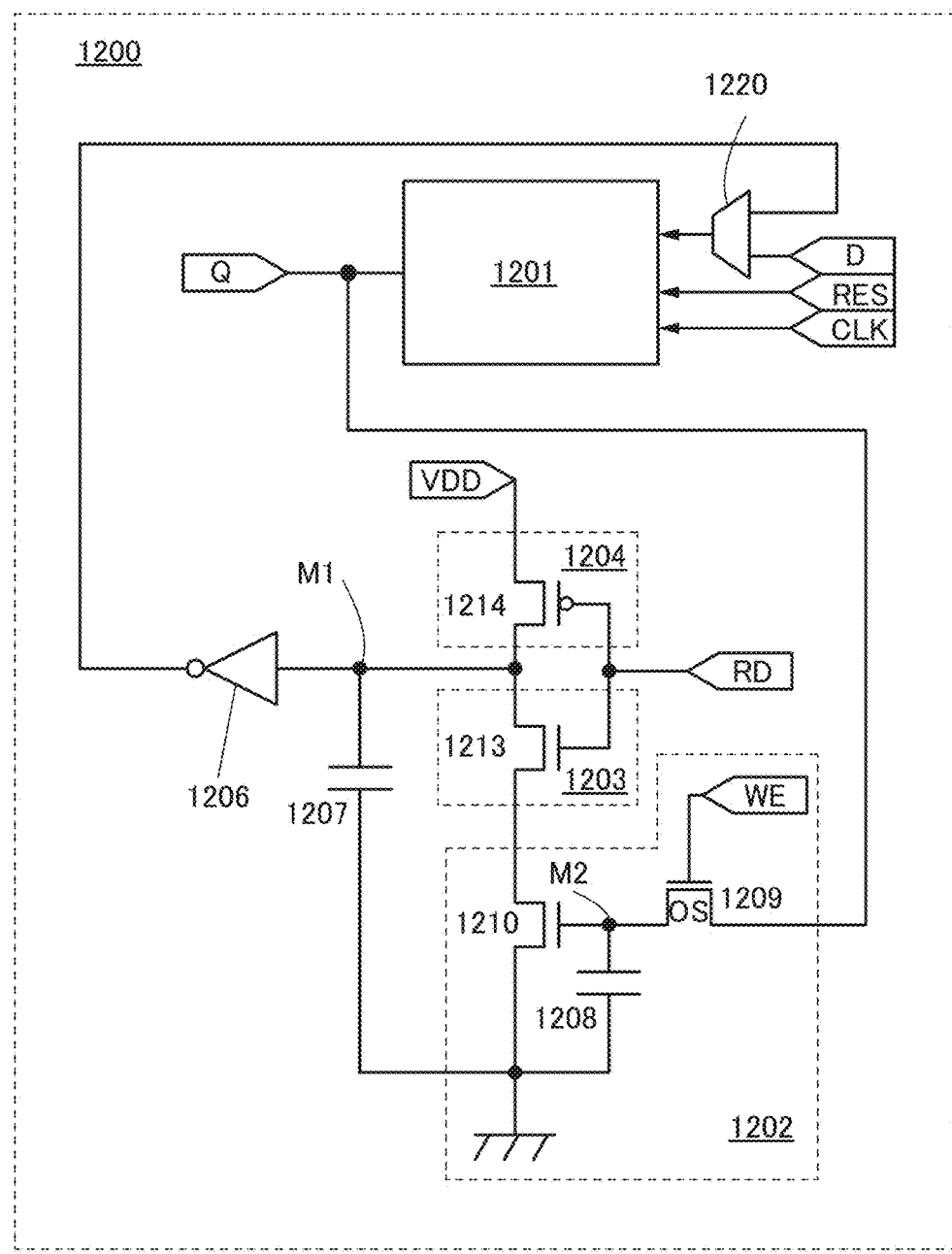
FIG. 41 is a circuit diagram illustrating a semiconductor device of one embodiment of the present invention.

FIG. 41 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 41 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 41, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 41, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 41, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a programmable logic device (PLD), or a custom LSI, and a radio frequency (RF) device.

<Display Device>

A display device of one embodiment of the present invention is described below with reference to FIGS. 42A to 42C and FIGS. 44A and 44B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 42A:
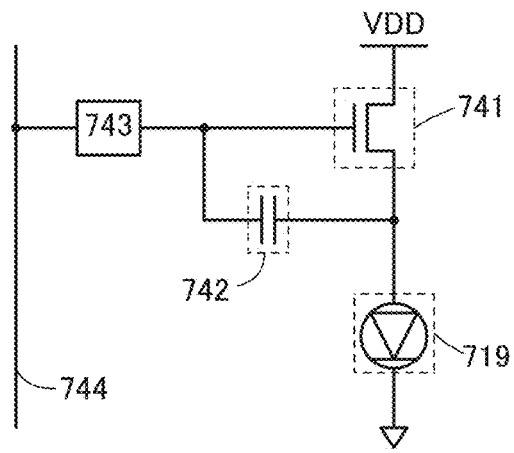
FIGS. 42A to 42C are a circuit diagram, a top view, and a cross-sectional view illustrating a semiconductor device of one embodiment of the present invention.
Figure 42B:
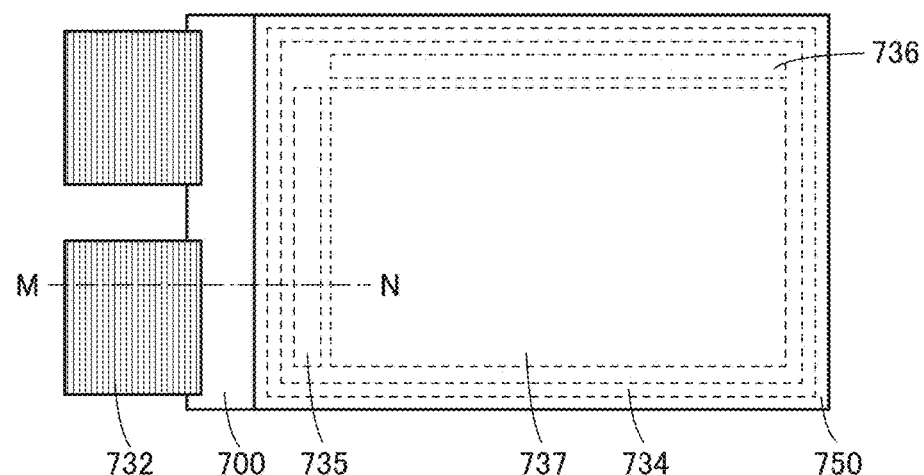
Figure 42C:
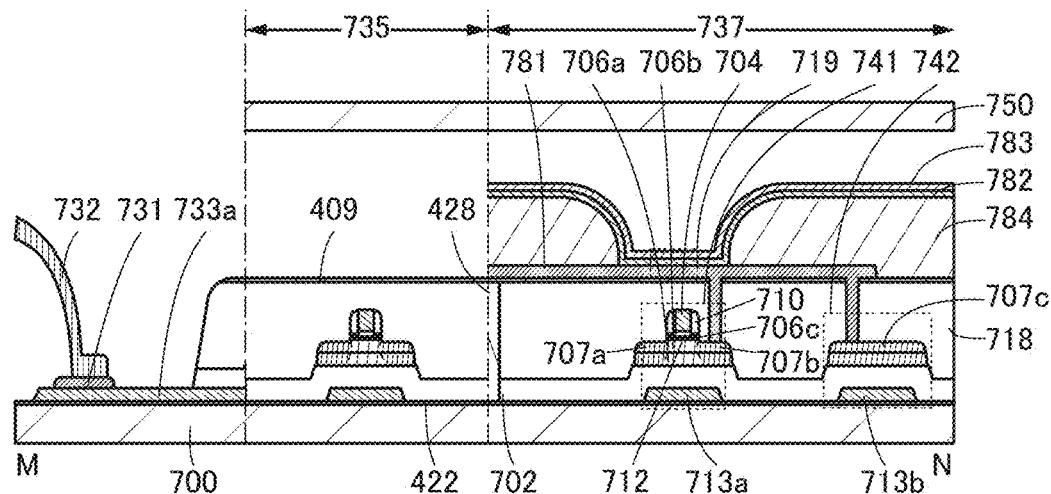

FIGS. 42A to 42C illustrate an example of an EL display device of one embodiment of the present invention. FIG. 42A is a circuit diagram of a pixel in an EL display device. FIG. 42B is a plan view showing the whole of the EL display device. FIG. 42C is a cross-sectional view taken along part of dashed-dotted line M-N in FIG. 42B.

FIG. 42A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 42A includes a switching element 743, a transistor 741, a capacitor 742, and a light-emitting element 719.

Note that FIG. 42A and the like each illustrate an example of a circuit structure; therefore, a transistor can be provided additionally. In contrast, for each node in FIG. 42A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. The source of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 42B is a plan view of the EL display device. The EL display device includes a substrate 700, a substrate 750, the insulator 422, the insulator 428, the insulator 409, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736.

Note that the driver circuit 735 and/or the driver circuit 736 may be provided outside the sealant 734.

FIG. 42C is a cross-sectional view of the EL display device taken along part of dashed-dotted line M-N in FIG. 42B.

FIG. 42C illustrates a structure in which the transistor 741 includes a conductor 713a over the substrate 700, an insulator 702 over the conductor 713a, an insulator 706a and a semiconductor 706b that are over the insulator 702 and overlap with the conductor 713a, an insulator 706c over the semiconductor 706b, an insulator 712 over the insulator 706c, a conductor 704 that is over the insulator 712 and overlaps with the semiconductor 706b, and an insulator 710 having a region in contact with a side surface of the conductor 704. The insulator 706a and the semiconductor 706b have a region 707a and a region 707b. Note that this structure of the transistor 741 is just an example; a structure different from that illustrated in FIG. 42C may be employed.

Thus, in the transistor 741 illustrated in FIG. 42C, the conductor 713a functions as a gate electrode, the insulator 702 functions as a gate insulator, the region 707a functions as a source, the region 707b functions as a drain, the insulator 712 functions as a gate insulator, and the conductor 704 functions as a gate electrode. Note that in some cases, electrical characteristics of the semiconductor 706b change if light enters the semiconductor 706b. To prevent this, it is preferable that one or more of the conductor 713a, the region 707a, the region 707b, and the conductor 704 have a light-blocking property.

In the structure illustrated in FIG. 42C, the capacitor 742 includes a conductor 713b over the substrate 700, the insulator 702 over the conductor 713b, and an electrode 707c over the insulator 702.

In the capacitor 742, the conductor 713b functions as one electrode, and the electrode 707c functions as the other electrode.

The electrode 707c is formed on the same surface as the insulator 706a and the semiconductor 706b of the transistor 741. Thus, the capacitor 742 can be formed using a film of the transistor 741. The conductor 713a and the conductor 713b are preferably conductors of the same kind because the conductor 713a and the conductor 713b can be formed through the same step.

An insulator 718 is provided over the transistor 741 and the capacitor 742. Here, the insulator 718 may have an opening portion reaching the region 707b that functions as the source of the transistor 741. A conductor 781 is provided over the insulator 718. The conductor 781 may be electrically connected to the transistor 741 through the opening in the insulator 718.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

The insulator 422, the insulator 428, and the insulator 409 have barrier properties. This means that the display device illustrated in FIGS. 42A to 42C has a structure in which the transistor 741 is surrounded by insulators having barrier properties. Note that one or more of the insulator 422, the insulator 428, and the insulator 409 are not necessarily provided.

Note that a transistor, a capacitor, a wiring layer, and the like may be stacked to make the EL display device highly integrated.

Figure 43:
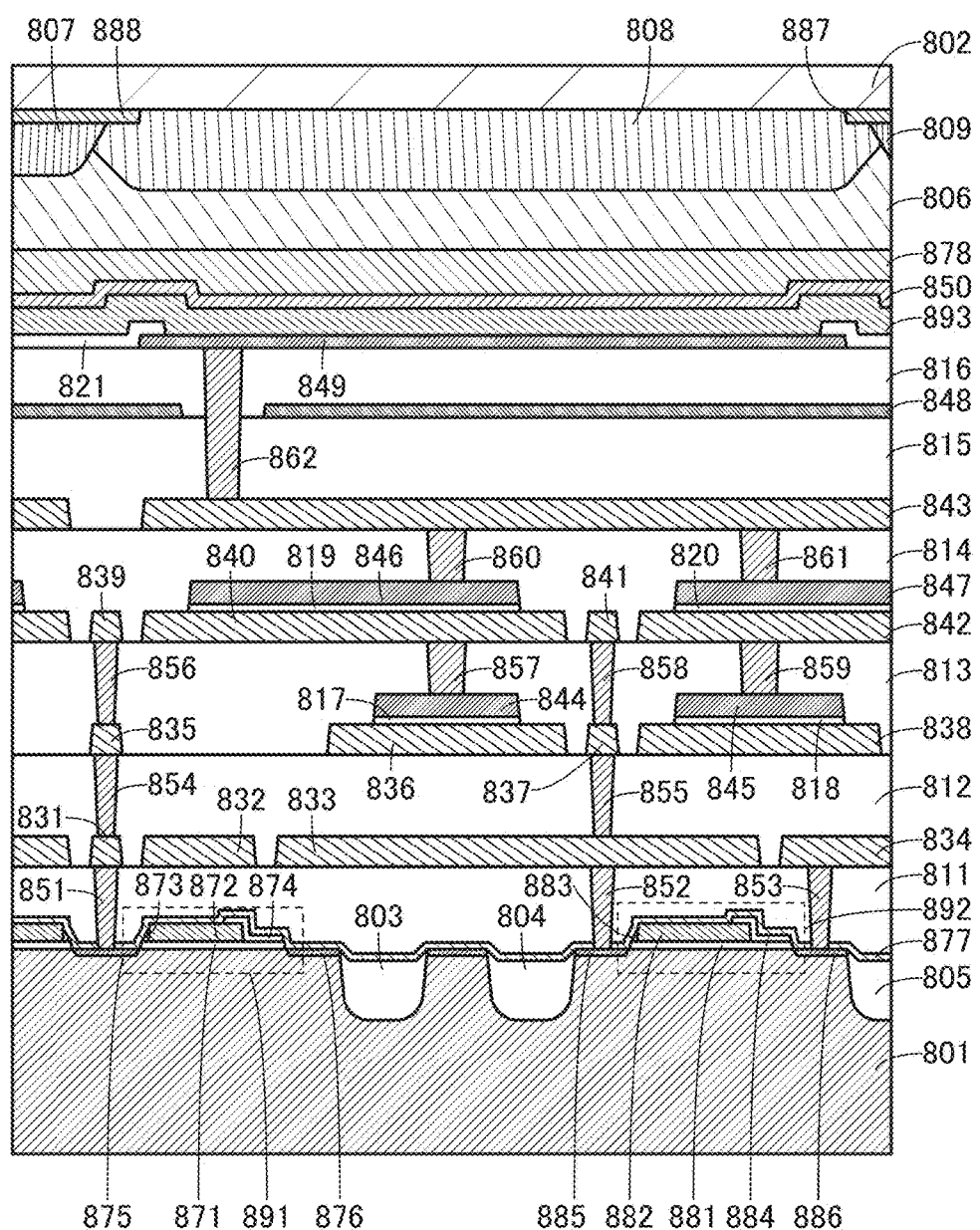
FIG. 43 is a cross-sectional view of a semiconductor device of one embodiment of the present invention.

FIG. 43 is a cross-sectional view illustrating a pixel of an EL display device fabricated over a semiconductor substrate.

The EL display device shown in FIG. 43 includes a semiconductor substrate 801, a substrate 802, an insulator 803, an insulator 804, an insulator 805, an adhesive layer 806, a filter 807, a filter 808, a filter 809, an insulator 811, an insulator 812, an insulator 813, an insulator 814, an insulator 815, an insulator 816, an insulator 817, an insulator 818, an insulator 819, an insulator 820, an insulator 821, a conductor 831, a conductor 832, a conductor 833, a conductor 834, a conductor 835, a conductor 836, a conductor 837, a conductor 838, a conductor 839, a conductor 840, a conductor 841, a conductor 842, a conductor 843, a conductor 844, a conductor 845, a conductor 846, a conductor 847, a conductor 848, a conductor 849, a conductor 850, a conductor 851, a conductor 852, a conductor 853, a conductor 854, a conductor 855, a conductor 856, a conductor 857, a conductor 858, a conductor 859, a conductor 860, a conductor 861, a conductor 862, an insulator 871, a conductor 872, an insulator 873, an insulator 874, a region 875, a region 876, an insulator 877, an insulator 878, an insulator 881, a conductor 882, an insulator 883, an insulator 884, a region 885, a region 886, a layer 887, a layer 888, and a light-emitting layer 893.

A transistor 891 includes the semiconductor substrate 801, the insulator 871, the conductor 872, the insulator 873, the insulator 874, and the region 875 and the region 876. The semiconductor substrate 801 functions as a channel formation region. The insulator 871 has a function of a gate insulator. The conductor 872 has a function of a gate electrode. The insulator 873 has a function of a sidewall insulator. The insulator 874 has a function of a sidewall insulator. The region 875 has a function of a source region and/or a drain region. The region 876 has a function of a source region and/or a drain region.

The conductor 872 includes a region overlapping with part of the semiconductor substrate 801 with the insulator 871 therebetween. The region 875 and the region 876 are regions where impurities are added to the semiconductor substrate 801. In the case where the semiconductor substrate 801 is a silicon substrate, the region 875 and the region 876 may each be a region including a silicide, such as tungsten silicide, titanium silicide, cobalt silicide, or nickel silicide. The region 875 and the region 876 can be formed in a self-aligned manner using the conductor 872, the insulator 873, the insulator 874, and the like, and the region 875 and the region 876 are accordingly located in the semiconductor substrate 801 such that a channel formation region is provided between the region 875 and the region 876.

Since the transistor 891 includes the insulator 873, the region 875 can be distanced from the channel formation region. Owing to the insulator 873, the transistor 891 can be prevented from being broken or degraded by an electric field generated in the region 875. Since the transistor 891 includes the insulator 874, the region 876 can be distanced from the channel formation region. Owing to the insulator 874, the transistor 891 can be prevented from being broken or degraded by an electric field generated in the region 876. Note that in the transistor 891, the distance between the region 876 and a channel formation region is longer than the distance between the region 875 and a channel formation region. This structure can enable both high on-state current and high reliability in the case where a potential difference between the region 876 and a channel formation region is likely to be larger than a potential difference between the region 875 and a channel formation region in operation of the transistor 891.

A transistor 892 includes the semiconductor substrate 801, the insulator 881, the conductor 882, the insulator 883, the insulator 884, the region 885, and the region 886. The semiconductor substrate 801 has a function of a channel formation region. The insulator 881 has a function of a gate insulator. The conductor 882 has a function of a gate electrode. The insulator 883 has a function of a sidewall insulator. The insulator 884 has a function of a sidewall insulator. The region 885 has a function of a source region and/or a drain region. The region 886 has a function of a source and/or a drain region.

The conductor 882 includes a region overlapping with part of the semiconductor substrate 801 with the insulator 881 therebetween. The region 885 and the region 886 are regions where impurities are added to the semiconductor substrate 801. In the case where the semiconductor substrate 801 is a silicon substrate, the region 885 and the region 886 are a region including a silicide. The region 885 and the region 886 can be formed in a self-aligned manner using the conductor 882, the insulator 883, the insulator 884, and the like, and the region 885 and the region 886 are accordingly located in the semiconductor substrate 801 such that a channel formation region is provided between the region 885 and the region 886.

Since the transistor 892 includes the insulator 883, the region 885 can be distanced from the channel formation region. Owing to the insulator 883, the transistor 892 can be prevented from being broken or degraded by an electric field generated in the region 885. Since the transistor 892 includes the insulator 884, the region 886 can be distanced from the channel formation region. Owing to the insulator 884, the transistor 892 can be prevented from being broken or degraded by an electric field generated in the region 886. Note that in the transistor 892, the distance between the region 886 and a channel formation region is longer than the distance between the region 885 and a channel formation region. This structure can enable both high on-state current and high reliability in the case where a potential difference between the region 886 and a channel formation region is likely to be larger than a potential difference between the region 885 and a channel formation region in operation of the transistor 892.

The insulator 877 is located so as to cover the transistor 891 and the transistor 892 and has a function of a protective film for the transistor 891 and the transistor 892. The insulator 803, the insulator 804, and the insulator 805 have a function of separating elements. For example, the transistor 891 and the transistor 892 are isolated from each other with the insulator 803 and the insulator 804 therebetween.

Each of the conductor 851, the conductor 852, the conductor 853, the conductor 854, the conductor 855, the conductor 856, the conductor 857, the conductor 858, the conductor 859, the conductor 860, the conductor 861, and the conductor 862 has a function of electrically connecting elements, an element and a wiring, and wirings, and these conductors can be referred to as a wiring or a plug.

Each of the conductor 831, the conductor 832, the conductor 833, the conductor 834, the conductor 835, the conductor 836, the conductor 837, the conductor 838, the conductor 839, the conductor 840, the conductor 841, the conductor 842, the conductor 843, the conductor 844, the conductor 845, the conductor 846, the conductor 847, the conductor 849, and the conductor 850 has a function of a wiring, an electrode, and/or a light-blocking layer.

For example, the conductor 836 and the conductor 844 each have a function of an electrode of a capacitor including the insulator 817; the conductor 838 and the conductor 845 each have a function of an electrode of a capacitor including the insulator 818; the conductor 840 and the conductor 846 each have a function of an electrode of a capacitor including the insulator 819; and the conductor 842 and the conductor 847 each have a function of an electrode of a capacitor including the insulator 820. Note that the conductor 836 and the conductor 838 may be electrically connected to each other. The conductor 844 and the conductor 845 may be electrically connected to each other. The conductor 840 and the conductor 842 may be electrically connected to each other. The conductor 846 and the conductor 847 may be electrically connected to each other.

Each of the insulator 811, the insulator 812, the insulator 813, the insulator 814, the insulator 815, and the insulator 816 has a function of an interlayer insulator. The top surfaces of the insulator 811, the insulator 812, the insulator 813, the insulator 814, the insulator 815, and the insulator 816 are preferably flat.

The conductor 831, the conductor 832, the conductor 833, and the conductor 834 are provided over the insulator 811. The conductor 851 is provided in an opening in the insulator 811. The conductor 851 electrically connects the conductor 831 and the region 875. The conductor 852 is provided in an opening in the insulator 811. The conductor 852 electrically connects the conductor 833 and the region 885. The conductor 853 is provided in an opening in the insulator 811. The conductor 853 electrically connects the conductor 834 and the region 886.

The conductor 835, the conductor 836, the conductor 837, and the conductor 838 are provided over the insulator 812. The insulator 817 is provided over the conductor 836. The conductor 844 is provided over the insulator 817. The insulator 818 is provided over the conductor 838. The conductor 845 is provided over the insulator 818. The conductor 854 is provided in an opening in the insulator 812. The conductor 854 electrically connects the conductor 835 and the conductor 831. The conductor 855 is provided in an opening in the insulator 812. The conductor 855 electrically connects the conductor 837 and the conductor 833.

The conductor 839, the conductor 840, the conductor 841, and the conductor 842 are provided over the insulator 813. The insulator 819 is provided over the conductor 840. The conductor 846 is provided over the insulator 819. The insulator 820 is provided over the conductor 842. The conductor 847 is provided over the insulator 820. The conductor 856 is provided in an opening in the insulator 813. The conductor 856 electrically connects the conductor 839 and the conductor 835. The conductor 857 is provided in an opening in the insulator 813. The conductor 857 electrically connects the conductor 840 and the conductor 844. The conductor 858 is provided in an opening in the insulator 813. The conductor 858 electrically connects the conductor 841 and the conductor 837. The conductor 859 is provided in an opening in the insulator 813. The conductor 859 electrically connects the conductor 842 and the conductor 845.

The conductor 843 is provided over the insulator 814. The conductor 860 is provided in an opening in the insulator 814. The conductor 860 electrically connects the conductor 843 and the conductor 846. The conductor 861 electrically connects the conductor 843 and the conductor 847.

The conductor 848 is provided over the insulator 815 and may be electrically floating. Note that the conductor 848 is not limited to a conductor as long as it has a function of a light-blocking layer: for example, the conductor 848 may be an insulator or a semiconductor having a light-blocking property.

The conductor 849 is provided over the insulator 816. The insulator 821 is provided over the insulator 816 and the conductor 849. The insulator 821 includes an opening exposing the conductor 849. The light-emitting layer 893 is provided over the conductor 849 and the insulator 821. The conductor 850 is provided over the light-emitting layer 893.

The light-emitting layer 893 emits light by a potential difference between the conductor 849 and the conductor 850; thus, the conductor 849, the conductor 850, and the light-emitting layer 893 form a light-emitting element. Note that the insulator 821 has a function of a partition wall.

The insulator 878 is provided over the conductor 850. The insulator 878 covers the light-emitting element and has a function of a protective insulator. The insulator 878 may have a barrier property or may form a structure in which the light-emitting element is surrounded by insulators having barrier properties, for example.

A substrate having a light-transmitting property can be used as the substrate 802. For example, the substrate 750 can be referred to for the substrate 802. The layer 887 and the layer 888 are provided on the substrate 802. The layer 887 and the layer 888 each have a function of a light-blocking layer. A resin, a metal, or the like can be used for the light-blocking layer. The layer 887 and the layer 888 can improve the contrast and reduce color bleeding in the EL display device.

Each of the filter 807, the filter 808, and the filter 809 has a function of a color filter. The filter 2054 can be referred to for the filter 807, the filter 808, and the filter 809, for example. The filter 808 has a region overlapping with the layer 888, the substrate 802, and the layer 887. The filter 807 has a region overlapping with the filter 808 on the layer 888. The filter 809 has a region overlapping with the filter 808 on the layer 887. The filter 807, the filter 808, and the filter 809 may have different thicknesses, in which case light might be extracted more efficiently from the light-emitting element.

An adhesive layer 806 is provided between the insulator 878 and the filter 807, the filter 808, and the filter 809.

Because the EL display device in FIG. 43 has a stacked-layer structure of the transistor, the capacitor, the wiring layer, and the like, the pixel area can be reduced. A highly integrated EL display device can be provided.

So far, examples of the EL display device are described. Next, an example of a liquid crystal display device is described.

Figure 44A:
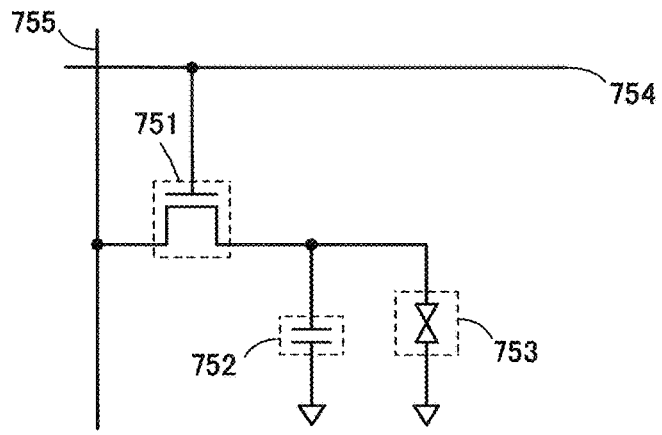
FIGS. 44A and 44B are a circuit diagram and a cross-sectional view illustrating a semiconductor device of one embodiment of the present invention.

FIG. 44A is a circuit diagram illustrating a configuration example of a pixel of a liquid crystal display device. A pixel shown in FIGS. 44A and 44B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 44B:
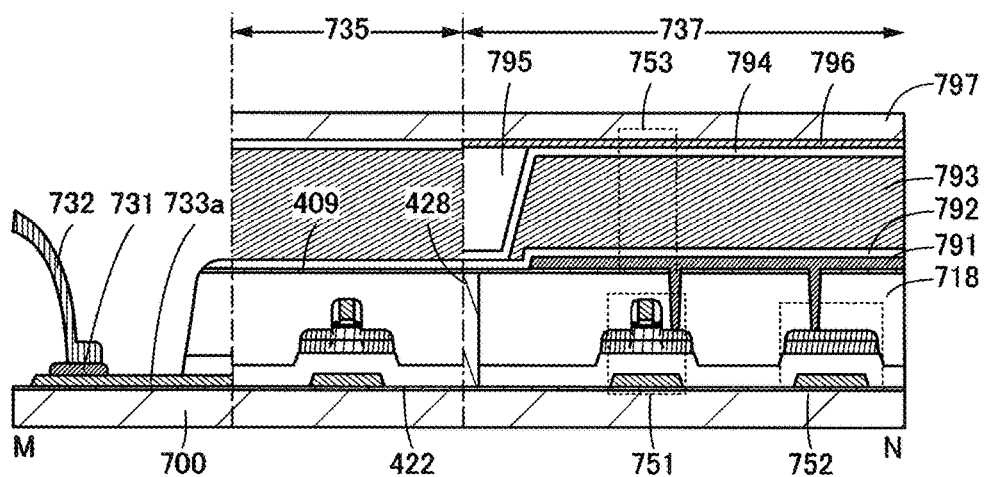

Note that the description of the liquid crystal display device is made on the assumption that the plan view of the liquid crystal display device is similar to that of the EL display device. FIG. 44B is a cross-sectional view of the liquid crystal display device taken along dashed-dotted line M-N in FIG. 42B. In FIG. 44B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 44B corresponds to, but is not limited to, the structure of the capacitor 742 in FIG. 42C.

Note that in the case where an oxide semiconductor is used as the semiconductor of the transistor 751, the off-state current of the transistor 751 can be extremely low. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

The insulator 718 is provided over the transistor 751 and the capacitor 752. The insulator 718 has an opening reaching the transistor 751. A conductor 791 is provided over the insulator 718. The conductor 791 is electrically connected to the transistor 751 through the opening in the insulator 718.

The insulator 422, the insulator 428, and the insulator 409 have barrier properties. This means that the display device illustrated in FIGS. 44A and 44B has a structure in which the transistor 751 is surrounded by insulators having barrier properties. Note that one or more of the insulator 422, the insulator 428, and the insulator 409 are not necessarily provided.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element; a light-emitting diode (LED) for white, red, green, blue, or the like; a transistor (a transistor that emits light depending on current); an electron emitter; a liquid crystal element; electronic ink; an electrophoretic element; a plasma display panel (PDP); a display element using micro electro mechanical systems (MEMS) such as a grating light valve (GLV), a digital micromirror device (DMD), a digital micro shutter (DMS), an interferometric modulator display (IMOD) element, a MEMS shutter display element, an optical-interference-type MEMS display element, or a piezoelectric ceramic display; an electrowetting element; a display element including a carbon nanotube; and quantum dots. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices containing quantum dots in each pixel include a quantum dot display. The quantum dots are placed in a display element, in a backlight, or between the backlight and the display element. With the use of the quantum dots, a display device with high color purity can be fabricated. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED chip, graphene or graphite may be provided under an electrode or a nitride semiconductor of the LED chip. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED chip can be formed. Note that an AlN layer may be provided between the n-type GaN semiconductor including crystals and graphene or graphite. The GaN semiconductors included in the LED chip may be formed by MOCVD. Note that when the graphene is provided, the GaN semiconductors included in the LED chip can also be formed by a sputtering method.

In a display device including MEMS, a dry agent may be provided in a space where a display element is sealed (or between an element substrate over which the display element is placed and a counter substrate opposed to the element substrate, for example). The dry agent can remove moisture and thus can prevent malfunction or degradation of the MEMS or the like.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 45A to 45F illustrate specific examples of these electronic devices.

Figure 45A:
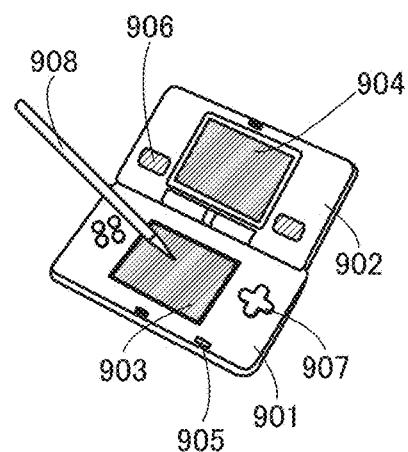
FIGS. 45A to 45F are perspective views each illustrating an electronic device of one embodiment of the present invention.

FIG. 45A illustrates a portable game console including a housing 901, a housing 902, a display portion 903, a display portion 904, a microphone 905, a speaker 906, an operation key 907, a stylus 908, and the like. Although the portable game console in FIG. 45A has the two display portions 903 and 904, the number of display portions included in a portable game console is not limited to this.

Figure 45B:
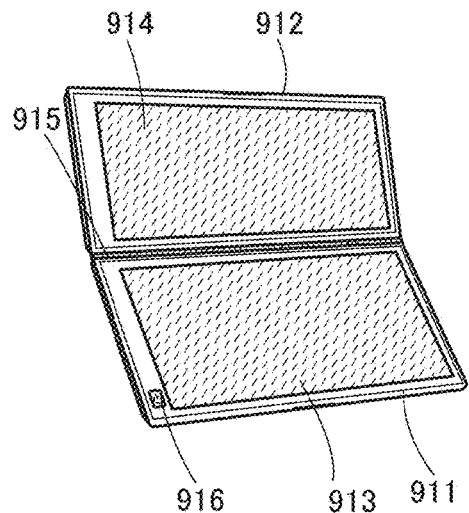

FIG. 45B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 45C:
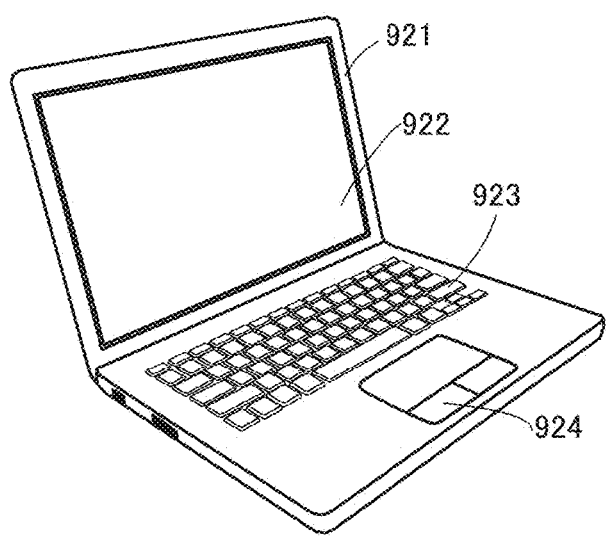

FIG. 45C illustrates a notebook personal computer, which includes a housing 921, a display portion 922, a keyboard 923, a pointing device 924, and the like.

Figure 45D:
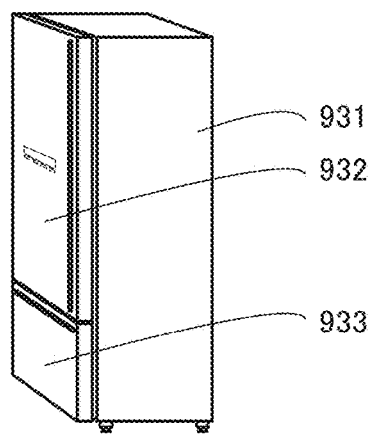

FIG. 45D illustrates an electric refrigerator-freezer, which includes a housing 931, a door for a refrigerator 932, a door for a freezer 933, and the like.

Figure 45E:
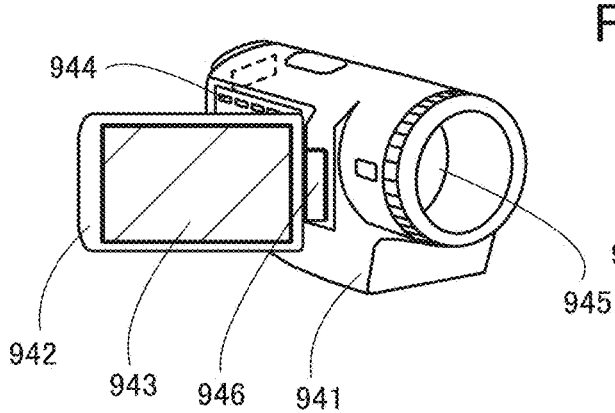

FIG. 45E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 45F:
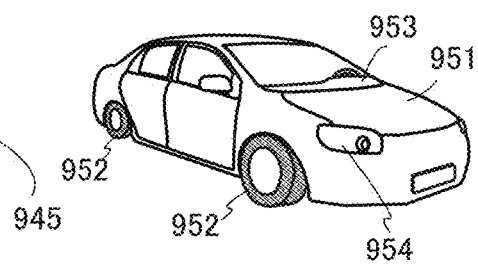

FIG. 45F illustrates a car including a car body 951, wheels 952, a dashboard 953, lights 954, and the like.

<Electronic Device with Curved Display Region or Curved Light-Emitting Region>

Electronic devices with curved display regions or curved light-emitting regions, which are embodiments of the present invention, will be described below with reference to FIGS. 46A1, 46A2, 46A3, 46B1, 46B2, 46C1, and 46C2. Here, information devices, in particular, portable information devices (portable devices) are described as examples of the electronic devices. The portable information devices include, for example, mobile phone devices (e.g., phablets and smartphones) and tablet terminals (slate PCs).

FIG. 46A1 is a perspective view illustrating the outward form of a portable device 1300A. FIG. 46A2 is a top view illustrating the portable device 1300A. FIG. 46A3 illustrates a usage state of the portable device 1300A.

FIGS. 46B1 and 46B2 are perspective views illustrating the outward form of a portable device 1300B.

FIGS. 46C1 and 46C2 are perspective views illustrating the outward form of a portable device 1300C.

<Portable Device>

The portable device 1300A has one or more of a telephone function, an email creating and reading function, a notebook function, an information browsing function, and the like.

A display portion of the portable device 1300A is provided along plural surfaces of a housing. In that case, for example, a flexible display device may be provided along the inner side of the housing. Accordingly, text data, image data, or the like can be displayed on a first region 1311 and/or a second region 1312.

Note that images used for three operations can be displayed on the first region 1311 (see FIG. 46A1), for example. Furthermore, text data or the like can be displayed on the second region 1312 as indicated by dashed rectangles in the drawing (see FIG. 46A2).

In the case where the second region 1312 is on the upper portion of the portable device 1300A, a user can easily see text data or image data displayed on the second region 1312 of the portable device 1300A while the portable device 1300A is placed in a breast pocket of the user's clothes (see FIG. 46A3). The user can see, for example, the phone number, name, or the like of the caller of an incoming call, from above the portable device 1300A.

The portable device 1300A may include an input device or the like between the display device and the housing, in the display device, or over the housing. As the input device, for example, a touch sensor, a light sensor, or an ultrasonic sensor may be used. In the case where the input device is provided between the display device and the housing or over the housing, for example, a matrix switch type, resistive type, ultrasonic surface acoustic wave type, infrared type, electromagnetic induction type, or electrostatic capacitance type touch panel may be used. In the case where the input device is provided in the display device, an in-cell sensor, an on-cell sensor, or the like may be used.

The portable device 1300A can be provided with a vibration sensor or the like and a memory device that stores a program for shifting a mode into an incoming call rejection mode based on vibration sensed by the vibration sensor or the like. In that case, the user can shift the mode into the incoming call rejection mode by tapping the portable device 1300A over his/her clothes to apply vibration.

The portable device 1300B includes a display portion including the first region 1311 and the second region 1312 and a housing 1310 that supports the display portion.

The housing 1310 has a plurality of bend portions, and the longest bend portion of the housing 1310 is between the first region 1311 and the second region 1312.

The portable device 1300B can be used with the second region 1312 provided along the longest bend portion facing sideward.

The portable device 1300C includes a display portion including the first region 1311 and the second region 1312 and the housing 1310 that supports the display portion.

The housing 1310 has a plurality of bend portions, and the second longest bend portion in the housing 1310 is between the first region 1311 and the second region 1312.

The portable device 1300C can be used with the second region 1312 facing upward.

This application is based on Japanese Patent Application serial no. 2015-067235 filed with Japan Patent Office on Mar. 27, 2015, the entire contents of which are hereby incorporated by reference.

What is claimed is:

1. A semiconductor device comprising:
a first insulator;
a semiconductor over the first insulator;
a second insulator over the semiconductor;
a third insulator over the second insulator;
a first conductor over the third insulator; and
a fourth insulator over the first conductor,
wherein the semiconductor comprises:
a first region overlapping with the first conductor; and
a second region and a third region each not overlapped with the first conductor between which the first region is positioned, and
wherein each of the second region and the third region comprises a region with a spinel crystal structure.

2. The semiconductor device according to claim 1, comprising a second conductor under the first insulator and overlapping with the first conductor with the first insulator, the semiconductor, and the second insulator interposed therebetween.

3. The semiconductor device according to claim 1, wherein a stack of the first insulator, the semiconductor, and the second insulator comprises the first region, the second region, and the third region.

4. The semiconductor device according to claim 1, wherein a stack of the first insulator and the semiconductor comprises the first region, the second region, and the third region.

5. The semiconductor device according to claim 1, wherein the semiconductor comprises indium, gallium, zinc, and oxygen.

6. The semiconductor device according to claim 1, wherein each of the first insulator and the second insulator comprises indium, gallium, zinc, and oxygen.

7. The semiconductor device according to claim 1, wherein the second insulator is in contact with a side surface of the semiconductor and a side surface of the first insulator.

8. The semiconductor device according to claim 1, wherein the fourth insulator is in contact with the third insulator.

9. The semiconductor device according to claim 1, wherein the fourth insulator is in contact with the second insulator.

10. The semiconductor device according to claim 1, wherein the fourth insulator is in contact with the semiconductor.

11. A display device comprising:
the semiconductor device according to claim 1; and
a display element electrically connected to the semiconductor device.

12. The display device according to claim 11, wherein the display element is a liquid crystal element.

13. The display device according to claim 11, wherein the display element is a light-emitting element.

14. A semiconductor device comprising:
a first insulator;
a semiconductor over the first insulator;
a second insulator over the semiconductor;
a third insulator over the second insulator;
a first conductor over the third insulator;
a fourth insulator in contact with a side surface of the first conductor; and
a fifth insulator over the first conductor and the fourth insulator;
wherein the semiconductor comprises:
a first region overlapping with the first conductor; and
a second region and a third region each not overlapped with the first conductor between which the first region is positioned, and
wherein each of the second region and the third region comprises a region with a spinel crystal structure.

15. The semiconductor device according to claim 14, comprising a second conductor under the first insulator and overlapping with the first conductor with the first insulator, the semiconductor, and the second insulator interposed therebetween.

16. The semiconductor device according to claim 14, wherein a stack of the first insulator, the semiconductor, and the second insulator comprises the first region, the second region, and the third region.

17. The semiconductor device according to claim 14, wherein a stack of the first insulator and the semiconductor comprises the first region, the second region, and the third region.

18. The semiconductor device according to claim 14, wherein the semiconductor comprises indium, gallium, zinc, and oxygen.

19. The semiconductor device according to claim 14, wherein each of the first insulator and the second insulator comprises indium, gallium, zinc, and oxygen.

20. The semiconductor device according to claim 14, wherein the second insulator is in contact with a side surface of the semiconductor and a side surface of the first insulator.

21. The semiconductor device according to claim 14, wherein the fourth insulator is in contact with the third insulator.

22. The semiconductor device according to claim 14, wherein the fourth insulator is in contact with the second insulator.

23. The semiconductor device according to claim 14, wherein the fourth insulator is in contact with the semiconductor.

24. The semiconductor device according to claim 14, wherein the fifth insulator is in contact with the third insulator.

25. The semiconductor device according to claim 14, wherein the fifth insulator is in contact with the second insulator.

26. The semiconductor device according to claim 14, wherein the fifth insulator is in contact with the semiconductor.

27. A display device comprising:
the semiconductor device according to claim 14; and
a display element electrically connected to the semiconductor device.

28. The display device according to claim 27, wherein the display element is a liquid crystal element.

29. The display device according to claim 27, wherein the display element is a light-emitting element.

* * * * *